(12) United States Patent
Fukada et al.

(10) Patent No.: US 6,340,632 B1
(45) Date of Patent: Jan. 22, 2002

(54) METHOD OF MANUFACTURING A SEMICONDUCTOR DEVICE

(75) Inventors: Shinichi Fukada, Hino; Kazuo Nojiri, Higashimurayama; Takashi Yunogami, Niiza; Shoji Hotta, Tokyo; Hideo Aoki, Musashimurayama; Takayuki Oshima, Ome; Nobuyoshi Kobayashi, Kawagoe, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/585,629

(22) Filed: Jun. 2, 2000

(30) Foreign Application Priority Data

Jun. 4, 1999 (JP) .......................................... 11-158758

(51) Int. Cl.⁷ ......................................... H01L 21/4763
(52) U.S. Cl. ....................................... 438/622; 438/618
(58) Field of Search ................................ 438/622, 634, 438/635, 636, 637, 675, 618, 250, 393, 399, 584

(56) References Cited

U.S. PATENT DOCUMENTS 5,891,799 A * 4/1999 Tsui ........................... 438/624
6,100,190 A * 8/2000 Kobori ........................ 438/659
6,121,086 A * 9/2000 Kuroda et al. .............. 438/256
6,133,144 A * 10/2000 Tsai et al. ................... 438/634
6,197,696 B1 3/2001 Aoi

FOREIGN PATENT DOCUMENTS

JP            10-229122         8/1998

* cited by examiner

Primary Examiner—David Nelms
Assistant Examiner—David Nhu
(74) Attorney, Agent, or Firm—Antonelli, Terry, Stout & Kraus, LLP

(57) ABSTRACT

Insulating films 34 through 38 (of which insulating films 34, 36, 38 are silicon nitride films and insulating films 35, 38 are silicon oxide films) are sequentially formed on the wires 33 of the fourth wiring layer and groove pattern 40 is transferred into the insulating film 38 by means of photolithography. An anti-reflection film 41 is formed to fill the grooves 40 of the insulating film 38 and then a resist film 42 carrying a hole pattern 43 is formed. The films are subjected to an etching operation in the presence of the resist film 42 to transfer the hole pattern into the insulating films 38, 37, 36 and part of the insulating film 35. Subsequently, the resist film 42 and the anti-reflection film 41 are removed and the groove pattern 40 and the hole pattern 43 are transferred respectively into the insulating film 37 and the insulating film 35 by using the insulating film 38 as mask.

37 Claims, 46 Drawing Sheets

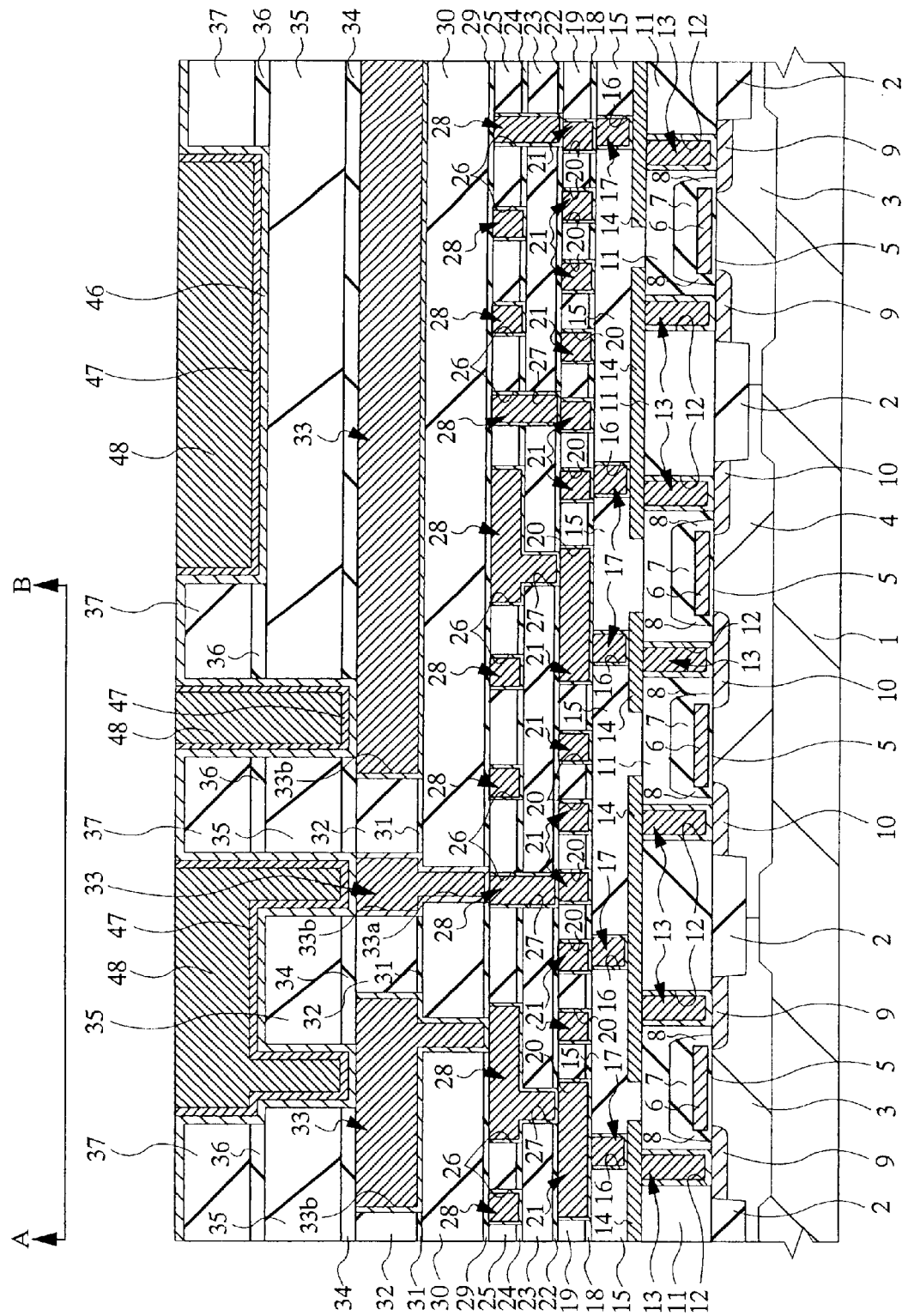

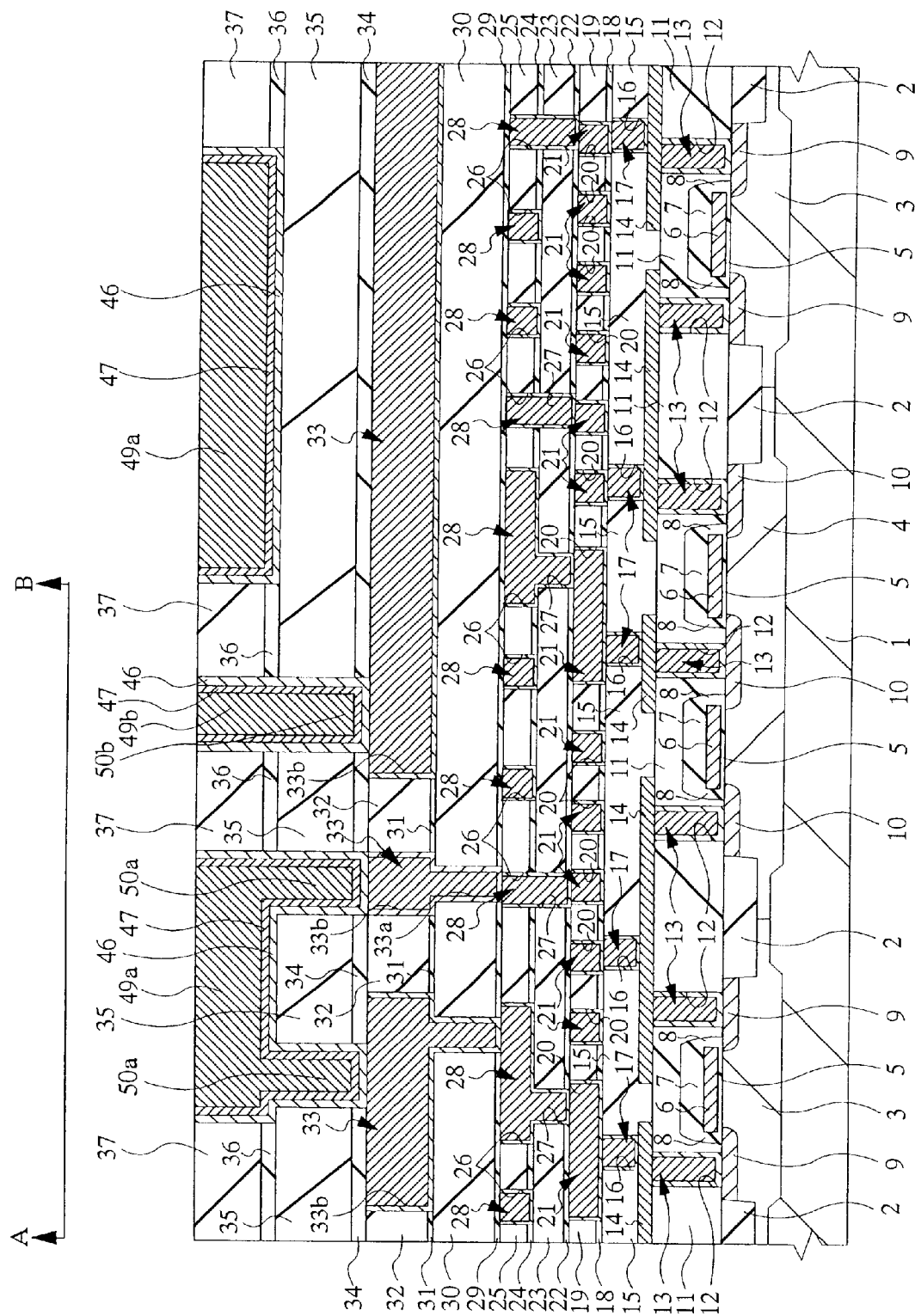

METHOD OF MANUFACTURING A SEMICONDUCTOR DEVICE

TECHNICAL FIELD OF THE INVENTION

This invention relates to a semiconductor device and a method of manufacturing the same. More particularly, the present invention relates to a multilayer wiring structure formed by using a so-called damascene process and also to a technology that can effectively be applied to a semiconductor having such a multilayer wiring structure.

BACKGROUND OF THE INVENTION

In the current trend toward high performance microsemiconductor devices, the multilayer wiring technology is indispensable for manufacturing such semiconductor devices. There is a well known technique of forming a wiring layer in a semiconductor integrated circuit by forming a thin film of a high melting point metal such as an aluminum (Al) alloy or tungsten (W) on an insulating film, subsequently forming on the thin film a resist pattern having a profile same as the wiring pattern to be produced there from the metal thin film by photolithography and then dry etching the thin film, using the resist pattern as mask. However, the technique of using an Al alloy or some other metal material has a major drawback that the wiring resistance rises remarkably to consequently increase the wiring delay and degrade the performance of the semiconductor device as the wiring is down-sized. Particularly, in the case of high performance logic LSIs, the drawback can severely damage the performance thereof.

As an attempt for bypassing this problem, there has been proposed a process of burying a wiring metal material containing copper (Cu) as principal conductor in the grooves formed on an insulating film and subsequently removing the unnecessary metal outside the grooves by means of a CMP (chemical mechanical polishing) technique to produce a wiring pattern in the grooves (so-called damascene process).

SUMMARY OF THE INVENTION

However, as a result of research efforts, the inventors of the present invention came to find that the damascene process, more particularly the dual-damascene process (for producing both the wiring and the interlayer connection wiring of a semiconductor device simultaneously after forming wiring grooves for wiring and contact holes for interlayer connections) is accompanied by a problem as described below that has not hitherto been known.

Firstly, either of two methods may be employed for forming groves (wiring grooves) and holes (connection holes) in the dual-damascene process; a hole-first method and a self-aligning method.

With the hole-first method, deep holes are firstly formed through an interlayer insulating film (which may be an inter-wire insulating film to be used for wiring) that is formed on a lower wiring layer until they get to the latter. To do this, a photoresist film patterned to show so may openings is formed on the interlayer insulating film and then the interlayer insulating film is dry etched by using the photoresist pattern as mask. Subsequently, the holes are filled with an anti-reflection material or resist and then wiring grooves are formed in the interlayer insulating film. To form wiring grooves, a photoresist film having opening for the grooves is formed on the interlayer insulating film and then the interlayer insulating film is dry etched using the photoresist pattern as mask. The holes are filled with the an anti-reflection material before forming the wiring grooves as described above in order to make the photoresist film for forming the wiring grooves to be accurately exposed to light and improve the processing accuracy. In other words, unless the holes are not filled with an anti-reflection material, the surface of the photoresist film reflects the profiles of the holes in the corresponding areas during the exposure operation to come to show undulations and no satisfactory surface flatness can be obtained. When the photoresist film is exposed to light with undulations on the surface, the light irradiating the photoresist pattern is scattered by the undulations (where the holes are formed) to make it no longer possible to accurately form the grooves in the interlayer insulating film. Particularly, because grooves may be formed in the holes (contact holes) for forming wires connecting the upper and lower wiring layers, the problem of poor processing accuracy occurs in many of those holes.

It is true that the problem that arises when the wiring groove pattern is exposed to light can be substantially dissolved by filling the holes with an anti-reflection material. Then the anti-reflection material left in the holes has to be removed after forming the wiring grooves. However, it is highly difficult to satisfactorily remove the filled material and the material remaining in the bottoms of the contact holes can give rise to a problem of insufficient connection or increased connection resistance between the upper and lower wiring layers. Particularly, the problem is ever more serious in recent year as a result of the trend of down-sizing semiconductor devices because the contact holes are also down-sized to give rise to an increased aspect ratio.

With the self-aligning method, on the other hand, wiring grooves and contact holes are formed in a manner as described below. An interlayer insulating film (which is not an inter-wire insulating film) is formed on the lower wiring layer and a silicon nitride film is formed thereon. Then, the silicon nitride film is subjected to a patterning process to produce holes and, thereafter, an inter-wire insulating film (which may typically be a silicon oxide film) is formed further thereon. In other words, an intermediary layer (silicon nitride film layer) processed to show a hole pattern is formed between the interlayer insulating film and the inter-wire insulating film. Then, a groove pattern is formed in the inter-wire insulating film. After the above process of forming the groove pattern, the inter-wire insulating film is subjected to a process of forming holes therethrough by using the intermediary layer (the silicon nitride film having a groove pattern) as mask. The self-aligning method is free from the problem of the residue of the material filled in the holes (contact holes) and that of poor processing accuracy that arises when the grooves are formed.

However, the intermediary layer is formed to operate as etching stopper in the process of forming the grooves (by etching) and also in the process of forming the holes and hence has to have a considerable film thickness. As a result of a study made by the inventors of the present invention, it was found that the intermediary layer is required to be at least about 100 nm thick if it operates properly. Silicon nitride is a highly dielectric material and operates negatively for reducing the dielectric constant of the interlayer insulating film and that of the inter-wire insulating film. A high dielectric constant between wires or between wiring layers gives rise to a large inter-wire capacitance, which by turn obstructs any attempt for realizing a high performance semiconductor device that operates at high speed. Additionally, since the holes are defined in the areas where both wires and holes are formed by dry etching, the holes produced there may have a reduced diameter when the mask for forming the holes and the one for forming the grooves are misaligned. Holes having a reduced diameter can obstruct the effort for providing the inter-wire connection wiring with a required level of resistance and hence again any attempt for realizing a high performance semiconductor device that operates at high speed.

If a large groove pattern is used to avoid the misalignment of the masks, it is no longer possible to reduce both the width of the wires and the distances separating the wiring layers to micro-dimensions. Therefore, the attempt for realizing a high performance semiconductor device will be baffled.

In view of the above identified circumstances, therefore an object of the present invention is to eliminate the residue of foreign objects that can be left in the contact holes of a semiconductor device in order to improve the reliability of the wire connections and the performance of the device even when very fine dual damascene grooves are formed there.

Another object of the present invention is to provide a technique for securing a sufficient area to be used for the process of forming contact holes and reducing the connection resistance between the wiring layers of a semiconductor device in order to improve the performance of the device.

Still another object of the present invention is to provide a technique for reducing the inter-wire capacitance of a semiconductor device in order to improve the performance of the device.

Still another object of the present invention is to provide a technique for improving the degree of integration of a semiconductor device.

The above and other objects of the present invention as well as the novel features of the present invention will become apparent from the described made hereinafter by referring to the accompanying drawings.

Firstly, the present invention will be briefly summarized below.

With a method of manufacturing semiconductor device according to the invention, a wiring groove pattern layer is formed on an insulating layer (including an interlayer insulating film and an inter-wire insulating film) formed on a substrate so as to make it operate as etching mask when forming wiring grooves. Then, a hole pattern layer is formed on the wiring groove pattern layer to make it operate as etching mask when forming interlayer contact holes. Thereafter, the hole pattern is made to transfer into the insulating layer with a predetermined depth by means of a dry etching operation conducted on the hole pattern layer. Then, the hole pattern layer is only removed to operate the insulating layer with use of the hole pattern transferred on the insulating layer and of the wiring groove pattern layer as mask.

Both a semiconductor device and a method of manufacturing a semiconductor device according to the present invention are intended to provide a wiring structure where the width of the wires is not partly enlarged in an attempt for absorbing any possible misalignment of interlayer contact holes. Therefore, according to the invention, it is now possible to reduce the inter-wire intervals to the minimal limit defined by photolithography. Then, there may arise a problem of misalignment between the wiring groove pattern layer and the hole pattern formed thereon. According to the invention, this misalignment problem can be dissolved either of the two techniques as discussed below. Firstly, it can be dissolved by dry etching the wiring groove pattern layer from above through the hole pattern layer before transferring the hole pattern into the insulating layer with a predetermined depth. Secondly it can be dissolved by using a hole pattern having a hole diameter greater than the width of the wiring grooves as measured transversally relative to the longitudinal direction of the grooves of the groove pattern and dry etching the hole pattern layer from above under the condition that the wiring groove pattern layer is not etched when transferring the hole pattern into the insulating layer with a predetermined depth.

With a method of manufacturing a semiconductor device according to the invention, a thin silicon nitride film having a film thickness of about 50 nm is used for the wiring groove pattern layer formed on the insulating film. Since the wiring groove pattern layer is sufficiently thin, the hole pattern layer formed thereon can be processed with a satisfactory degree of accuracy. More specifically, according to the invention, a resist pattern (which is the pattern layer for forming the hole pattern layer) is formed on a small step as low as about 50 nm and hence the step can be made harmless simply by applying an anti-reflection film before applying resist. Therefore, unlike the above described hole-first method, no flattening operation (of filling the contact holes with an anti-reflection material) is required. Additionally, as for the possible misalignment of the wiring groove pattern and the hole pattern, the hole pattern can be formed through the wiring groove pattern layer in the initial stages of the etching operation for transferring the hole pattern into the insulating layer with a predetermined depth. It will be appreciated that, since a very thin silicon nitride film is used for the wiring groove pattern layer, the etching operation can be carried out without any difficulty. In other words, the disadvantages of the self-aligning method can be eliminated by forming the holes firstly and securing a desired hole diameter. While a problem of insufficient etching may arise at the bottoms of the holes formed through the insulating layer and showing misalignment to a slight extent, it can be avoided by arranging an etching stopper layer under the insulating layer to accommodate a possible excessively etched condition of the holes. When, on the other hand, using a hole pattern having a hole diameter greater than the width of the wiring grooves as measured transversally relative to the longitudinal direction of the grooves of the groove pattern and dry etching the hole pattern layer from above under the condition that the wiring groove pattern layer is not etched for transferring the hole pattern into the insulating layer with a predetermined depth, the hole pattern is transferred by etching in the areas where the wiring groove pattern and the hole pattern having holes with a diameter greater than the width of the wiring grooves are overlapping. Then, as the hole pattern layer has holes with a diameter greater than the width of the wiring grooves to accommodate any possible misalignment of the masks, the holes will be made to show a diameter same as the width of the grooves.

With this arrangement, the disadvantages of the hole-first method including the problem of the residue of the material filled in the contact holes can be eliminated while maintaining the advantages of the method including the easiness of securing the contact hole diameter. In other words, according to the invention, the hole pattern is dry etched before dry etching the groove pattern so that the holes are defined firstly particularly in terms of diameter and hence the diameter of the holes would not be reduced due to any misalignment.

As for the silicon nitride film that operates as stopper layer, it is used as etching stopper for the groove pattern and also as dry etching mask for the hole pattern with the known self-aligning method so that it needs to have a film thickness at least as large as 100 nm. With a method according to the invention, on the other hand, the silicon nitride film is required to operate only as etching stopper for the groove pattern so that it is possible to reduce the intermediary layer if compared with its counterpart used with the known self-aligning method. Additionally, the use of the intermediary can be avoided by controlling the duration of the etching operation and hence the depth of the hole pattern. As a result, the inter-wire capacitance of the semiconductor device can be reduced to improve the performance of the device.

Various aspect of the present invention will be listed below.

1. A method of manufacturing a semiconductor device comprising:
   (a) a step of forming a first insulating layer on a substrate;
   (b) a step of forming a wiring groove pattern layer on the first insulating layer to operate as etching mask when forming wiring grooves;
   (c) a step of forming a hole pattern layer on the wiring groove pattern layer to operate as etching mask when forming contact holes;
   (d) a step of etching the wiring groove pattern layer and the first insulating layer in the presence of the hole pattern layer and transferring the hole pattern having a predetermined depth into the first insulating layer;
   (e) a step of removing the hole pattern layer; and
   (f) a step of etching the first insulating layer in the presence of the wiring groove pattern layer and the hole pattern and transferring the wiring groove pattern into the first insulating layer.

2. A method of manufacturing a semiconductor device comprising wiring grooves formed with a predetermined width, wires formed in the wiring grooves and interlayer connecting members connecting the wires and lower wires thereof arranged therebelow; said method comprising steps of:
   (a) a step of forming a first insulating layer on a substrate;
   (b) a step of forming a wiring groove pattern layer on the first insulating layer to operate as etching mask when forming wiring grooves;
   (c) a step of forming a hole pattern layer on the wiring groove pattern layer to operate as etching mask when forming contact holes for accommodating interlayer connecting members therein;
   (d) a step of etching the wiring groove pattern layer and the first insulating layer in the presence of the hole pattern layer and transferring the hole pattern having a predetermined depth into the first insulating layer;
   (e) a step of removing the hole pattern layer; and
   (f) a step of etching the first insulating layer in the presence of the wiring groove pattern layer and the hole pattern.

3. A method of manufacturing a semiconductor device comprising wiring grooves formed with a predetermined width, wires formed in the wiring grooves and interlayer connecting members connecting the wires and lower wires thereof arranged therebelow; said method comprising steps of:
   (a) a step of forming a first insulating layer on a substrate;
   (b) a step of forming a wiring groove pattern layer on the first insulating layer to operate as etching mask when forming wiring grooves;
   (c) a step of forming a hole pattern layer on the wiring groove pattern layer to make the former operate as etching mask when forming contact holes for accommodating interlayer connecting members therein
with a hole diameter of the hole pattern layer substantially same as the groove width of the wiring groove pattern layer;
   (d) a step of etching the wiring groove pattern layer and the first insulating layer in the presence of the hole pattern layer and transferring the hole pattern having a predetermined depth into the first insulating layer;
   (e) a step of removing the hole pattern layer; and
   (f) a step of etching the first insulating layer in the presence of the wiring groove pattern layer and the hole pattern.

A method of manufacturing a semiconductor device as set forth in 2 or 3 above, wherein the wiring groove pattern layer is partly etched with the first insulating layer in the etching step of (d).

5. A method of manufacturing a semiconductor device as set forth in any 1 through 4 above, wherein
   the hole pattern is formed to a lower portion of the first insulating layer in step (d) and the wiring grooves are formed in step (f).

6. A method of manufacturing a semiconductor device as set forth in any of 1 through 4 above, wherein
   the hole pattern is formed halfway through the first insulating layer in step (d) and the wiring grooves and the contact holes are formed in step (f).

7. A method of manufacturing a semiconductor device as set forth in any of 1 through 6 above, further comprising;
   a step of forming a second insulating layer showing an etching selectivity relative to the first insulating layer prior to step (a);
   the dry etching of step (f) being conducted in two sub-steps including a first sub-step of etching the first insulating layer at a rate lower than a rate of etching the second insulating layer and a second sub-step of etching the first insulating layer at a rate same as a rate of etching the second insulating layer.

8. A method of manufacturing a semiconductor device comprising:
   (a) a step of sequentially forming a first stopper/insulating layer, a first insulating layer and a stopper layer;
   (b) a step of transferring a wiring groove pattern into the stopper layer;
   (c) a step of forming a hole pattern layer for contact holes after step (b);
   (d) a step of etching the first insulating layer halfway under condition of removing the stopper layer and the first insulating layer in the presence of the hole pattern layer and transferring the hole pattern;
   (e) a step of removing the hole pattern layer; and
   (f) a step of etching the first insulating layer in the presence of the stopper layer having the hole pattern and the wiring groove pattern formed therein and forming the contact holes and the wiring grooves.

9. A method of manufacturing a semiconductor device as set forth in any of 1 through 8 above, wherein
   the hole pattern layer is formed with openings of stacked vias in step (c) and the hole pattern is formed to a lower portion of the first insulating layer in step (d).

10. A method of manufacturing a semiconductor device as set forth in any of 1 through 9 above, further comprising:
   a step of forming a flattening film between step (b) and step (c).

11. A method of manufacturing a semiconductor device as set forth in 10 above wherein
the flattening film is an anti-reflection film.
12. A method of manufacturing a semiconductor device as set forth in any of 1 through 11 above, wherein
the wiring grooves and the contact holes are formed in step (f) and subsequently a conductive film is buried in the wiring grooves and the contact holes to form wires and interlayer connecting members.
13. A method of manufacturing a semiconductor device comprising wires formed in wiring grooves and interlayer connecting members connecting the wires and lower wires thereof arranged therebelow; said method comprising:
   (a) a step of sequentially forming a first stopper/insulating layer, an interlayer insulating layer, a second stopper/insulating layer, an inter-wire insulating layer and a stopper layer;
   (b) a step of transferring a wiring groove pattern into the stopper layer;
   (c) a step of forming a hole pattern mask for contact holes for accommodating interlayer connecting members to be formed therein after step (b);
   (d) a step of etching the inter-wire insulating layer and the second stopper/insulating layer in the presence of the hole pattern mask and transferring the hole pattern into the first insulating layer;
   (e) a step of removing the hole pattern layer; and
   (f) a step of conducting an etching operation in the presence of the stopper layer having the hole pattern and the wiring groove pattern formed therein.
14. A method of manufacturing a semiconductor device as set forth in 13 above, wherein
the resist layer used for forming the wiring groove pattern is removed after transferring the wiring groove pattern in step (b) and a hole pattern mask is formed directly on the stopper layer.
15. A method of manufacturing a semiconductor device as set forth in 13 or 14 above, wherein
the etching operation of step (f) is completed or terminated in the first stopper/insulating layer in the hole pattern region and in the second stopper/insulating layer in the wiring groove pattern region.
16. A method of manufacturing a semiconductor device as set forth in 13, 14 or 15 above, wherein
the first and second stopper/insulating layers and the stopper layer are made of silicon nitride film.
17. A method of manufacturing a semiconductor device as set forth in 16 above, wherein
the stopper layer has a film thickness greater than the first and second stopper/insulating layers.
18. A method of manufacturing a semiconductor device as set forth in any of 13 through 17 above, wherein
the hole pattern mask is a resist mask.
19. A method of manufacturing a semiconductor device as set forth in any of 13 through 18 above, further comprising:
a step of removing the stopper layer after the step of (f).
20. A method of manufacturing a semiconductor device as set forth in 15 above, further comprising:
a step of removing the stopper layer and the first and second stopper layers after the step of (f);
subsequently a conductive film being buried in the wiring grooves and the contact holes to form wires and interlayer connecting members.
21. A method of manufacturing a semiconductor device comprising wires formed in wiring grooves and interlayer connecting members connecting the wires and the lower wires arranged therebelow; said method comprising:
   (a) a step of sequentially forming a first stopper/insulating layer, a first insulating layer and a stopper layer;
   (b) a step of transferring a wiring groove pattern into the stopper layer;
   (c) a step of forming a hole pattern mask for contact holes for accommodating interlayer connecting members to be formed therein;
   (d) a step of etching the stopper layer and the first insulating layer in the presence of the hole pattern mask and transferring the hole pattern halfway into the first insulating layer;
   (e) a step of removing the hole pattern layer; and
   (f) a step of conducting an etching operation in the presence of the stopper layer having the hole pattern and the wiring groove pattern formed therein to form contact holes and wiring grooves.
22. A method of manufacturing a semiconductor device comprising wires formed in wiring grooves and interlayer connecting members connecting the wires and the lower wires arranged therebelow; said method comprising:
   (a) a step of sequentially forming a first stopper/insulating layer, a first interlayer insulating layer, a marker insulating layer, a second interlayer insulating layer and a stopper layer;
   (b) a step of transferring a wiring groove pattern into the stopper layer;
   (c) a step of forming a hole pattern mask for contact holes for accommodating interlayer connecting members to be formed therein;
   (d) etching the second interlayer insulating layer and the marker insulating layer in the presence of the hole pattern mask and transferring the hole pattern;
   (e) removing the hole pattern layer; and
   (f) conducting an etching operation in the presence of the stopper layer having the hole pattern and the wiring groove pattern formed therein to form contact holes and wiring grooves;
the completion of the etching process of step (d) being detected by detecting plasma light emission of the elements contained in the marker insulating layer;
completion of the etching process on the hole pattern in step (f) being detected by the time of getting to the first stopper/insulating layer.
23. A method of manufacturing a semiconductor device comprising wires formed in wiring grooves and interlayer connecting members connecting the wires and lower wires thereof arranged therebelow; said method comprising:
   (a) a step of sequentially forming a first interlayer insulating layer, a marker insulating layer, a second interlayer insulating layer and a stopper layer;
   (b) a step of transferring a wiring groove pattern into the stopper layer;
   (c) a step of forming a hole pattern mask for contact holes for accommodating interlayer connecting members to be formed therein;
   (d) etching the second interlayer insulating layer and the marker insulating layer in the presence of the hole pattern mask and transferring the hole pattern;
   (e) removing the hole pattern layer; and (f) conducting an etching operation in the presence of the stopper layer having the hole pattern and the wiring groove pattern formed therein to form contact holes and wiring grooves;

completion of the etching process of step (f) being detected by detecting plasma light emission of the elements contained in the marker insulating layer.

24. A method of manufacturing a semiconductor device comprising wires formed in wiring grooves and interlayer connecting members connecting the wires and the lower wires arranged therebelow; said method comprising:
   (a) a step of sequentially forming a first stopper/insulating layer, a first interlayer insulating layer, a second stopper/insulating layer, a second interlayer insulating layer, a marker insulating layer, a third interlayer insulating layer and a stopper layer;
   (b) a step of transferring a wiring groove pattern into the stopper layer;
   (c) a step of forming a hole pattern mask for contact holes for accommodating interlayer connecting members to be formed therein;
   (d) etching the third interlayer insulating layer, the marker insulating layer, the second interlayer insulating layer and the second stopper/insulating layer in the presence of the hole pattern mask and transferring the hole pattern;
   (e) removing the hole pattern layer; and
   (f) conducting an etching operation in the presence of the stopper layer having the hole pattern and the wiring groove pattern formed therein to form contact holes and wiring grooves simultaneously;

completion of step (f) of etching the groove pattern being detected by detecting plasma light emission of the elements contained in the marker insulating layer.

25. A method of manufacturing a semiconductor device comprising wires formed in wiring grooves and interlayer connecting members connecting the wires and the lower wires arranged therebelow; said method comprising:
   (a) a step of sequentially forming a first interlayer insulating layer, a second interlayer insulating layer and a stopper layer;
   (b) a step of transferring a wiring groove pattern into the stopper layer;
   (c) a step of forming a hole pattern mask for contact holes for accommodating interlayer connecting members to be formed therein;
   (d) etching the stopper layer and the second interlayer insulating layer in the presence of the hole pattern mask and transferring the hole pattern;
   (e) removing the hole pattern layer; and
   (f) conducting an etching operation in the presence of the stopper layer having the hole pattern and the wiring groove pattern formed therein to form contact holes and wiring grooves simultaneously;

the first interlayer insulating layer and the second interlayer insulating layer being made of respective materials showing different etching rates;

completion of the etching process on the wiring groove pattern in step (f) being detected by the time of getting to the second interlayer insulating layer.

26. A method of manufacturing a semiconductor device comprising wires formed in wiring grooves and interlayer connecting members connecting the wires and the lower wires arranged therebelow; said method comprising:
   (a) a step of forming a first insulating layer;
   (b) a step of forming a wiring groove pattern layer on the first insulating layer to operate as etching mask when forming wiring grooves;
   (c) a step of forming a hole pattern layer on the wiring groove pattern layer to make the former operate as etching mask when forming contact holes for accommodating interlayer connecting members to be formed therein;
   (d) a step of conducting an etching operation in the presence of the hole pattern layer with a rate of etching the wiring groove pattern layer lower than the rate of etching the first insulating layer;
   (e) a step of removing the hole pattern layer; and
   (f) a step of conducting an etching operation in the presence of the wiring groove pattern and the hole pattern.

27. A method of manufacturing a semiconductor device as set forth in 26 above, wherein the hole diameter of the hole pattern as measured in the direction transversal to the wiring groove pattern layer is greater than the groove width of the wiring groove pattern layer.

28. A method of manufacturing a semiconductor device as set forth in any of 1 through 27 above, further comprising;
   (g) a step of forming a barrier metal layer and a copper layer on an entire surface of the substrate; and
   (h) a step of removing the barrier metal layer and the copper layer by chemical mechanical polishing except an inside of the wiring grooves and the contact holes formed by the etching process of step (f).

29. A method of manufacturing a semiconductor device as set forth in 28 above, wherein the wiring groove pattern layer or the stopper layer is removed in the step of (h).

30. A method of manufacturing a semiconductor device as set forth in 29 above, wherein a mask layer for patterning the wiring groove pattern layer or the stopper layer is formed by using a conductive material.

31. A method of manufacturing a semiconductor device comprising wires formed in wiring grooves and interlayer connecting members connecting the wires and the lower wires arranged therebelow; said method comprising:
   (a) a step of sequentially forming a first insulating layer and a stopper layer;
   (b) a step of transferring a wiring groove pattern into the stopper layer;
   (c) a step of forming a hole pattern mask for contact holes for accommodating interlayer connecting members to be formed therein;
   (d) a step of conducting a first etching operation of partly etching the stopper layer and the first insulating layer in the presence of the hole pattern mask and transferring the hole pattern;
   (e) a step of removing the hole pattern layer; and
   (f) a step of conducting a second etching operation in the presence of the stopper layer having the hole pattern and the wiring groove pattern formed therein to form contact holes and wiring grooves;

the stopper layer and the ridges of the first insulating layer being etched in either or both of the first and second etching operations.

32. A method of manufacturing a semiconductor device comprising wires formed in wiring grooves and interlayer connecting members connecting the wires and the lower wires arranged therebelow; said method comprising:
  (a) a step of sequentially forming a first insulating layer and a stopper layer;
  (b) a step of transferring a wiring groove pattern into the stopper layer;
  (c) a step of forming a hole pattern mask for contact holes for accommodating interlayer connecting members to be formed therein;
  (d) a step of conducting a first etching operation of etching part of the first insulating layer in the presence of the hole pattern mask and transferring the hole pattern;
  (e) a step of removing the hole pattern layer; and
  (f) a step of conducting a second etching operation in the presence of the stopper layer having the hole pattern and the wiring groove pattern formed therein to form contact holes and wiring grooves;
ends of the stopper layer being etched at least in either of the first and second etching operations.

33. A method of manufacturing a semiconductor device as set forth in 31 or 32 above, further comprising:
  (g) a step of forming a barrier metal layer and a copper layer on an entire surface of the substrate; and
  (h) a step of removing the barrier metal layer and the copper layer by chemical mechanical polishing except an inside of the wiring grooves and the contact holes formed by the etching process of step (f);
parts of the copper layer and those of the barrier metal layer located on the wiring grooves, the stopper layer and a surface section of the first insulating layer being removed in the step of (h).

34. A method of manufacturing a semiconductor device as set forth in 33 above, wherein
the copper layer includes a first copper layer operating as seed layer and a second copper layer formed by plating.

35. A method of manufacturing a semiconductor device comprising wires formed in wiring grooves and interlayer connecting members connecting the wires and lower wires thereof arranged therebelow; said method comprising:
  (a) a step of sequentially forming a first insulating layer and a stopper layer on the lower wires;
  (b) a step of transferring a wiring groove pattern into the stopper layer;
  (c) a step of forming a hole pattern mask for contact holes for accommodating interlayer connecting members to be formed therein;
  (d) a step of etching the first insulating layer in the presence of the hole pattern mask and transferring the hole pattern;
  (e) a step of removing the hole pattern layer; and
  (f) a step of conducting a second etching operation in the presence of the stopper layer having the hole pattern and the wiring groove pattern formed therein to form contact holes and wiring grooves;
the hole pattern mask of the step of (c) being formed in alignment with the lower wires.

36. A method of manufacturing a semiconductor device comprising wires formed in wiring grooves and interlayer connecting members connecting the wires and the lower wires arranged therebelow; said method comprising:
  (a) a step of sequentially forming a first insulating layer and a stopper layer on the lower wires;
  (b) a step of transferring a wiring groove pattern into the stopper layer;
  (c) a step of forming a hole pattern mask for contact holes for accommodating interlayer connecting members to be formed therein;
  (d) a step of etching the first insulating layer in the presence of the hole pattern mask and transferring the hole pattern;
  (e) a step of removing the hole pattern layer; and
  (f) a step of conducting a second etching operation in the presence of the stopper layer having the hole pattern and the wiring groove pattern formed therein to form contact holes and wiring grooves;
the hole pattern mask of the step of (c) being formed in alignment with center of the lower wires and that of the wiring groove pattern.

37. A method of manufacturing a semiconductor device as set forth in any of 1 through 36 above, wherein
the plan of the contact holes is formed by transferring the plan of the hole pattern of step (c); and
the plan of the wires is formed by transferring the plan of the pattern of step (b) ant that of step (c).

38. A method of manufacturing a semiconductor device as set forth in any of 1 through 37 above, wherein
the mask of step (b) is formed by using resist or a hard mask.

39. A method of manufacturing a semiconductor device as set forth in any of 1 through 38 above, wherein
the diameter of the contact holes and the width of the wires shows a substantially same value.

40. A semiconductor device comprising wires formed in wiring grooves and interlayer connecting members connecting the wires and lower wires thereof arranged therebelow;
an interlayer insulating layer containing a marker insulating layer being formed to separate the lower wires and the wires in the wiring grooves;
the marker insulating layer being formed between bottoms of the wiring grooves and the lower wires.

41. A semiconductor device comprising wires formed in wiring grooves and interlayer connecting members connecting the wires and lower wires thereof arranged therebelow;
the wires having a cross section with its width increasing toward a surface so as to increase an angle of inclination.

42. A method of manufacturing a semiconductor device comprising:
a step of forming an anti-reflection film on an insulating film having a flattened surface and provided with wires arranged thereunder; and
a step of applying resist onto the anti-reflection film to form a resist film and irradiating the resist film with patterned light for exposure.

43. A method of manufacturing a semiconductor device as set forth in 42 above, wherein
the wires are formed by burying conductive members in wiring grooves formed in a lower insulating film layer of the insulating film and removing the conductive members by means of a CMP method from the areas other than the wiring grooves and the insulating film is formed with the flattened surface on the lower wires and the wires by means of a deposition method.

44. A method of manufacturing a semiconductor device as set forth in 42 above, wherein the wires are formed by depositing a conductive film and patterning the film by means of a photolithography method and the insulating film is formed with the flattened surface by depositing an insulating film to cover the wires and polishing the surface of the deposited insulating by means of a CMP method.

45. A method of manufacturing a semiconductor device comprising:

a step of depositing a second insulating film on a first insulating film, the second insulating film showing an etching selectivity relative to the first insulating layer;

a step of forming a first resist film patterned to show a wiring groove pattern on the second insulating film;

a step of etching the second insulating film in the presence of the first resist film and transferring the wiring groove pattern into the second insulating film;

a step of forming an anti-reflection film on the second insulating film;

a step of applying resist onto the anti-reflection film to form a second resist film; and a step of irradiating the second resist film with light showing a contact hole pattern for exposure.

46. A method of manufacturing a semiconductor device as set forth in 45 above, wherein the second insulating film has a film thickness small enough for the surface thereof to be regarded as flat after forming the anti-reflection film.

47. A method of manufacturing a semiconductor device as set forth in 45 or 46 above, wherein the second insulating film has a film thickness smaller than the first insulating and the second resist film.

48. A method of manufacturing a semiconductor device comprising:

a step of forming a mask for wiring grooves and subsequently forming an anti-reflection film;

a step of forming a mask for contact holes on the anti-reflection film; and a step of transferring wiring grooves and contact holes into the insulating film by using the mask for wiring grooves and the mask for contact holes.

49. A method of manufacturing a semiconductor device as set forth in 48 above, wherein the anti-reflection film operates as flattening film.

50. A method of manufacturing a semiconductor device comprising:

a step of forming a mask for wiring grooves and subsequently forming a flattening film;

a step of forming a mask for contact holes on the flattening film; and a step of transferring wiring grooves and contact holes into the insulating film by using the mask for wiring grooves and the mask for contact holes.

51. A method of manufacturing a semiconductor device as set forth in 50 above, wherein the flattening film and the mask for wiring grooves are removed in a self-aligning manner relative to the mask for contact holes.

52. A semiconductor device comprising:

wiring grooves formed in an interlayer insulating film;

wires formed in the wiring grooves;

contact holes formed in the interlayer insulating film; and connecting members formed in the contact holes;

diameter of the contact holes and width of the wires showing a substantially same value;

the wires and the connecting members being formed integrally.

53. A semiconductor device as set forth in 52 above, wherein the plan of the wires is formed from the plan of the contact holes and the diameter of the contact holes as measured in the direction transversal to the wiring grooves.

54. A semiconductor device as set forth in 52 above, wherein the wiring grooves and the contact holes overlap with each other in terms of the area of the plan of the contact holes.

55. A semiconductor device as set forth in 52, 53 or 54 above, further comprising:

first wires having a predetermined width greater than the diameter of the contact holes;

the first wires and the contact holes overlap with each other in terms of the area of the plan of the contact holes.

56. A method of manufacturing a semiconductor device comprising:

a step of forming a first mask film on a film to be patterned and subsequently forming an anti-reflection film;

a step of forming a second mask film on the anti-reflection film; and a step of transferring a pattern into the film to be patterned by using the first and second mask films.

57. A method of manufacturing a semiconductor device comprising:

a step of forming a first mask film on a film to be patterned and subsequently forming a flattening film;

a step of forming a second mask film on the flattening film; and a step of transferring a pattern into the film to be patterned by using the first and second mask films.

58. A method of manufacturing a semiconductor device as set forth in 56 or 57 above, wherein the anti-reflection film or the flattening film and the first mask film are removed in a self-aligning manner relative to the second mask film.

BRIEF DESCRIPTION OF THE DRAWINGS

FIG. 21 is a schematic cross sectional view of the semiconductor device of FIG. 1 showing still another subsequent step of Embodiment 1 of manufacturing method.

FIG. 22 is a schematic cross sectional view of the semiconductor device of FIG. 1 showing still another subsequent step of Embodiment 1 of manufacturing method.

DESCRIPTION OF THE PREFERRED EMBODIMENTS

Figure 1:
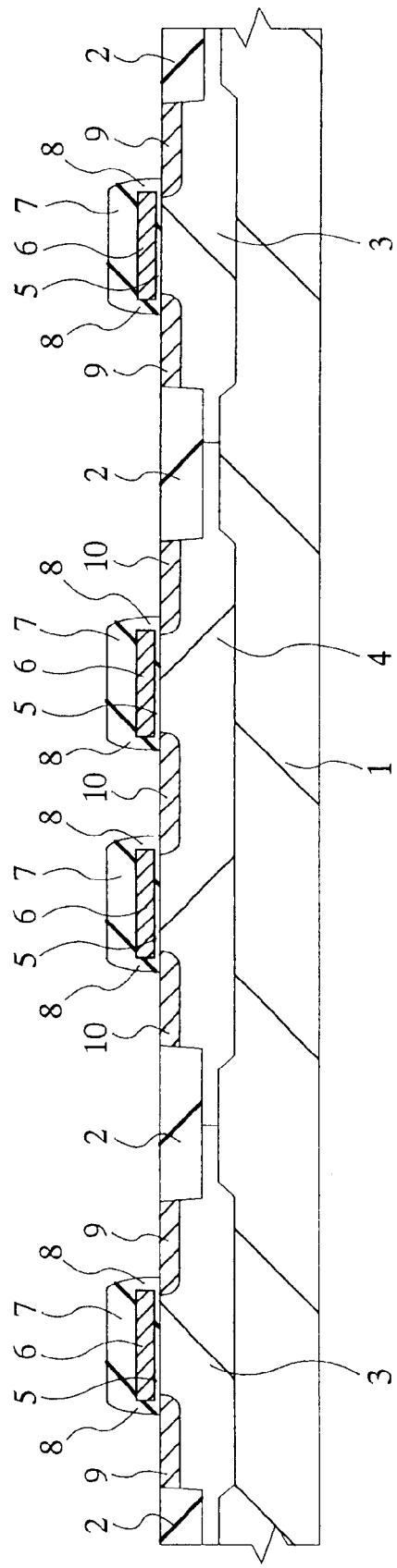
FIG. 1 is a schematic cross sectional view of a semiconductor device illustrating a step of an embodiment (Embodiment 1) of manufacturing method according to the invention.

Now, the present invention will be described in greater detail by referring to the accompanying drawings that illustrate preferred embodiments of the invention. Throughout the drawings, same or similar components are denoted respectively by same reference symbols and would not be described repeatedly.

(Embodiment 1)

FIGS. 1 through 22 are schematic cross sectional views of a semiconductor device showing different steps of an embodiment of manufacturing method according to the invention. The steps of the embodiment will be described sequentially by referring to the drawings.

Firstly, referring to FIG. 1, a semiconductor substrate 1 typically made of p-type single crystal silicon is brought in and device isolating regions 2 are formed on the principal surface of the semiconductor substrate 1 for the device. The device isolating regions 2 are typically formed in a manner as described below. Firstly, a silicon oxide film ($SiO_2$) and a silicon nitride film (SiN) are sequentially formed on the principal surface of the semiconductor substrate 1. Then, the silicon nitride film is etched by using a patterned photoresist film and shallow grooves are formed in the semiconductor substrate 1 by using the etched silicon nitride film as mask. Subsequently, an insulating film, which may typically be a silicon oxide film, is deposited to fill the shallow grooves and all the silicon oxide film is removed, for example, by CMP (chemical mechanical polishing) or so except the areas of the shallow grooves. As a result, the device isolating regions 2 come out.

Then, ions of impurity substances are implanted by using the patterned photoresist film as mask to form a p-well 3 and an n-well 4. More specifically, ions of a p-conductivity type impurity substance such as boron (B) are implanted into the p-well 3, whereas ions of an n-conductivity type impurity such as phosphor (P) are implanted into the n-well 4. Ions of impurities may subsequently and additionally be implanted into the respective well regions in order to control the threshold value of the MISFET.

Then, a silicon oxide film for forming a gate insulating film 5, a polycrystalline silicon film for forming a gate electrode 6 and another silicon oxide film for forming a cap insulating film 7 are sequentially formed by deposition to produce a multilayer film. Then, the multilayer film is etched by using a photoresist film patterned by photolithography as mask. As a result, the gate insulating film 5, the gate electrode 6 and the cap insulating film 7 are made to take shape. The gate insulating film 5 may typically be formed by thermal CVD, while the gate electrode may be formed by CVD (chemical vapor deposition). The gate electrode 6 may be doped with a p-type impurity or an n-type impurity depending on the channel type of the MISFET in order to reduce the resistance of the gate electrode 6. More specifically, the gate electrode of a p-channel type MISFET may be doped with a p-type impurity, whereas the gate electrode of an n-channel type MISFET may be doped with an n-type impurity. An ion implanting technique may be used for the doping operation. A film of a high melting point metal silicide such as WSix, MoSix, TiSix or TaSix may be laid on the gate electrode 6 or a layer of a metal such as tungsten may be formed on the gate electrode 6 with a barrier metal layer of titanium nitride (TiN) of tungsten nitride (WN) interposed therebetween to reduce the sheet resistance of the gate electrode 6 and improve the operating speed of the MISFET. The cap insulating film 7 may typically be formed by CVD.

Then, after depositing a silicon oxide film on the semiconductor substrate 1 typically by CVD, the deposited silicon oxide film is anisotropically etched to produce side wall spacers 8 on the lateral walls of the gate electrode 6.

Thereafter, ions of an n-type impurity (e.g., phosphor or arsenic) are implanted into the p-well 3 by using the photoresist film as mask to produce n-type semiconductor regions 9 at the opposite lateral sides of the gate electrode 6 on the p-well 3. The n-type semiconductor regions 9 are formed in a self-aligning manner relative to the gate electrode 6 and the side wall spacers 8. The n-type semiconductor regions 9 operate as source/drain regions of the n-channel MISFET Qn. Similarly, ions of a p-type impurity (e.g., boron) are implanted into the n-well 4 by using the photoresist film as mask to produce p-type semiconductor regions 10 at the opposite lateral sides of the gate electrode 6 on the n-well 4. The p-type semiconductor regions 10 are formed in a self-aligning manner relative to the gate electrode 6 and the side wall spacers 8. The p-type semiconductor regions 10 operate as source/drain regions of the p-channel MISFET Qp.

Alternatively, low concentration impurity semiconductor regions may be formed before forming the side wall spacers 8 and high concentration impurity semiconductor regions may be formed after forming the side wall spacers 8 to produce a so-called LDD (lightly doped drain) structure.

Figure 2:
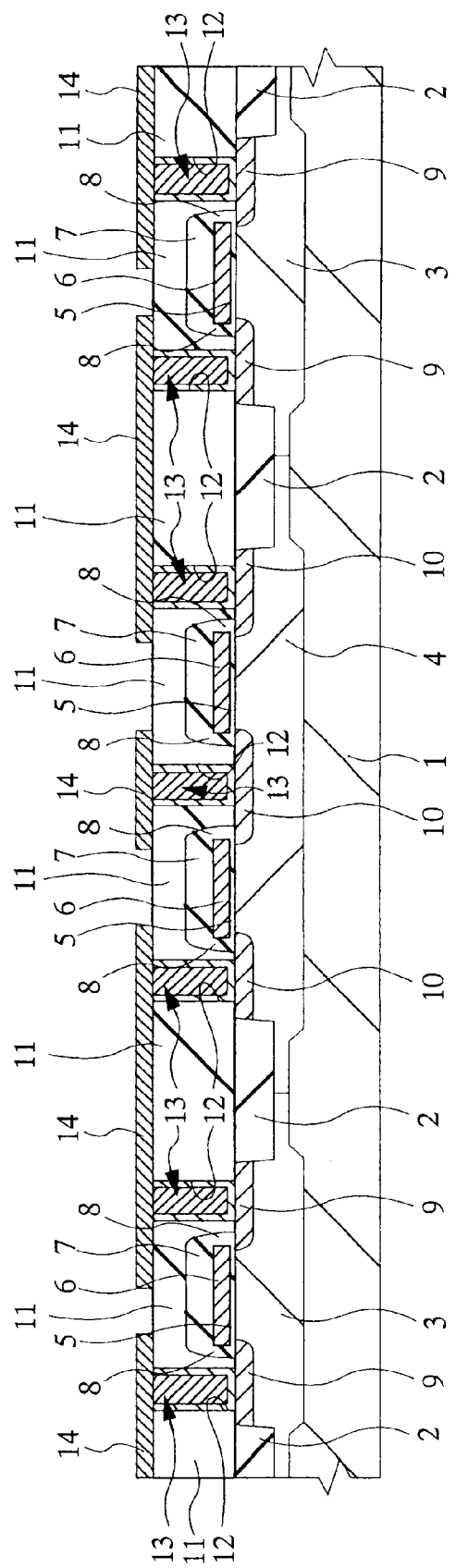
FIG. 2 is a schematic cross sectional view of the semiconductor device of FIG. 1 showing a subsequent step of Embodiment 1 of manufacturing method.

Then, as shown in FIG. 2, a first interlayer insulating film 11 having a flattened surface is formed on the semiconductor substrate 1 by depositing a silicon oxide film on the 1 by means of sputtering or CVD and subsequently polishing the silicon oxide film by CMP. The first interlayer insulating film 11 may alternatively be a multilayer film such as a silicon nitride film, an SOG (spin on glass) film or a BPSG (boron phosphor silicate lass) film.

Then, contact holes 12 are formed in the first interlayer insulating film 11 by photolithography. More specifically, the contact holes are formed on the required areas of the n-type semiconductor region 9 and the p-type semiconductor region 10.

Then, plugs 13 are formed in the respective contact holes 12 in a manner as described below. Firstly, a titanium nitride (TiN) film is formed on the entire surface of the semiconductor substrate 1 including the inside of the contact holes 12 typically by means of CVD. Since the CVD process is excellent in covering the steps of the surface to be coated, a titanium nitride film can be formed uniformly even in the very small contact holes 12. Then, a tungsten (W) film is formed to fill the contact holes 12 typically also by means of CVD because the very small contact holes 12 can be filled with tungsten by using a CVD process. Then, the plugs 13 are formed by removing the titanium nitride film and the tungsten film from the areas other than those of the contact holes 12 typically by CMP. Additionally, a titanium (Ti) film may be formed by deposition before forming the titanium nitride film and the semiconductor substrate may be silicified at the bottoms of the contact holes 12 (n-type and p-type semiconductor regions 9 and 10) by heat treatment. Such a silicide layer can effectively reduce the contact resistance of the bottoms of the contact holes 12.

Then, typically a tungsten film is formed on the entire surface of the semiconductor substrate 1 and patterned by photolithography to produce wires 14 of the first wiring layer. Such a tungsten film can be formed by CVD or sputtering.

Figure 3:
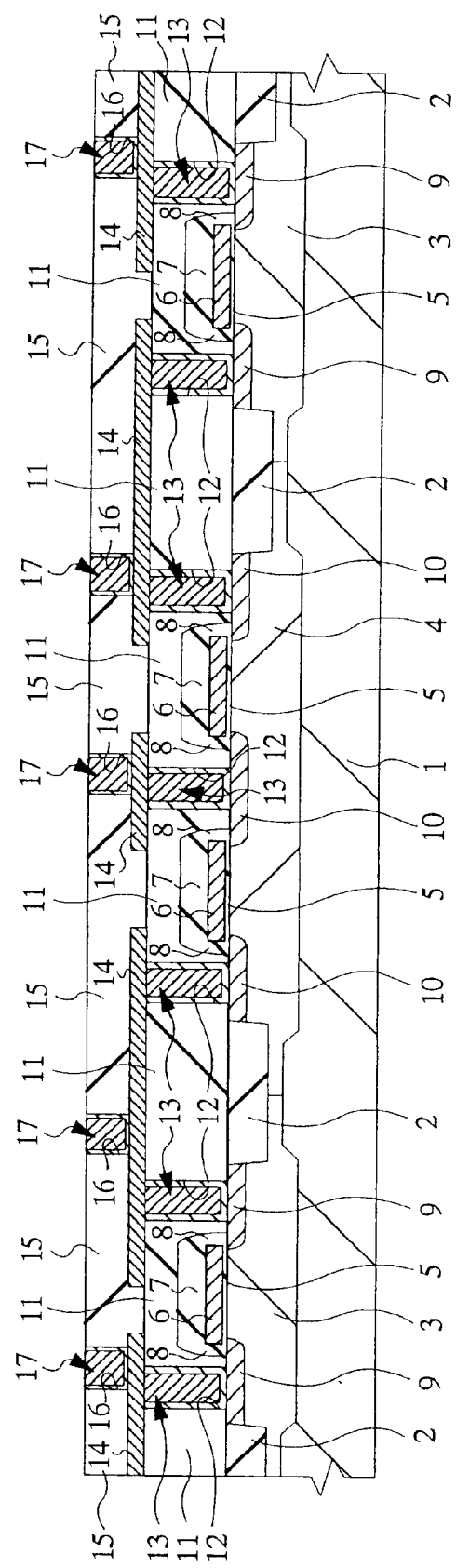
FIG. 3 is a schematic cross sectional view of the semiconductor device of FIG. 1 showing another subsequent step of Embodiment 1 of manufacturing method.

Thereafter, as shown in FIG. 3, an insulating film such as a silicon oxide film is formed to cover the wires 14 and then flattened by CMP to produce a second interlayer insulating film 15.

Then, a photoresist film having openings corresponding to the contact holes is formed on the second interlayer insulating film 15 and the second interlayer insulating film 15 is etched by using the photoresist film as mask to produce contact holes 16 at respective positions of the second interlayer insulating film 15.

Subsequently, plugs 17 are formed in the respective contact holes 16 in a manner as described below. Firstly, a barrier layer is formed on the entire surface of the semiconductor substrate 1 including the inside of the contact holes 16 and then a copper (Cu) film is formed to fill the contact holes 16. The plugs 17 are produced when the copper film and the barrier film are removed from the areas other than the contact holes 16.

The barrier layer operates to prevent the diffusion of copper into peripheral areas including the second interlayer insulating film 15 and may be made of titanium nitride. However, it is not necessary that the barrier layer is made of titanium nitride and may alternatively be made of some other metal that can effectively prevent copper from diffusion into peripheral areas. For instance, tantalum (Ta) or tantalum nitride (TaN) may be used in place of titanium nitride. Therefore, while the following steps are described below in terms of a titanium nitride film operating as barrier layer, the titanium nitride film may be replaced with a tantalum film or a tantalum nitride film as described above.

The copper film operates as principal a conducting layer and can be prepared typically by plating. A thin copper film may be formed as seed film by sputtering prior to forming the copper film by plating. The copper film may alternatively be formed by sputtering. If such is the case, the copper film formed by sputtering may be then fluidized by heat treatment to improve the effect of filling the contact holes and the wiring grooves. While the following steps are described below in terms of a copper film formed by plating, the plating process may be replaced with a sputtering process as described above.

Figure 4:
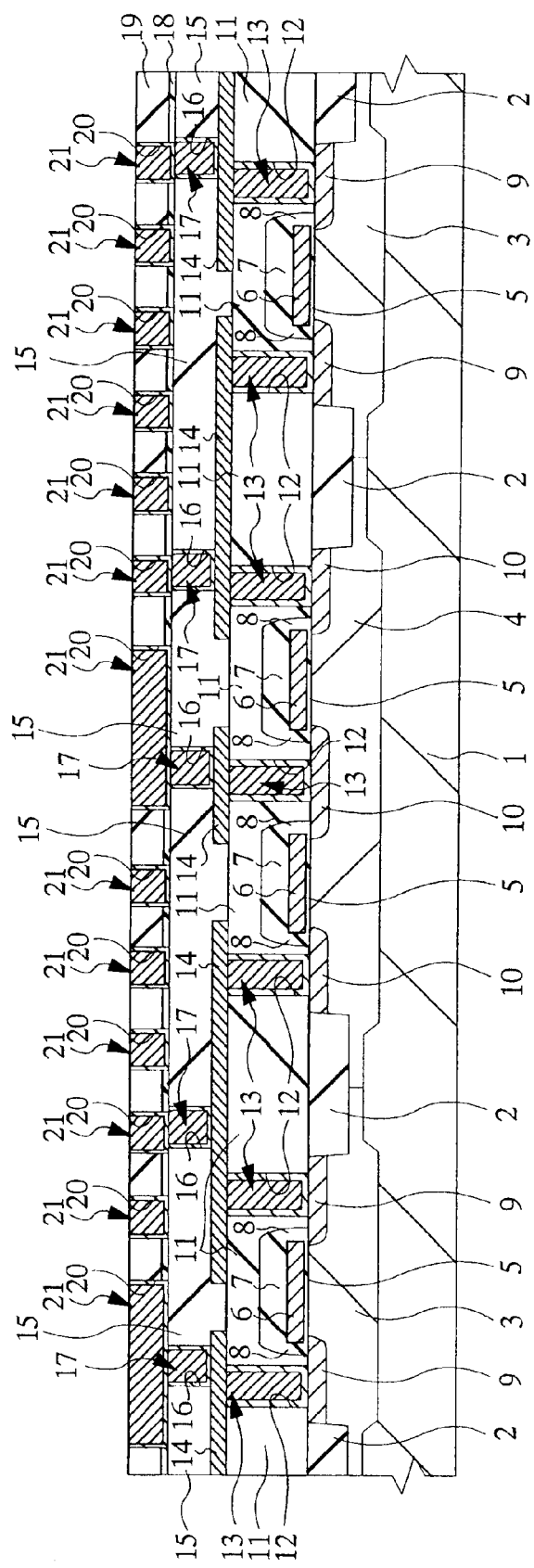
FIG. 4 is a schematic cross sectional view of the semiconductor device of FIG. 1 showing still another subsequent step of Embodiment 1 of manufacturing method.

Then, as shown in FIG. 4, a stopper/insulating film 18 is formed on the second interlayer insulating film 15 and then an insulating film 19 is formed thereon for forming the second wiring layer. The stopper/insulating film 18 operates as etching stopper when forming grooves in the insulating film 19 and hence a material showing an etching selectivity relative to the insulating film 19 should be used for the stopper/insulating film 18. More specifically, the stopper/insulating film 18 may be made of silicon nitride. The insulating film 19 should be made of a material having a small dielectric constant in order to minimize the inter-wire capacitance of the wires. The insulating film 19 may preferably be made of silicon oxide. The second wiring layer is formed in the stopper/insulating film 18 and the insulating film 19 in a manner as described below. Therefore, the sum of the film thickness of the stopper/insulating film 18 and that of the insulating film 19 is selected from the viewpoint of the second wiring layer. Additionally, from the viewpoint of minimizing the inter-wire capacitance, the stopper/insulating film 18 made of silicon nitride that shows a high dielectric constant should be made as thin as possible provided that it operates satisfactorily as stopper.

Then, a photoresist film having patterned openings is formed by patterning on the insulating film 19 and the first etching operation is carried out by using the photoresist film as mask. As a result of the first etching operation, the wiring grooves 20 are partly formed in the insulating film 19. Conditions that allows the silicon oxide film to be etched with ease and makes it difficult to etch the silicon nitride film should be selected for the etching process. Then, the stopper/insulating film 18 (silicon nitride film) can be effectively used as etching stopper. Thereafter, the second etching operation is carried out under conditions that encourage the silicon nitride film to be etched effectively. Since the stopper/insulating film 18 is sufficiently thin as described above, the risk of excessively etching the second interlayer insulating film 15 in the second etching operation is minimized. As a result of the two-stage etching process, wiring grooves 20 having a uniform depth can be reliably produced.

Then, wires 21 are formed in the respective wiring grooves 20 for the second wiring layer. The wires 21 has a barrier layer and a principal conducting layer, of which the barrier layer is typically made of titanium nitride whereas the principal conducting layer is typically made of copper. The wires 21 are formed in a manner as described below. Firstly, a titanium nitride film is formed on the entire surface of the semiconductor surface including the inside of the wiring grooves 20 and then a copper film is formed to fill the wiring grooves 20. The titanium nitride film may be formed by CVD, for example, whereas the copper film may be formed by plating. A thin copper film may be formed as seed film by sputtering prior to forming the copper film by plating. Subsequently, the copper film and the titanium nitride film are removed from the areas other than the wiring grooves 20 to produce the wires 21. As pointed out above, the barrier layer may be made of a material other than titanium nitride, whereas the copper film may be prepared by a technique other than plating such as sputtering.

Figure 5:
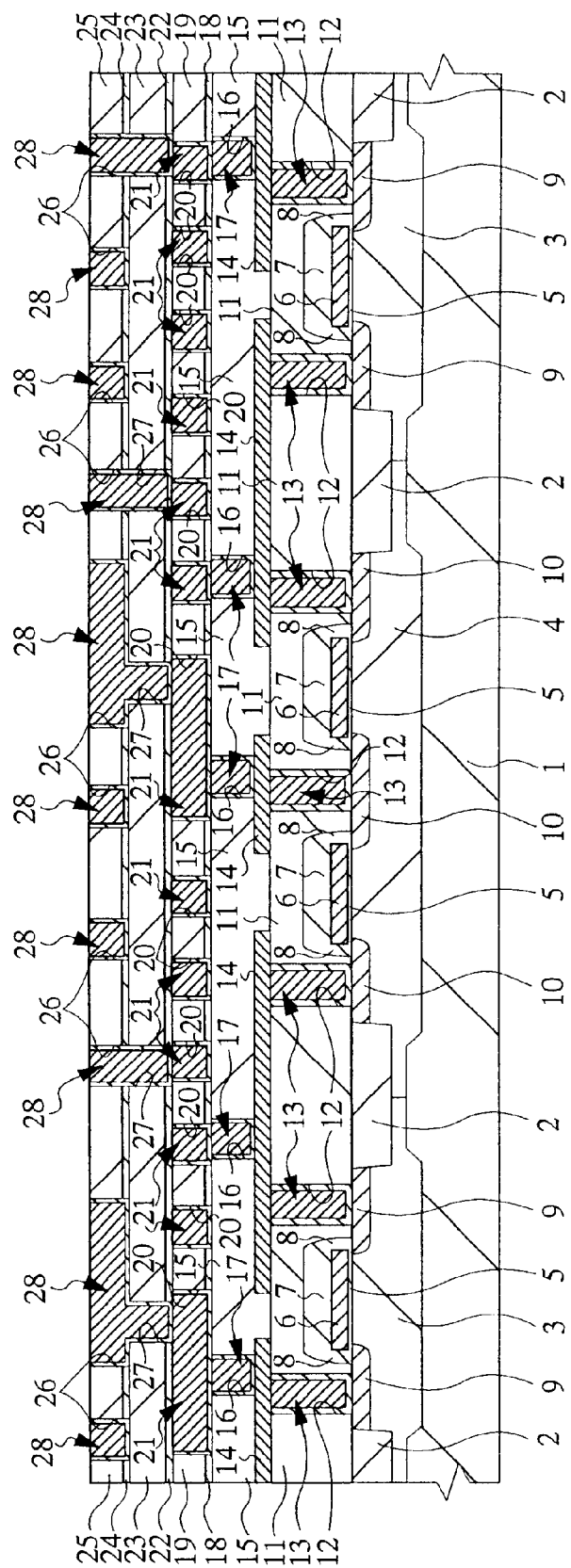
FIG. 5 is a schematic cross sectional view of the semiconductor device of FIG. 1 showing still another subsequent step of Embodiment 1 of manufacturing method.

Then, as shown in FIG. 5, a stopper/insulating film 22, an interlayer insulating film 23, another stopper/insulating film 24 for forming wires, another insulating film 25 for forming wires are sequentially formed on the wires 21 of the second wiring layer and the insulating film 19. The stopper/insulating films 22, 24 are made of a material showing an etching selectivity relative to the interlayer insulating film 23 and the insulating film 25. They may typically be made of silicon nitride. On the other hand, the interlayer insulating film 23 and the insulating film 25 may be made of silicon oxide.

Thereafter, wiring grooves 26 are formed in the insulating film 25 and the stopper/insulating film 24, while contact holes 27 are formed in the interlayer insulating film 23 and the stopper/insulating film 22. The technique for forming grooves 44 and holes 45 in the fifth wiring layer as discussed hereinafter for the purpose of the invention may also be used for forming the wiring grooves 26 and the contact holes 27. Since the technique is described in detail hereinafter in terms of the fifth wiring layer, it will not be described here.

Then, wires 28 are formed in the inside of the wiring grooves 26 and the contact holes 27 for the third wiring layer. Connecting members for connecting the wires 28 and the lower wires 21 are formed integrally with the wires 28. In other words, the wires 28 are formed by way of a so-called dual damascene process in a manner as described below. Firstly, a titanium nitride film that operates as barrier layer is formed on the entire surface of the semiconductor substrate 1 including the inside of the wiring grooves 26 and the contact holes 27 typically by means of CVD and subsequently a copper film is formed to fill the wiring grooves 26 and the contact holes 27 typically by plating. Then, the copper film and the titanium nitride film are removed in areas other than the wiring grooves 26 and the contact holes 27 to produce the wires 28 integrally with the connecting members.

Alternatively, a single damascene process may be used for the purpose of the invention. Then, firstly the connecting members (plugs) are formed and thereafter the wires 28 are formed in the wiring grooves as in the case of the above described second wiring layer.

Figure 6:
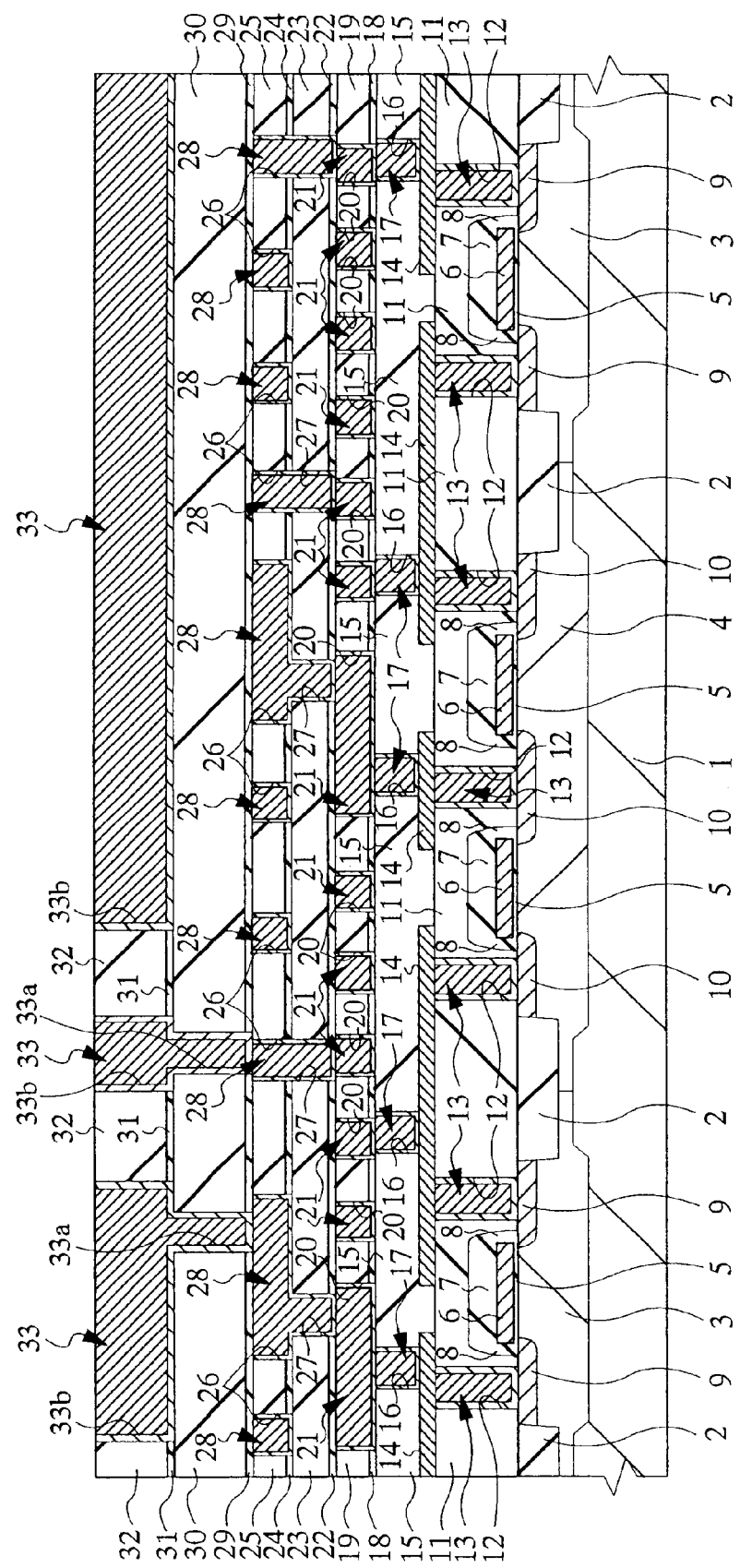
FIG. 6 is a schematic cross sectional view of the semiconductor device of FIG. 1 showing still another subsequent step of Embodiment 1 of manufacturing method.

Then, as shown in FIG. 6, a stopper/insulating film 29, an interlayer insulating film 30, another stopper/insulating film 31 for forming wires, an insulating film 32 for forming wires are sequentially formed on the insulating film 25 and the wires 28. The process of forming the insulating films 29 through 32 is exactly same as the above described process of forming the stopper/insulating film 22, the interlayer insulating film 23, the stopper/insulating film 24 for forming wires and the insulating film 25 for forming wires. Additionally, contact holes 33a are formed for connecting members through the stopper/insulating film 29 and the interlayer insulating film 30 and then wiring grooves 33b are formed in the stopper/insulating film 31 and the insulating film 32 as in the case of the above described third wiring layer. The process for forming the holes 33a and the grooves 33b can be applicable to the grooves 44 and the holes 45 of the fifth wiring layer that will be described hereinafter. Then, wires 33 are formed for the fourth wiring layer as in the case of the wires 28 of the third wiring layer. While the wires 33 of the fourth wiring layer are formed integrally with the connecting members for connecting them with the lower layer wires 28 by way of a dual damascene process as described above, a single damascene process may alternatively be used for forming the connecting members and the wires as described above by referring tot he third wiring layer.

Figure 7:
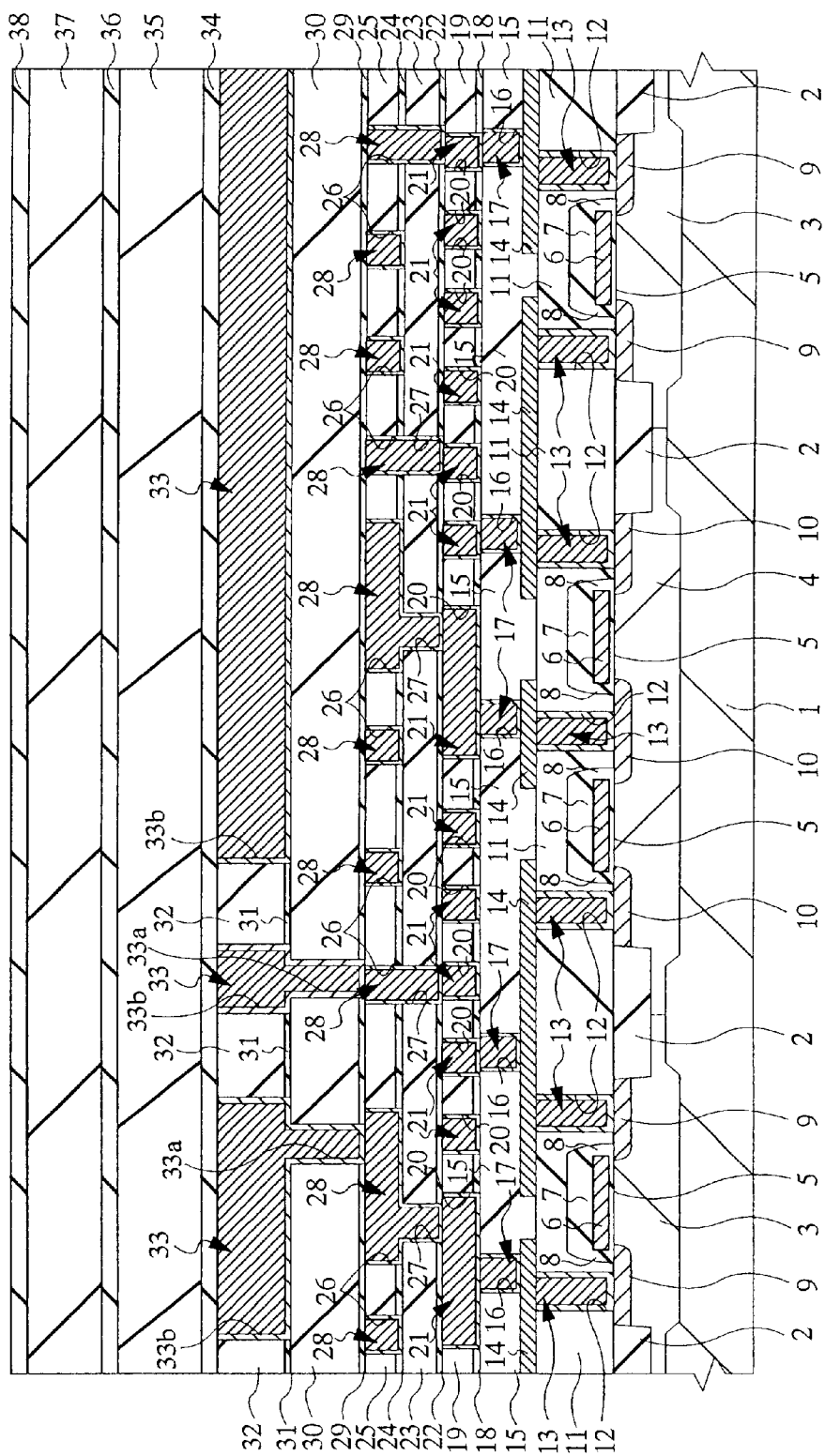
FIG. 7 is a schematic cross sectional view of the semiconductor device of FIG. 1 showing still another subsequent step of Embodiment 1 of manufacturing method.

Now, the process of forming the fifth wiring layer will be described below. This is a technique for forming grooves and holes that is unique to the present invention. Referring to FIG. 7, insulating films 34 through 38 are formed sequentially on the wires of the fourth wiring layer and the insulating film 32 by deposition. Of the films, the insulating films 34 and 36 are typically made of silicon nitride and have a film thickness of 50 nm. The insulating film 35 is typically made of silicon oxide and has a film thickness of 450 nm. The insulating film 37 is typically made of silicon oxide and has a film thickness of 350 nm. Finally, the insulating film 38 is typically made of silicon nitride and has a film thickness of 100 nm.

The silicon nitride films (insulating films 34, 36, 38) may typically be formed by plasma CVD. Plasma CVD allows the use of low film forming temperature. In the process of manufacturing a semiconductor device (so-called pre-process), the wiring forming steps are arranged close to the end of the process so that they should be conducted at temperature (typically as low as 400° C.) that does not adversely affect the device structures that have already been formed (impurity diffusion layers, silicide layers, etc.). Plasma CVD is advantageous in that it can exactly meet the low temperature requirement. Additionally, the silicon oxide films (insulating films 35, 37) can be formed by plasma CVD. When plasma CVD is employed, TEOS (tetraethylorthosilicate) can be used as source gas. When a silicon oxide film is formed by using TEOS (hereinafter to be referred to as TEOS oxide film) as source gas, the cluster mobility can be raised at the time of forming the film to consequently produce a silicon oxide film that is excellent in step coverage. Additionally, a silicon oxide film formed at relatively low film forming temperature (e.g., lower than 400° C.) is very dense. Note, however, that a TEO oxide film may be replaced with an SOG (spin on glass) film showing a low dielectric constant that may contain fluorine. The use of an SOG film showing a low dielectric constant can reduce the inter-wire capacitance to improve the performance of semiconductor devices.

As described hereinafter, contact holes 45 are formed through the insulating films 34, 35, of which the insulating film 34 operates as etching stopper when forming the contact holes 45. In other words, the insulating film 35 is etched under conditions that make the insulating film 34 resistant against etching relative to the insulating film 35. The silicon nitride film of the insulating film 34 shows a high dielectric constant relative to a silicon oxide film and hence its film thickness should be made as small as possible in order to reduce the inter-wire capacitance. Thus, the insulating film 34 is made to show a film thickness that is equal to the lower limit for meeting the requirements of an etching stopper that is used at the time of forming contact holes. As pointed out above, the inter-wire capacitance of the device can be minimized by reducing the film thickness of the insulating film 34. The above cited film thickness of 50 nm is selected by taking these circumstances into consideration.

Wiring grooves 44 are formed in the insulating films 36, 37, of which the insulating film 36 operates as etching stopper when forming the wiring grooves 44 like the insulating films 34 and 35. Note that the insulating film 36 is required to operate only as etching stopper for forming the wiring grooves and hence is not required to operate both as etching stopper form forming wiring grooves and as etching mask for forming contact holes in a manner as described earlier in terms of a self-aligning method. Therefore, the insulating film 36 can be made to show a reduced film thickness to consequently reduce the inter-wire capacitance if compared with a similar insulating film used with a self-aligning method. As pointed out above by referring to the insulating film 34, the insulating film 36 is made of silicon nitride and hence it should be made as thin as possible. The above cited film thickness of 50 nm is selected by taking these circumstances into consideration.

As will be described hereinafter, the insulating film 38 operates as mask when forming wiring grooves. Since the insulating film 38 can be removed when forming wires in a manner as described hereinafter, the film thickness of the insulating film 38 does not affect the inter-wire capacitance (the performance of the device). In other words, the insulating film 38 may have a any film thickness so long as it can operates as mask and therefore its film thickness does not need to be minimized. The above cited film thickness of 100 nm is selected by taking these circumstances into consideration.

While the stopper films used for forming the contact holes 45 and the wiring grooves 44 are made of silicon nitride in the above description of the embodiment, they need not necessarily be made of silicon nitride and may alternatively be made of some other material so long as the material shows an etching selectivity relative to a silicon oxide film or an SOG film. For example, they may be silicon oxide films that show an etching selectivity relative to an TEOS oxide film.

The film thickness of each of the silicon oxide films (insulating films 35, 37) may be selected appropriately by taking the thickness of the wires and the distances separating the wiring layers into consideration. It should be noted here that the thickness of the wires is related with the width thereof and so determined that the cross section of each of the wires provides a certain required area. On the other hand, the distances separating the wiring layers are selected on the basis of the inter-wire withstand voltage and the inter-wire capacitance. Thus, the film thickness of each of the silicon oxide films is determined by considering those values.

Figure 8:
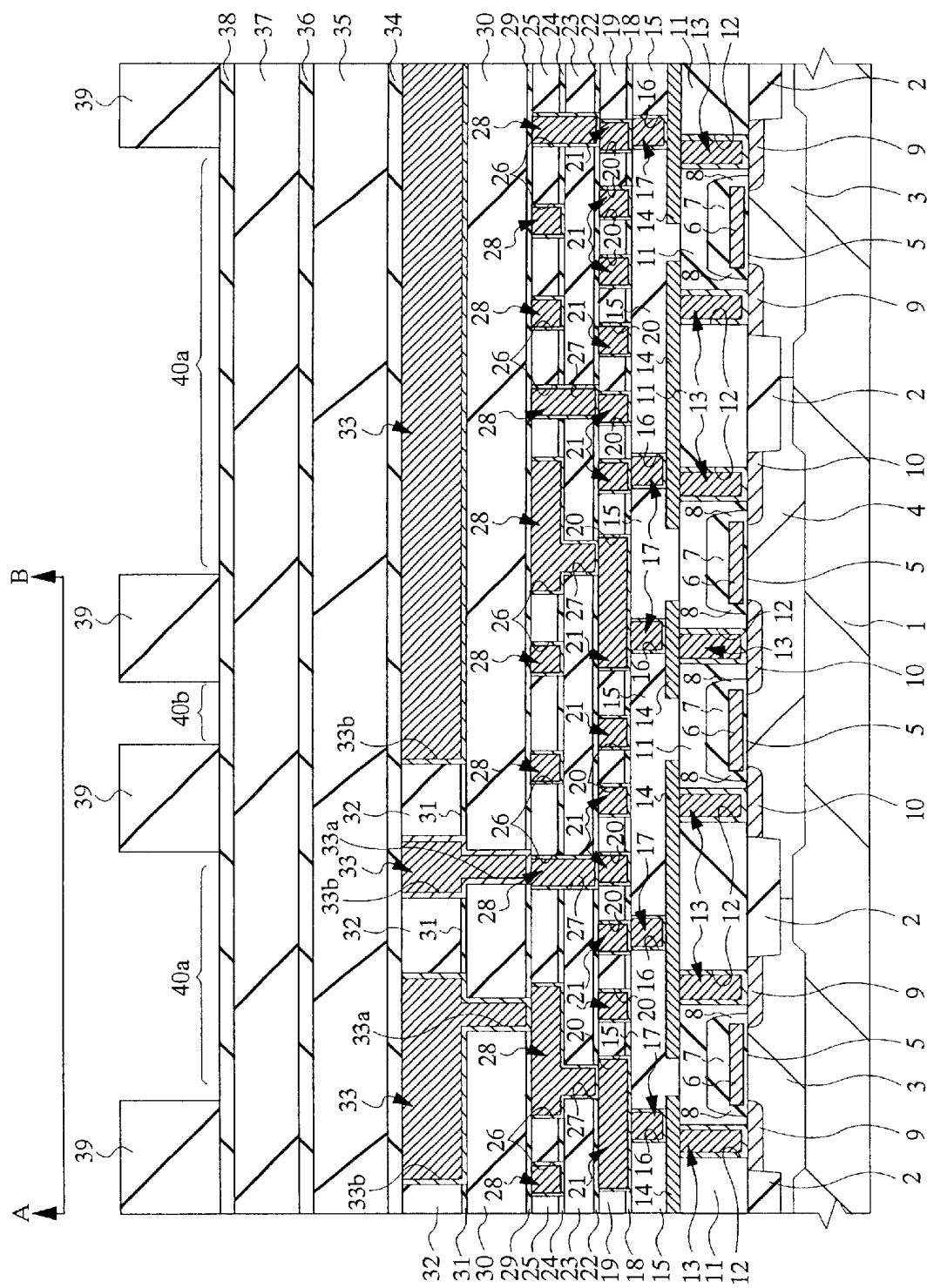
FIG. 8 is a schematic cross sectional view of the semiconductor device of FIG. 1 showing still another subsequent step of Embodiment 1 of manufacturing method.

Then, referring to FIG. 8, a resist film 39 is formed on the insulating film 38 by photolithography. The resist film 39 is patterned to show openings 40a for wires and openings 40b or stacked vias 40b for forming wiring grooves. In other words, both a wiring groove pattern and a via pattern are formed in the insulating film 38 and the openings of the patterns have a width dL of 350 nm for instance.

Figure 13A:
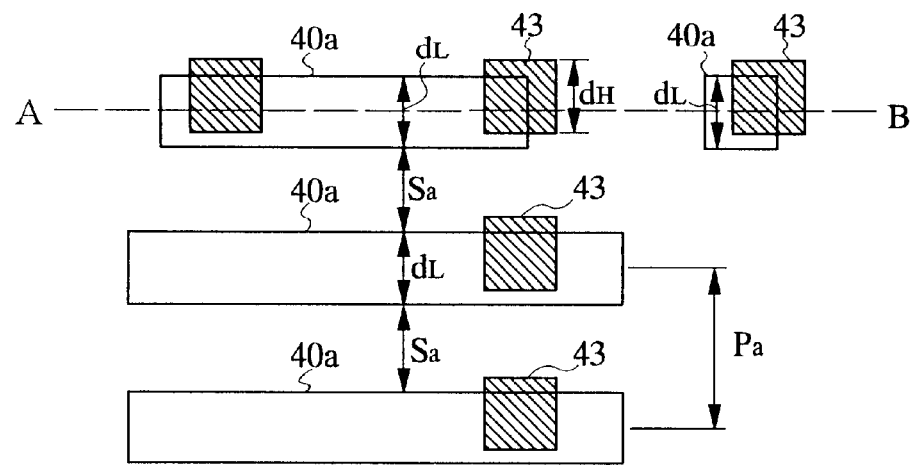
FIG. 13(a) is a schematic plan view of part of the semiconductor device of FIG. 1, illustrating a possible arrangement for making the wire pattern and the hole pattern overlap with each other in the case of Embodiment 1 of manufacturing method.

As seen from FIG. 13(a), the openings 40a for wires are made to show a linear profile with a same and identical width. In some instances, the openings to be used for forming wiring grooves may be made to have a so-called dog bone sections D showing a width greater than that of the wiring grooves in areas for forming contact holes in order to accommodate the relative displacement of the photomask for contact holes and the photomask for wiring grooves. However, such sections are not formed in this embodiment. Thus, the inter-wire intervals Sa can be minimized to improve the wire density and enhance the degree of integration in this embodiment. Additionally, since the openings for wires 40a have a simple linear profile, light used for exposure during a photolithography process would not give rise to any interference so that the developed patterns will show an enhanced precision level.

An anti-reflection film may be formed prior to forming the resist film 39. The insulating film 38 is made very flat because a CMP method is used for forming the fourth wiring layer of this embodiment and the insulating films 34 through 38 are formed on the fourth wiring layer by means of CVD. However, since insulating films are generally transparent in the wavelength zone of light used for exposure, light used for exposure can get to the wires 33 of the fourth wiring layer and become scattered by the wires 33 if no anti-reflection film is provided. Then, the accuracy of the exposure process using the resist film 39 can be degraded by scattered light to lower the precision level of the manufacturing process. If, to the contrary, an anti-reflection film is formed on the insulating film 38, no scattered light would be produced and the accuracy of the patterning operation using the resist film 39 can be significantly improved.

Figure 9:
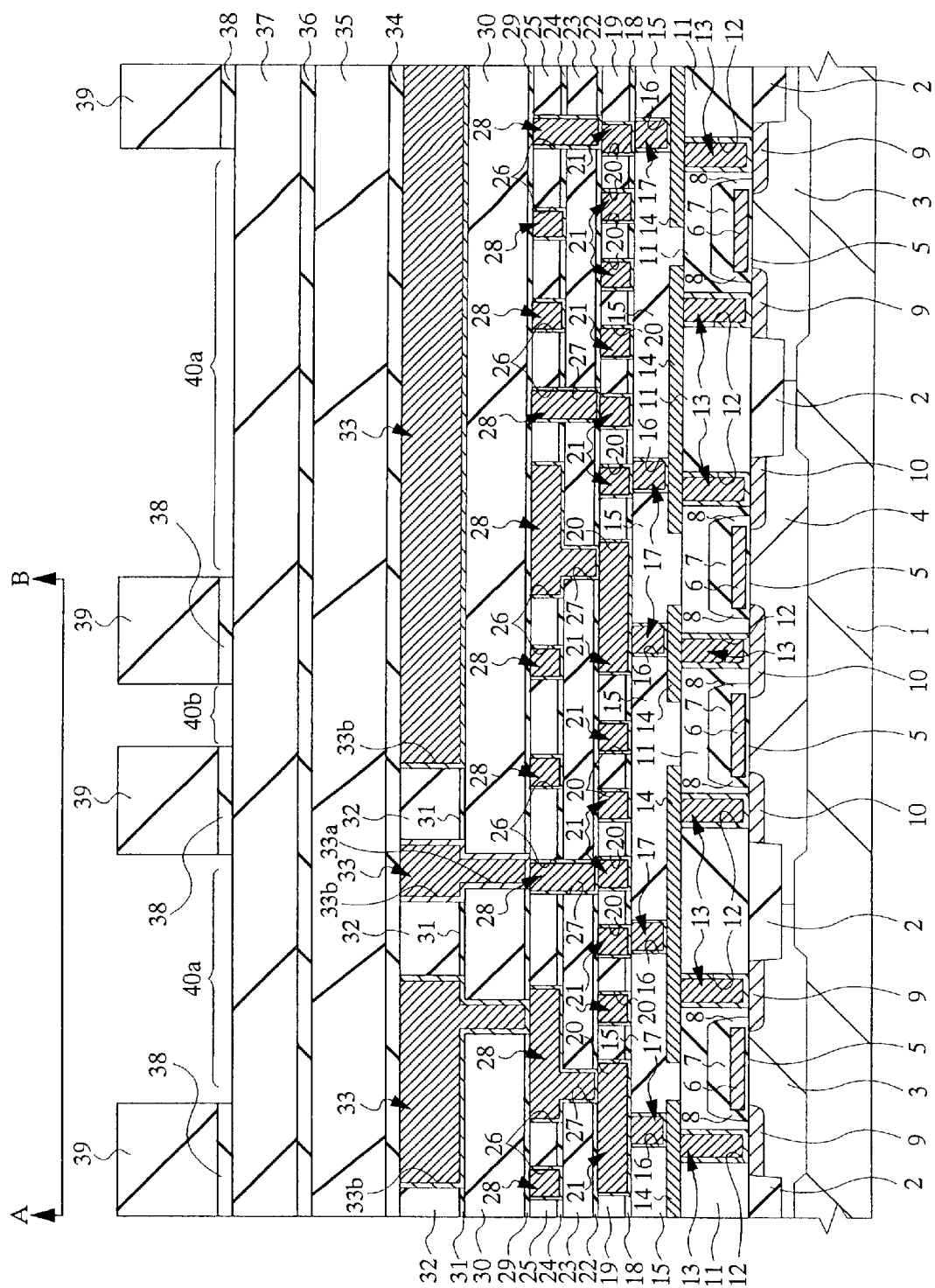
FIG. 9 is a schematic cross sectional view of the semiconductor device of FIG. 1 showing still another subsequent step of Embodiment 1 of manufacturing method.

Thereafter, as shown in FIG. 9, a dry etching operation is carried out in the presence of the resist film 39 to transfer the wiring groove patterns 40a, 40b into the insulating film 38 (and the anti-reflection film if provided). The dry etching operation is conducted under conditions that allows the silicon nitride film to be etched. For example, a mixture gas of $CHF_3$, $O_2$ and Ar may be used as etching gas with respective flow rates of 20, 20 and 200 sccm under the pressure of 50 mTorr and RF (radio frequency) power may be applied at a rate of 1,200 W while keeping the substrate at temperature of 0° C. Under these conditions, however, the rate of etching the insulating film 38 that is made of silicon nitride will be substantially equal to the rate of etching the underlying insulating film 37 (silicon oxide film). Then, it is no longer possible to selectively etch the insulating film 38 relative to the insulating film 37. However, as pointed out above, the film thickness of the insulating film 38 is significantly smaller than that of the insulating film 27 and, therefore, the insulating film 37 will be etched only slightly from the viewpoint of its large film thickness if it is excessively etched during the operation of etching the insulating film 38. Thus, the etching process does not require any etching selectivity.

When an anti-reflection film is provided, it may be etched under the conditions of using a mixture gas of $CHF_3$, $O_2$ and Ar as etching gas with respective flow rates of 10, 90 and 950 sccm under the pressure of 750 mTorr and applying RF (radio frequency) power at a rate of 900 W while keeping the substrate at temperature of 40° C.

Figure 10:
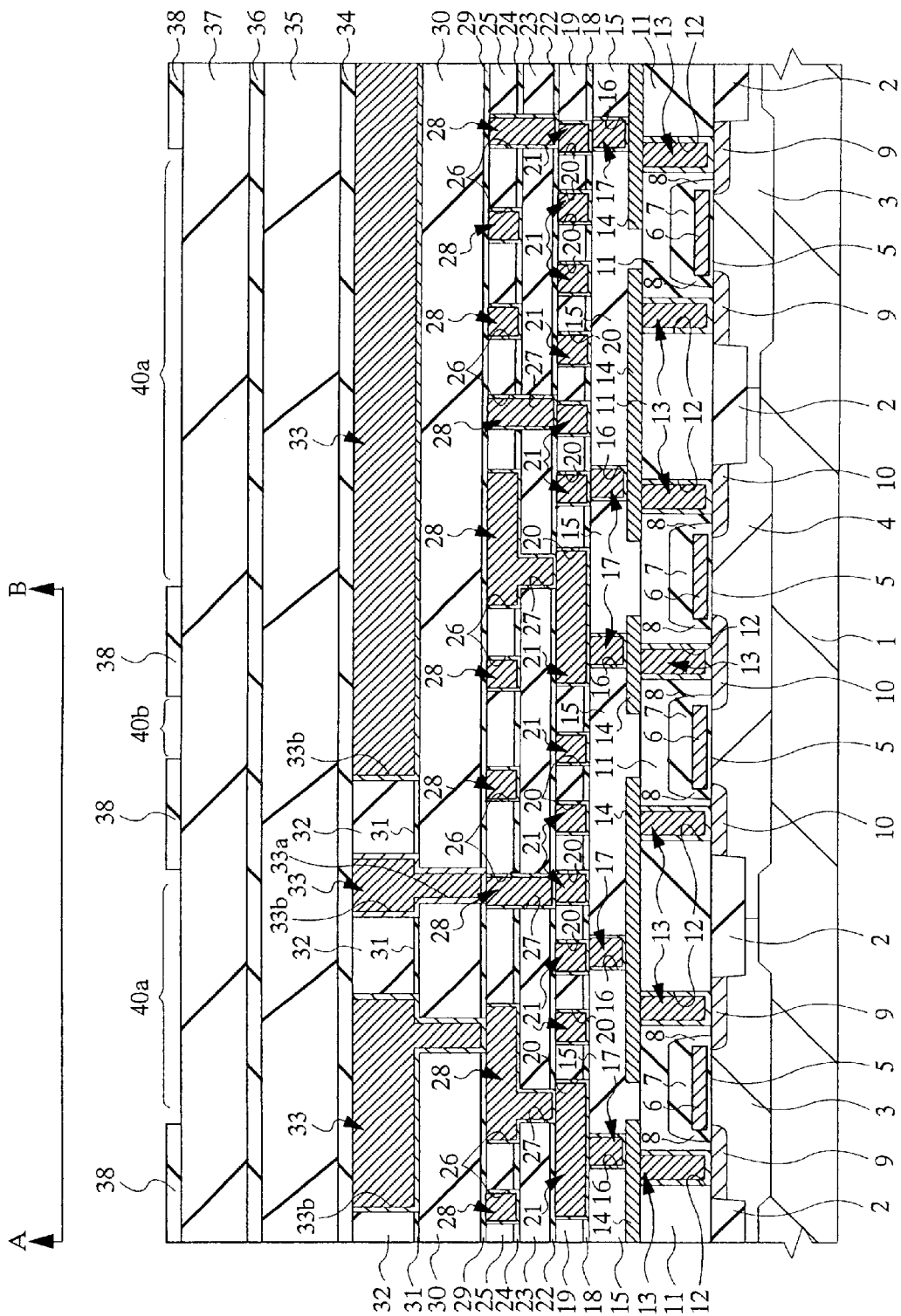
FIG. 10 is a schematic cross sectional view of the semiconductor device of FIG. 1 showing still another subsequent step of Embodiment 1 of manufacturing method.

Then, as shown in FIG. 10, the resist film 39 is removed. As a result, a wiring groove pattern layer is formed with the wiring groove patterns 40a, 40b transferred into it. The wiring groove pattern layer is formed from the insulating film 38 that is a silicon nitride film.

Figure 11:
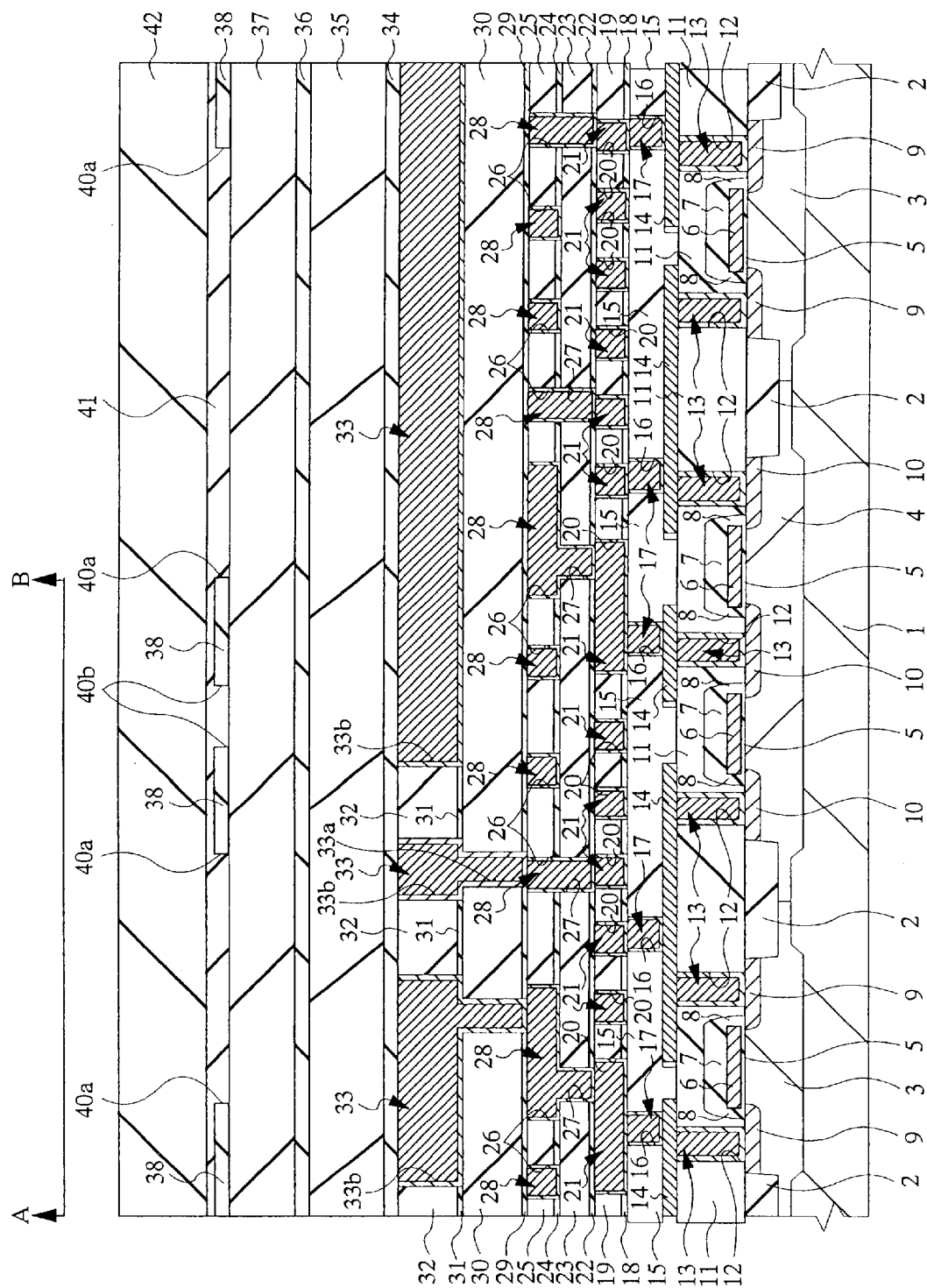
FIG. 11 is a schematic cross sectional view of the semiconductor device of FIG. 1 showing still another subsequent step of Embodiment 1 of manufacturing method.

Thereafter, as shown in FIG. 11, an anti-reflection film 41 is formed to cover the insulating film 38 that is now the wiring groove pattern layer and then a resist film 42 is formed. The anti-reflection film 41 may typically be made of a novolac resin type organic material. Since the insulating film 38 is made very thin in this embodiment as pointed out above, the surface of the anti-reflection film 41 can be flattened after filling the groove patterns 40 (steps formed on the insulating film 38) by simply applying the material of the anti-reflection film 41, using an ordinary application method. Thus, the anti-reflection film 41 is made to become a flattened film. As a result of the provision of the flat anti-reflection film, the resist film 42 can be formed very flat to prevent any scattered light and misalignment of focal points that may occur if the steps on the insulating film are not hidden and improve the accuracy of patterning the resist film 42.

Figure 12:
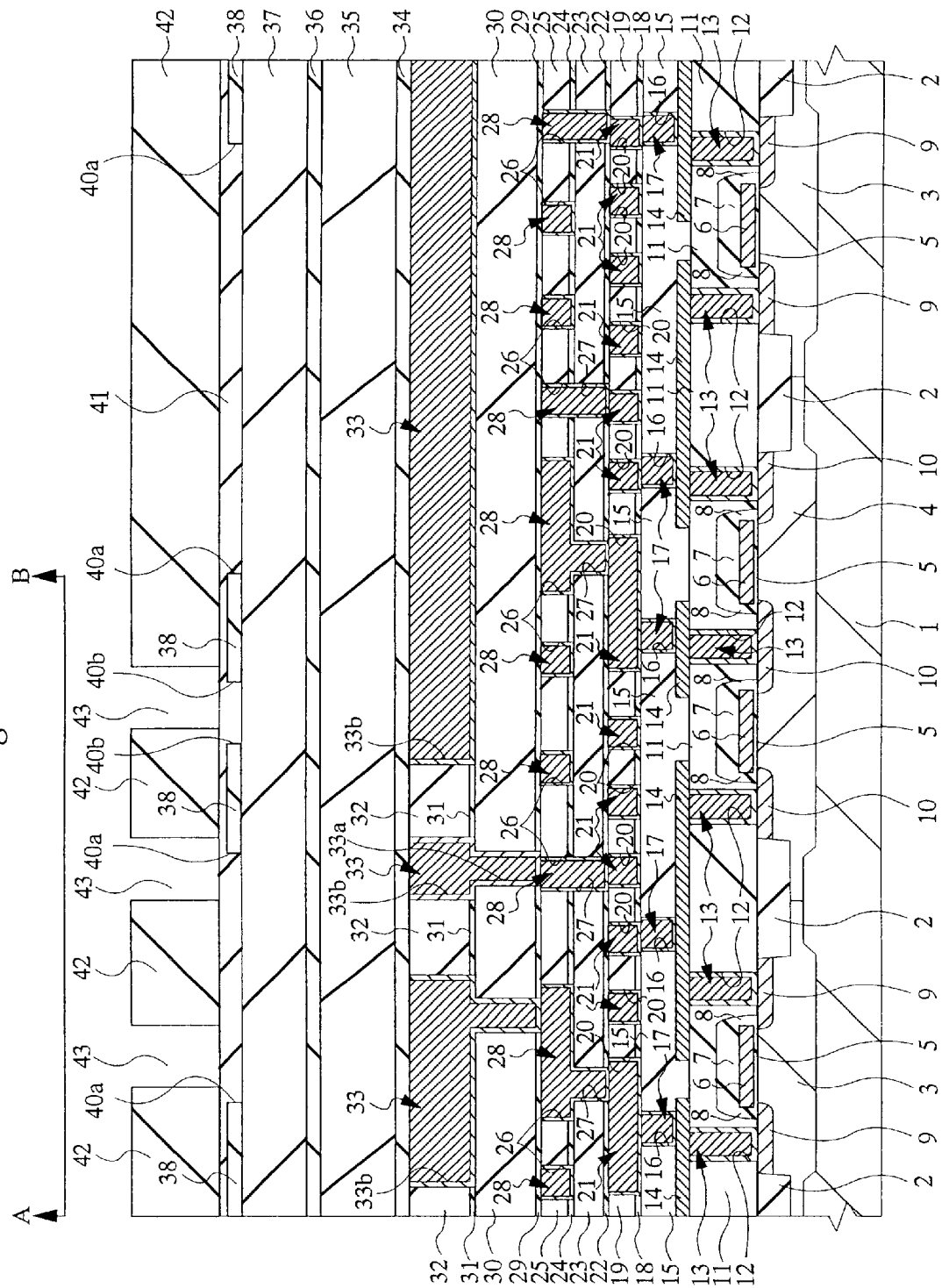
FIG. 12 is a schematic cross sectional view of the semiconductor device of FIG. 1 showing still another subsequent step of Embodiment 1 of manufacturing method.
Figure 13B:
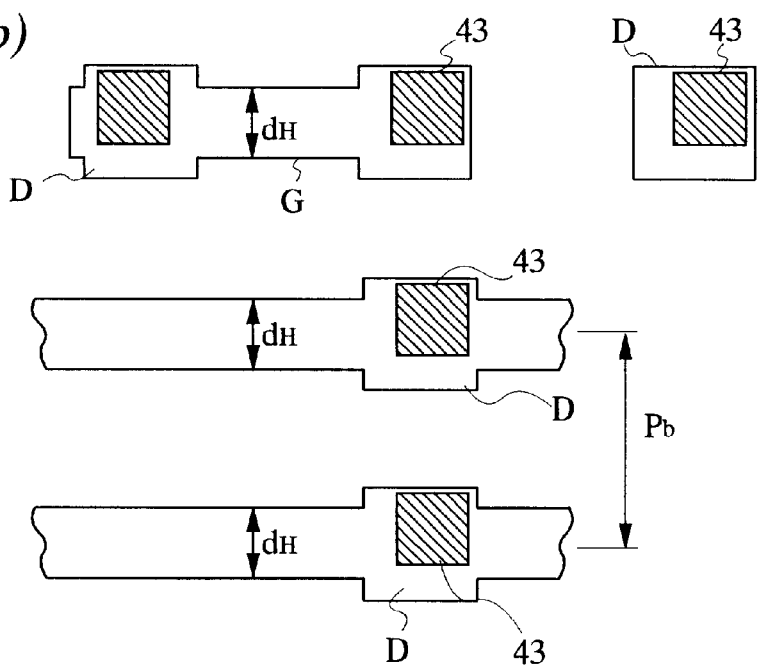
FIG. 13(b) is a schematic plan view of dog bones illustrated for the purpose of comparison.

Then, as shown in FIG. 12, a hole pattern 43 is formed in the resist film 42 by means of an ordinary photolithography technique of irradiating the resist film with beams of light arranged to correspond to the hole pattern and developing the produced latent image of the hole pattern. In this embodiment, the openings of the hole pattern 43 have a diameter of dH that is same as the width dH of the groove openings of the groove patterns 40a, 40b as show in FIG. 13(a). Therefore, if the groove patterns 40a, 40b and the hole pattern 43 of the masks are not properly aligned, some of the openings 43 will come out of the corresponding groove openings 40a, 40b as shown in FIG. 13(a). Since it is generally highly difficult to accurately align groove patterns 40a, 40b and a hole pattern 43, the groove patterns 40a, 40b and hole pattern 43 of this embodiment are assumed to be displaced from each other from the very beginning. More specifically, each of the openings of the hole pattern 43 of this embodiment is formed, if partly, outside the area where an opening of the groove patterns 40a, 40b is formed and hence the insulating film 38 exists. This is a major difference between the pattern of FIG. 13(a) and that of FIG. 13(b) where dog bone sections D are formed in the openings for wiring grooves G. In the case of FIG. 13(b), wires have to be arranged at a pitch Pb greater than the pitch Pa of arrangement of wires of FIG. 13(a) to consequently reduce the wiring density. Additionally, because of the provision of the dog bone sections D for accommodating the relative displacement of the photomask for contact holes and the photomask for wiring grooves, no insulating film 38 (of silicon nitride) is formed under the openings 43. As a result, the arrangement of FIG. 13(b) requires the use of etching conditions for forming contact holes that are different from those of this embodiment. Thus, the openings 43 for contact holes are transferred under the conditions provided for etching the silicon nitride film 38 in this embodiment while they are transferred under the conditions where the silicon nitride film 38 is not etched in the case of FIG. 13(b). Therefore, as described hereinafter by referring to FIGS. 17 and 22, interlayer connecting wires 50a, 50b are formed in the contact holes 45 showing a plan view same as the openings 43 of the hole pattern and wires 49a, 49b are formed in the wiring grooves 44a, 44b showing a plan view of the sum of the groove openings 40a, 40b and the hole openings 43.

Note that the line A–B in FIG. 13(a) corresponds to the line A–B in FIG. 12. As seen from the drawings, the width dL of the wire openings 40a and the vias 40b and the diameter dH of the openings 43 of the hole pattern are made equal to each other in this embodiment, the pitch of arrangement of the wire openings 40a and the vias 40b can be reduced to increase the density of wires and the degree of integration if compared with the arrangement of FIG. 13(b).

Figure 13C:
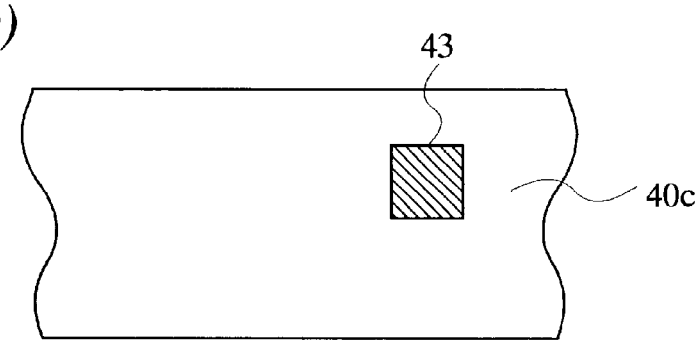
FIG. 13(c) is a schematic plan view of part of the semiconductor device of FIG. 1, illustrating another possible arrangement for making the wire pattern and the hole pattern overlap with each other in the case of Embodiment 1 of manufacturing method.

Additionally, as the hole pattern 43 is transferred under the conditions same as those where the insulating film 38 is etched, the contact holes 45 are made to show a plan same as that of the openings of the hole pattern 43 and hence a diameter equal to dH and the wires 49a, 49b are made to show a plan same as the sum of the plan of the openings 40a, 40b of the groove pattern and that of the openings 43 of the hole pattern. The net result is a reduced resistance of the wires 49a, 49b. Thus, wires can be arranged at a high density and the resistance of the wires 49a, 49b can be reduced in this embodiment. In the case of the vias 40b, the plan of the via wires 49a is made equal to the sum of the plan of the openings 40b of the groove pattern and that of the openings 43 of the hole pattern. In other words, each of the openings 43 of the hole pattern is made to show a plan obtained by laying a via wire 49b on a contact hole 45 so that consequently the resistance of the stacked vias 49b, or the via wires, can be reduced. Thus, the interlayer connecting wires 50a, 50b can be made to show a width Lw same as that of the wires 49a, 49b and a plan view same as that of the hole pattern 43. Additionally, as shown in FIG. 13(c), the wires 40c including the power supply wires for supplying the GND potential and Vcc (Vcc>GND potential) and the clock wires that are wider than the wires 49a, 49b do not require any dog bone sections and are made to show a simple and linear profile with a same width. Therefore, those wires can be processed with a high degree of precision. In short, groove patterns 40a, 40b and 40c as shown in FIGS. 13(a) and 13(b) are used for the embodiment.

Figure 14:
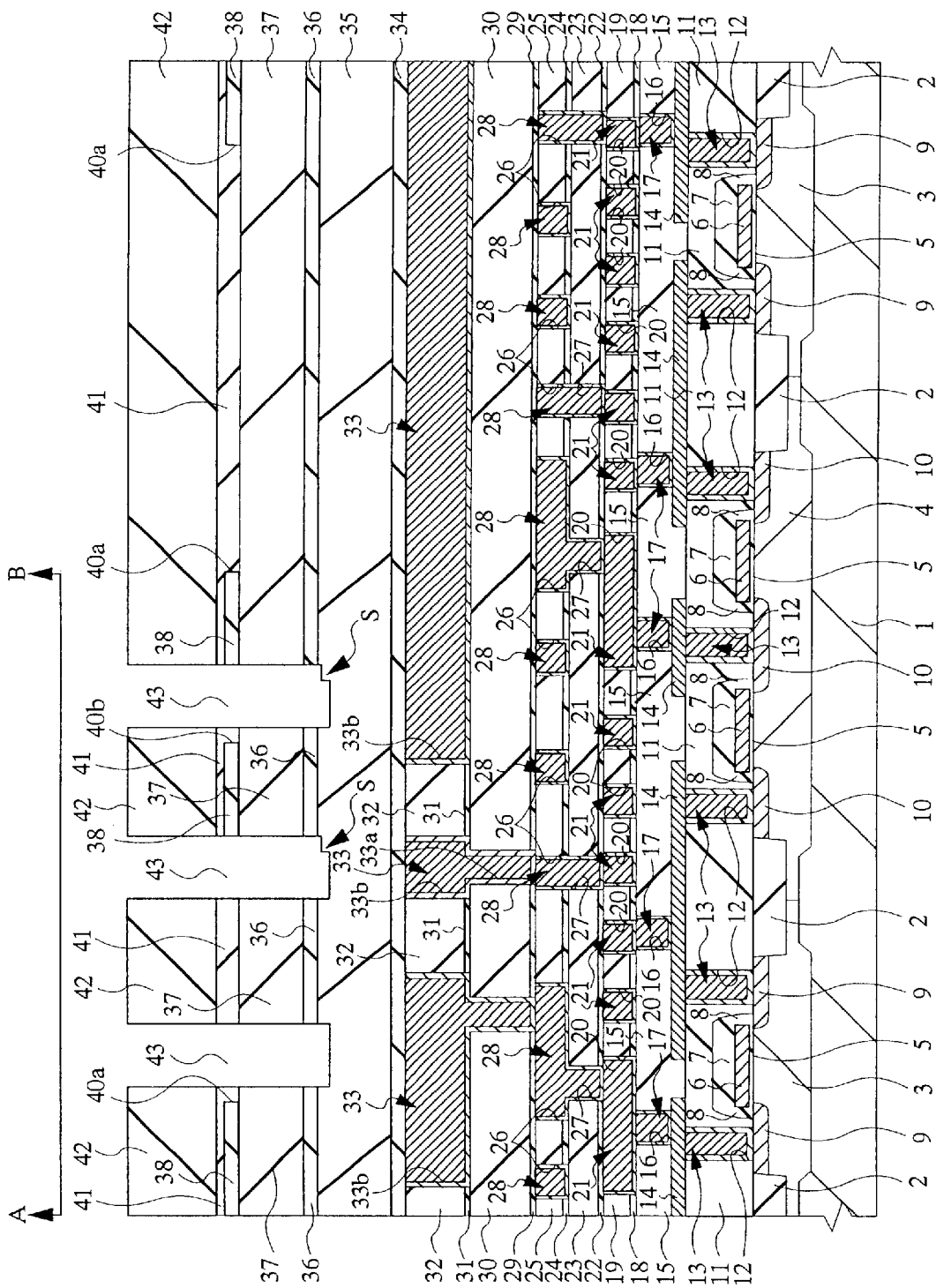
FIG. 14 is a schematic cross sectional view of the semiconductor device of FIG. 1 showing still another subsequent step of Embodiment 1 of manufacturing method.

Then, as shown in FIG. 14, an etching operation is conducted in the presence of the resist film 42 carrying the hole pattern 43 to transfer the hole pattern 43 into the anti-reflection film 41, the insulating films 37, 36 and part of the insulating film 38. The anti-reflection film 41 may be etched under the conditions of using a mixture gas of $CHF_3$, $O_2$ and Ar as etching gas with respective flow rates of 10, 90 and 950 sccm under the pressure of 750 mTorr and applying RF (radio frequency) power at a rate of 900 W while keeping the substrate at temperature of 40° C. Either of the two techniques as described below may be used for etching the insulating films 37, 36 and part of the insulating film 38.

With the first technique, the hole pattern 43 as shown in FIG. 14 is transferred in a single-step etching process. The etching operation will be conducted under conditions where the silicon nitride film and the silicon oxide film are etched at a same etching rate. For instance, the etching operation can be conducted under the conditions of using a mixture gas of $CHF_3$, $O_2$ and Ar as etching gas with respective flow rates of 50, 10 and 500 sccm under the pressure of 50 mTorr and applying RF (radio frequency) power at a rate of 3,200 W while keeping the substrate at temperature of −20° C. When such conditions are selected, the insulating film 38 that is a silicon nitride film, the insulating film 37 that is a silicon oxide film and the insulating film 36 that is a silicon nitride film will be etched at a same rate. The etching depth (the depth of the openings 43 of the hole pattern) can be controlled by controlling the duration of the etching process.

The second technique, on the other hand, is a three-step etching process including a first step of removing part of the insulating film 38 under conditions where silicon nitride film can be etched, a second step of etching the insulating film 37 under conditions where silicon oxide film can be selectively etched but silicon nitride film is hardly etched and a third step of etching the insulating film 36 under conditions good for etching silicon nitride film. The depth of etching using the hole pattern 43 can be easily controlled with such a three-step process. More specifically, since the second step is an selective etching operation, the insulating film 36 can be used as etching stopper for the etching operation of the second step. Then, the depth of etching using the hole pattern 43 can be uniformed without the need of time control. The etching operations of the first and third steps may be conducted under the conditions of using a mixture gas of $C_4F_8$, $O_2$ and Ar as etching gas with respective flow rates of 12, 7 and 400 sccm under the pressure of 30 mTorr and applying RF (radio frequency) power at a rate of 3,400 W while keeping the substrate at temperature of 0° C., whereas the etching operation of the second step may be conducted under the conditions of using a mixture gas of $CHF_3$ and $O_2$ as etching gas with respective flow rates of 20 and 20 sccm under the pressure of 50 mTorr and applying RF (radio frequency) power at a rate of 1,200 W while keeping the substrate at temperature of 0° C.

With either of the above two techniques, holes are cut through the insulating film 38 on the basis of the hole pattern 43. In other words, if the hole pattern 43 and the groove patterns 40a, 40b are displaced from each other, the hole pattern 43 is aligned with the groove patterns 40a, 40b in a self-aligning manner so that the diameter of the openings of the holes can be held to the designed value of dH. Since the diameter dH of the openings of the holes is held to the designed value of dH regardless of the locations of the wiring grooves, the problem of a reduced diameter of contact holes of the known self-aligning method is eliminated by the present invention.

As pointed out above, with either of the above two techniques, holes are cut through the insulating film 38 on the basis of the hole pattern 43. In other words, the hole pattern 43 is transferred into the insulating film 36. This is for forming contact holes at the time of the etching operation of forming wiring grooves as described hereinafter. More specifically, when wiring grooves are formed by etching the insulating film 37, the insulating film 35 is also etched in areas corresponding to the openings of the hole pattern 43 to produce part of the contact holes simultaneously with the wiring grooves if holes are cut through the insulating film 38 on the basis of the hole pattern 43. This will be discussed in greater detail hereinafter.

It should be noted that, with the above first technique, the bottoms of the holes formed by the hole pattern 43 may produce steps S if the hole pattern 43 and the groove patterns 40a, 40b are misaligned. However, the etching depth is uniformed at the bottoms of the holes as the insulating film 34 operates as etching stopper and therefore no problem occurs there as described below.

Figure 15:
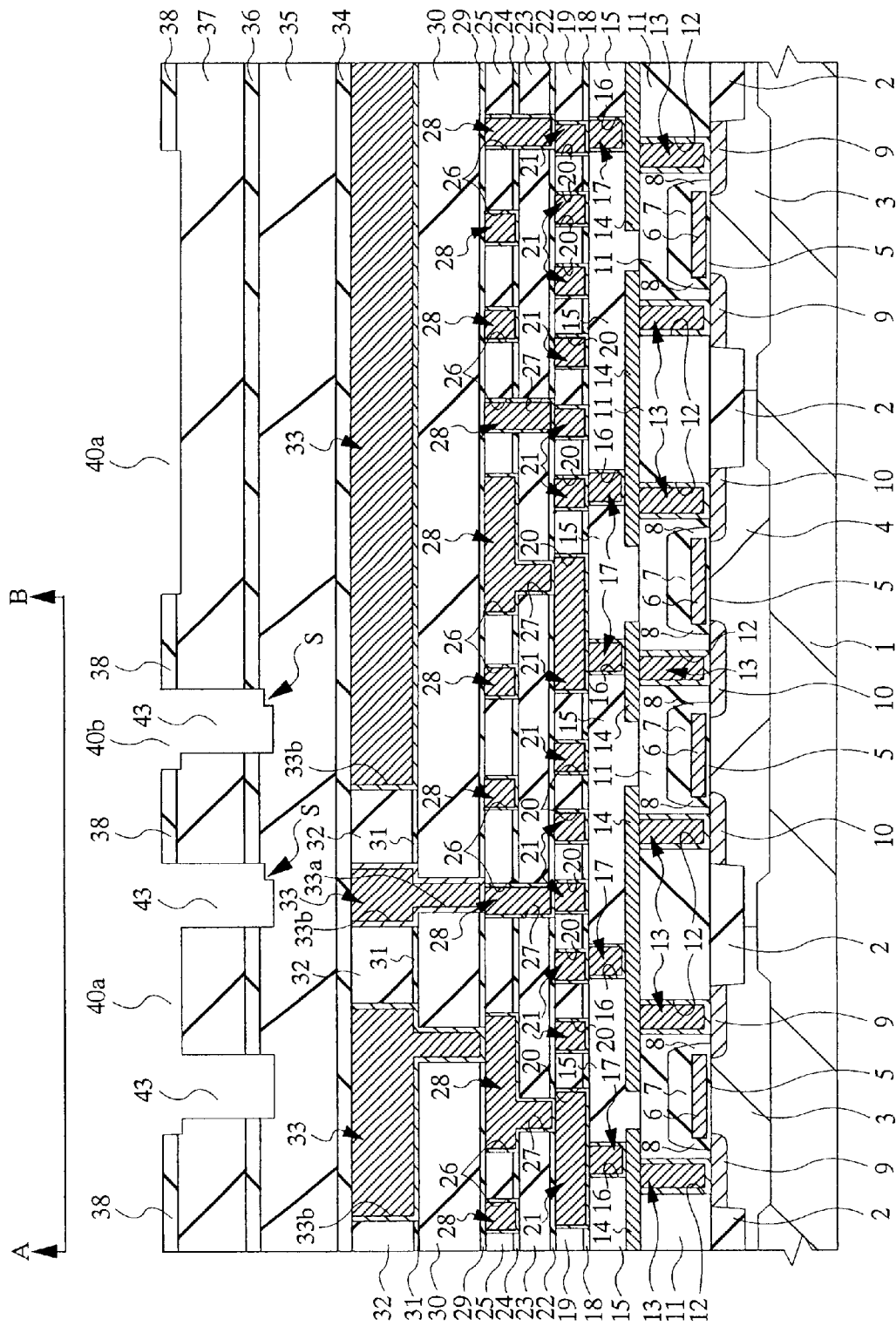
FIG. 15 is a schematic cross sectional view of the semiconductor device of FIG. 1 showing still another subsequent step of Embodiment 1 of manufacturing method.

Then, as shown in FIG. 15, the resist film 42 and the anti-reflection film 41 are removed typically by means of an ashing technique. At this stage of operation, the groove patterns 40a, 40b are transferred to the insulating film 38 (groove pattern layer) and the hole pattern 43 is transferred to the insulating films 36, 37 and part of the insulating film 38.

Figure 16:
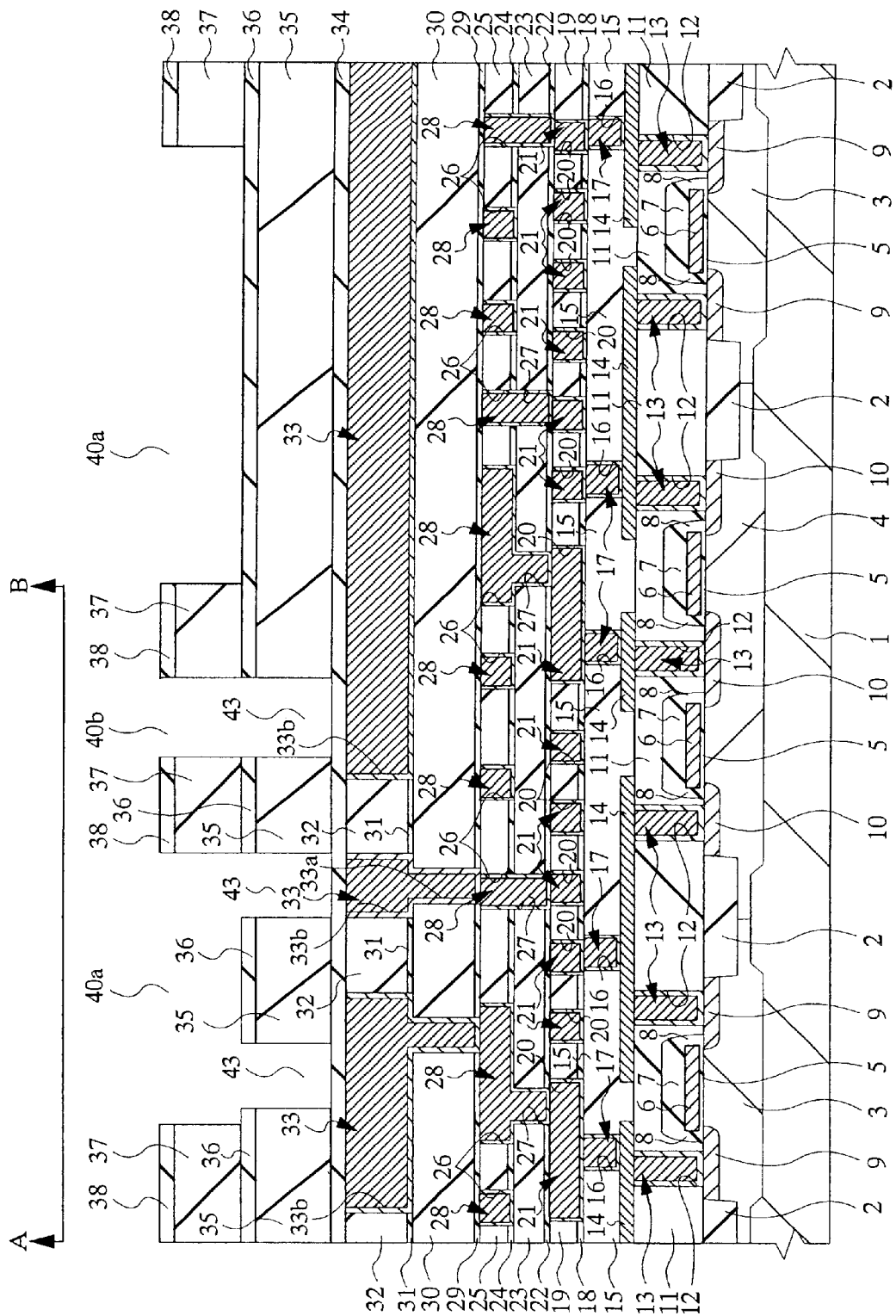
FIG. 16 is a schematic cross sectional view of the semiconductor device of FIG. 1 showing still another subsequent step of Embodiment 1 of manufacturing method.

Thereafter, as shown in FIG. 16, an etching operation is conducted in the presence of the groove patterns 40a, 40b and the hole pattern 43 to transfer the groove patterns 40a, 40b and the hole pattern 43 respectively to the insulating film 37 and the insulating film 35. As a result, part of the wiring grooves 44a, 44b and the contact holes 45 are formed. In other words, the areas other than the wiring grooves formed by using the groove patterns 40a, 40b and the holes formed by using the hole pattern 43 are filled with the insulating film 38 so that the latter operates as mask and the insulating film 37 is etched in areas other than the groove patterns 40a, 40b. The insulating film 35 is also etched because holes are already formed in the insulating films 37, 36 by the hole pattern 43. The etching operation proceeds simultaneously in the regions of the groove patterns and that of the hole pattern to produce part of the wiring grooves 44a, 44b and the contact holes 45 simultaneously. The contact holes 45 show a plan view same as those of the openings of the hole pattern 43 and hence a diameter equal to Lw, which is substantially equal to the width of the wiring grooves 44a, 44b. Then, as a result, the resistance of the wires 49a, 49b is reduced.

The etching operation is conducted conditions where silicon oxide film can be selectively etched but silicon nitride film is hardly etched. For example, the etching operation can be conducted under the conditions of using a mixture gas of $C_4F_8$, Ar, $O_2$ and CO as etching gas with respective flow rates of 20, 500, 9, and 100 sccm under the pressure of 30 mTorr and applying RF (radio frequency) power at a rate of 3,600 W while keeping the substrate at temperature of –20° C.

When such conditions are selected, silicon nitride film is hardly etched while silicon oxide film is easily etched so that the insulating film 36 operates as stopper for etching the grooves while the insulating film 34 operates as stopper for etching the holes. As a result, the grooves and the holes are made to show respective uniform depths if the film layers are etched excessively to a slight extent. Additionally, it is no longer necessary to control the depth of the grooves and that of the holes by controlling the duration of the etching process for the operation of forming them by etching. Still additionally, it is not necessary to terminate the operation of forming the grooves by etching at the bottoms thereof and that of forming the holes at the bottoms thereof simultaneously. In other words, the operation of forming the grooves may be terminated before forming the holes or vice versa. If the bottoms of the holes 43 shows steps S as described above, they are eliminated when the film layer accommodating the bottoms thereof are excessively etched to make the bottoms flat.

However, it is preferably that the film thickness of the insulating film 35 and that of the insulating film 37 are optimized so that the operation of forming the grooves by etching and that of forming the holes may be terminated simultaneously. If the operations are terminated simultaneously, the insulating films 34, 36 that are silicon nitride films showing a high dielectric constant and operating as stoppers may be made to have a reduced film thickness to consequently reduce the inter-wire capacitance of the device.

Figure 17:
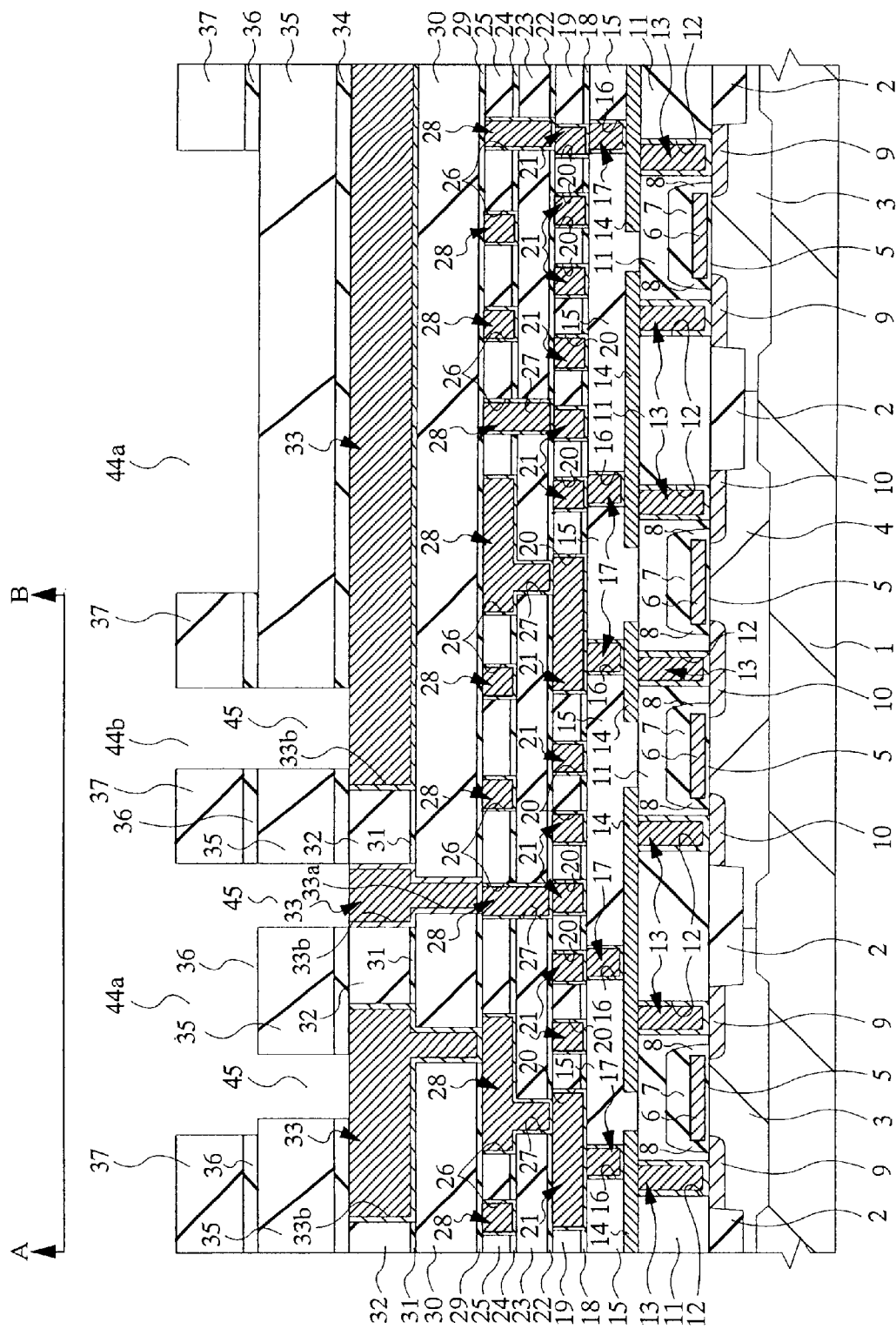
FIG. 17 is a schematic cross sectional view of the semiconductor device of FIG. 1 showing still another subsequent step of Embodiment 1 of manufacturing method.

Then, as shown in FIG. 17, an etching operation is conducted under conditions good for etching silicon nitride film to etch the insulating film 38, the insulating film 36 where the bottoms of the grooves 44a, 44b are located and the insulating film 34 where the bottoms of the holes 45 are found. As a result, the process of forming the wiring grooves 44a, 44b and the contact holes 45 is completed. For the etching operation, for example, a mixture gas of $CHF_3$, $O_2$ and Ar may be used as etching gas with respective flow rates of 20, 20 and 400 sccm or 600 sccm under the pressure of 50 mTorr and RF (radio frequency) power may be applied at a rate of 1,200 W while keeping the substrate at temperature of 0° C. While the silicon oxide films may be etched by this etching operation, no problems will arise if they are is etched excessively to a slight extent because the insulating films 38, 36, 34 have a film thickness significantly smaller than that of the insulating film 35. Additionally, while the insulating film 38 has a film thickness relatively greater than those of the insulating films 36, 34, its film thickness is reduced when it is used as mask for forming the grooves and the holes simultaneously by etching so that it can be removed easily during this etching operation.

Note that this etching operation is required to remove the insulating film 34 from the bottoms of the contact holes 45 and the insulating films 36, 38 do not need to be removed by this etching operation. In other words, this etching operation is conducted to complete the process of forming the contact holes 45 and the purpose of the operation is achieved when the contact holes 45 are completely formed. However, since the insulating films 36, 38 are etched simultaneously with the insulating film 34 as pointed out above, the silicon nitride film showing a high dielectric constant and left on the bottoms of the wires will also be removed to reduce the inter-wire capacitance of the device when the insulating film 36 is etched out. Additionally, the inter-wire capacitance of the device will also be reduced when the insulating film 38 is removed. Thus, the etching operation can provide such auxiliary effects.

Figure 18:
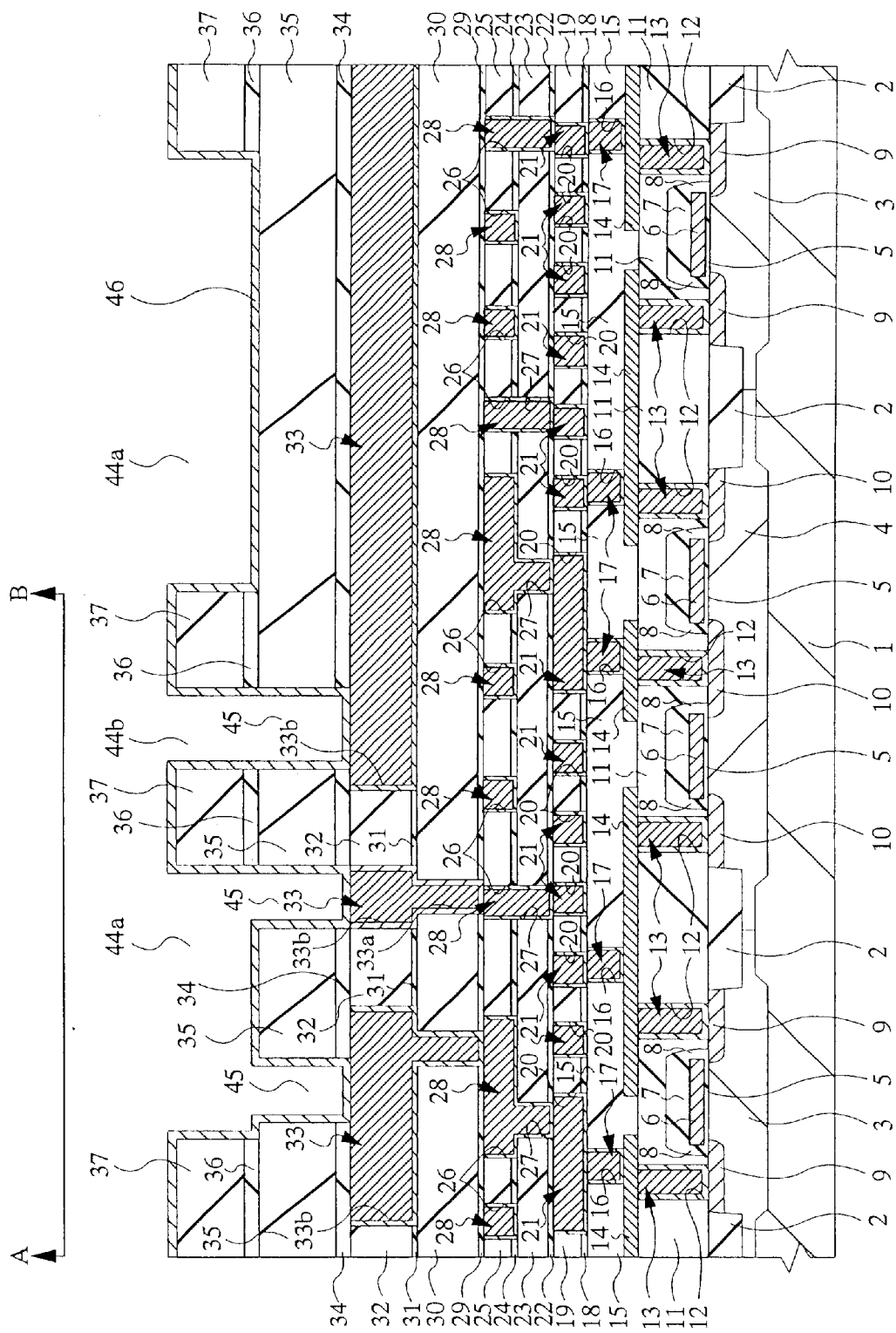
FIG. 18 is a schematic cross sectional view of the semiconductor device of FIG. 1 showing still another subsequent step of Embodiment 1 of manufacturing method.

Thereafter, a barrier metal layer 46 is formed as shown in FIG. 18. The barrier metal layer 46 prevents any possible diffusion of copper that is the principal ingredient of the wires and the interlayer connecting wires and, at the same time, improves the mutual adhesion of copper wires and the silicon oxide films. The barrier metal layer 46 may typically be made of tantalum (Ta). When the barrier metal layer 46 is made of tantalum film, the film thickness is preferably about 100 nm when laid on the insulating film 37 (flat above the substrate). Tantalum nitride (TaN) or titanium nitride (TiN) may alternatively be used for the barrier metal layer 46. Any of such metal compounds may be used for the barrier metal layer 46 so long as it can effectively prevent the possible diffusion of copper. The barrier metal layer 46 may be formed by using a long throw sputtering technique with which the target and the substrate are separated by about 200 nm. With such a technique, the barrier metal layer 46 can be formed on the very small bottoms of the contact holes 45 with a relatively uniform film thickness. In place of the long throw sputtering method, a CVD method or an ordinary sputtering method may alternatively be used for the purpose of the present invention.

Figure 19:
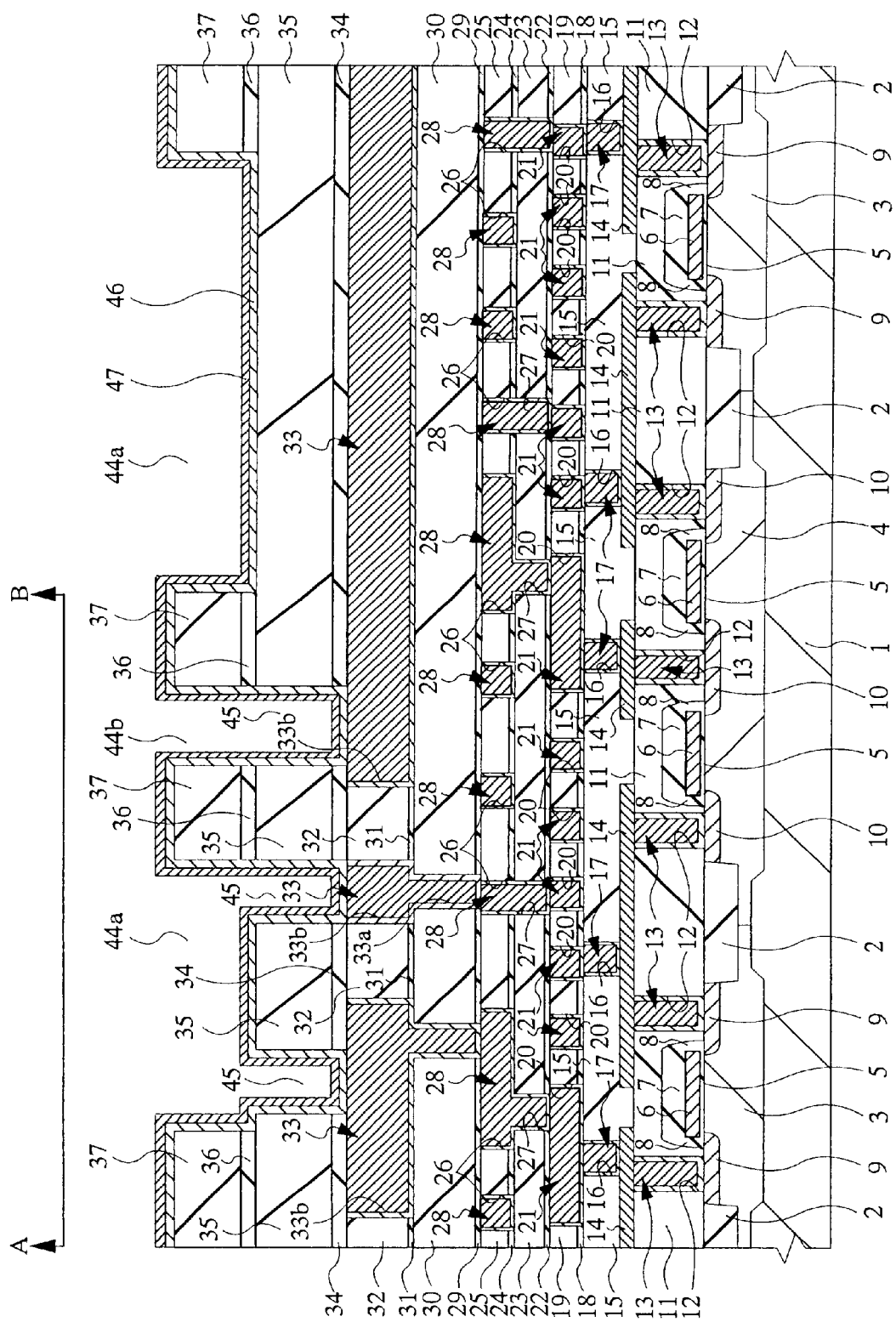
FIG. 19 is a schematic cross sectional view of the semiconductor devise of FIG. 1 showing still another subsequent step of Embodiment 1 of manufacturing method.

Then, as shown in FIG. 19, a seed layer 47 is formed on the barrier metal layer 46. The seed layer 47 is made of copper and operates as seed for forming a plated copper layer which will be described hereinafter. While a long throw sputtering method may also be used for forming the seed layer 47, a CVD method or an ordinary sputtering method may alternatively be used. The seed layer 47 is made to have a thickness of about 100 nm when laid flat above the substrate.

Figure 20:
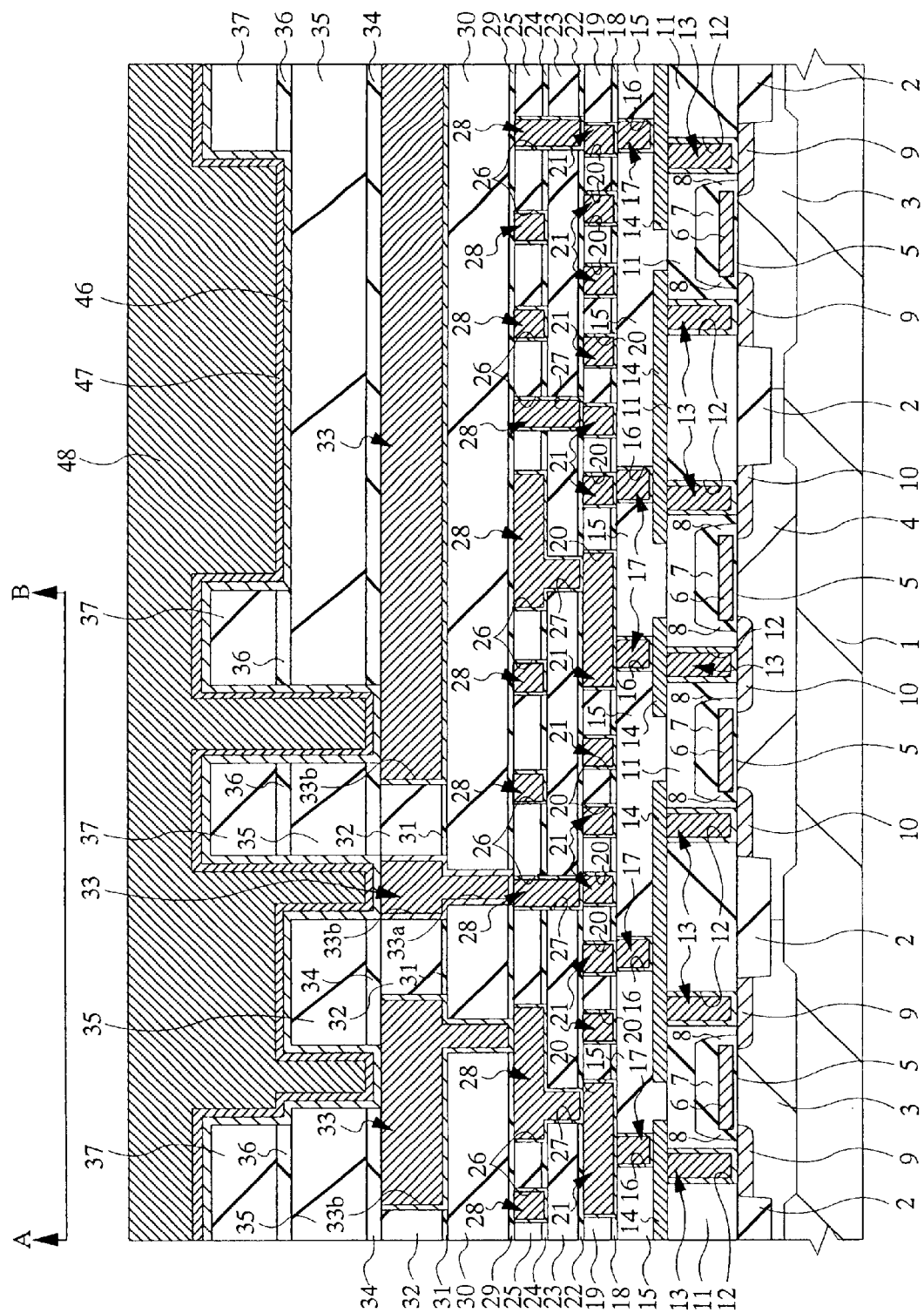
FIG. 20 is a schematic cross sectional view of the semiconductor device of FIG. 1 showing still another subsequent step of Embodiment 1 of manufacturing method.

Thereafter, as shown in FIG. 20, a copper plating layer 48 is formed. The copper layer 48 may be formed either by electrolytic plating or by non-electrolytic plating. The copper plating layer 48 is made to have a thickness of about 300 nm when laid flat above the substrate. As a result, both the wiring grooves 44a, 44b and the contact holes 45 are filled.

While the copper film (copper plating layer 48) is formed by means of a plating technique in this embodiment, it may alternatively be formed by sputtering. Then, the seed layer 47 is not necessary. When the copper film is formed by sputtering, the copper of the film can be made to reflow and fill the contact holes and the wiring grooves 44a, 44b by heat treatment.

Then, as shown in FIG. 21, the copper plating layer 48 and the seed layer 47 are polished by CMP. Since a copper film can be polished and scraped off at a high rate, the copper will be removed first by the polishing operation.

As the polishing operation is continued, the barrier metal layer 46 (tantalum film) on the insulating film 37 is removed as shown in FIG. 22. As a result, the barrier metal layer 46 and the copper film (including the copper plating layer 48 and the seed layer 47) are removed except the inside of the wiring grooves 44.

For the polishing operation using a CMP technique, polishing slurry containing an oxidizing agent such as hydrogen peroxide and alumina grains may be used. The copper film and the barrier metal layer (tantalum film) may be polished and scraped off collectively by means of a single and same platen. The time required for the polishing operation is 3 minutes including 2.5 minutes for completely removing the barrier metal layer 46 (100% polishing) and 0.5 minutes for excessive polishing. After the polishing operation using a CMP technique, the slurry grains and the copper adhering to the surface of the wafer can be removed by a two-stage brush scrubbing process of washing the device with an aqueous solution containing ammonium to a concentration of 0.1% and subsequently with pure water.

Now, the process of forming the interlayer connecting wires 50a, 50b for connecting the wires 49a, 49b of the fifth wiring layer and the wires 33 of the fourth wiring layer is completed. It may be clear from the above description that the wires 49a, 49b are formed integrally with the interlayer connecting wires 50a, 50b. Thus, the width Lw of the interlayer connecting wires 50a, 50b can be made substantially equal to the width Lw of wires 49a, 49b. The plan view of the interlayer connecting wires 50a, 50b is defined by the hole pattern 43 and the plan view of the wires 49a, 49b is defined as a sum of the groove patterns 40a, 40b and the hole pattern 43.

Thereafter, additional wiring layers including the sixth wiring layer may be formed in a manner as described above but they will not be described any further. As pointed out above, the wires 28 of the third wiring layer and the wires 38 of the fourth wiring layer can be formed by using the above described process for forming the wires 49a, 49b of the fifth wiring layer. It may be appreciated that the wires of the first wiring layer and those of the second wiring layer can also be formed by using the process for forming the wires 49a, 49b of the fifth wiring layer.

Thus, this embodiment can be provided with highly reliable micro-wires and a low inter-wire capacitance in addition to the advantages described above in terms of the manufacturing steps. More specifically, the contact holes can be formed with a diameter equal to that of the openings of the hole pattern as in the case of the hole-first method to make the interlayer connecting wires show a designed cross section. On the other hand, unlike the hole-first method, it is not necessary to fill the deep holes with resist or an anti-reflection material. As a result, the problem of reduced reliability due to the resist of the anti-reflection material left in the holes is completely eliminated. On the other hand, since the insulating film 36 operating as intermediary stopper of the above described embodiment can be made to show a reduced film thickness, the embodiment is free from the problem of increased inter-wire capacitance of the self-aligning method. Additionally, the pitch of arrangement of the wires 49a, 49b can be reduced to raise the wire density and the degree of integration of the device by forming the openings of the hole pattern 43 with a diameter of H that is equal to the width dL of the openings dL of the groove patterns 40a, 40b. Still additionally, the interlayer connecting wires 50a, 50b can be made to show a plan view conforming to that of the hole pattern 43 to reduce the resistance of the wires 49a, 49b by forming the hole pattern 43 after forming the groove patterns 40a, 40b and transferring the hole pattern 43 onto the groove pattern 40a, 40b that is by etching the silicon nitride film 38 according to the plan of the hole pattern 43. In short, the pitch of arrangement of the wires can be reduced to raise the wire density and the degree of integration of the device and the resistance of the wires 49a, 49b can be reduced in the above described embodiment.

Figure 25:
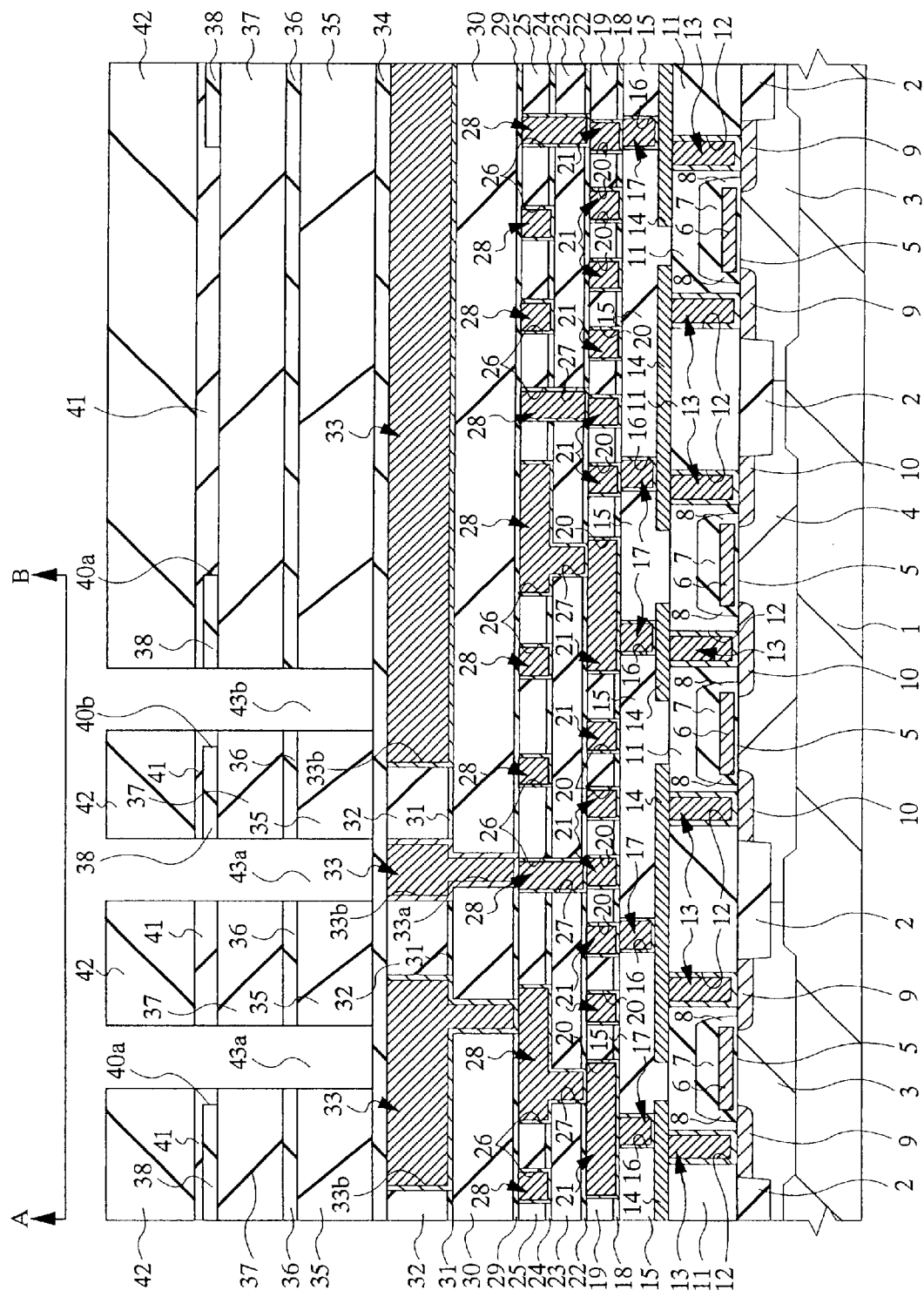
FIG. 25 a schematic cross sectional view of another semiconductor device showing a step of Embodiment 1 of manufacturing method.
Figure 26:
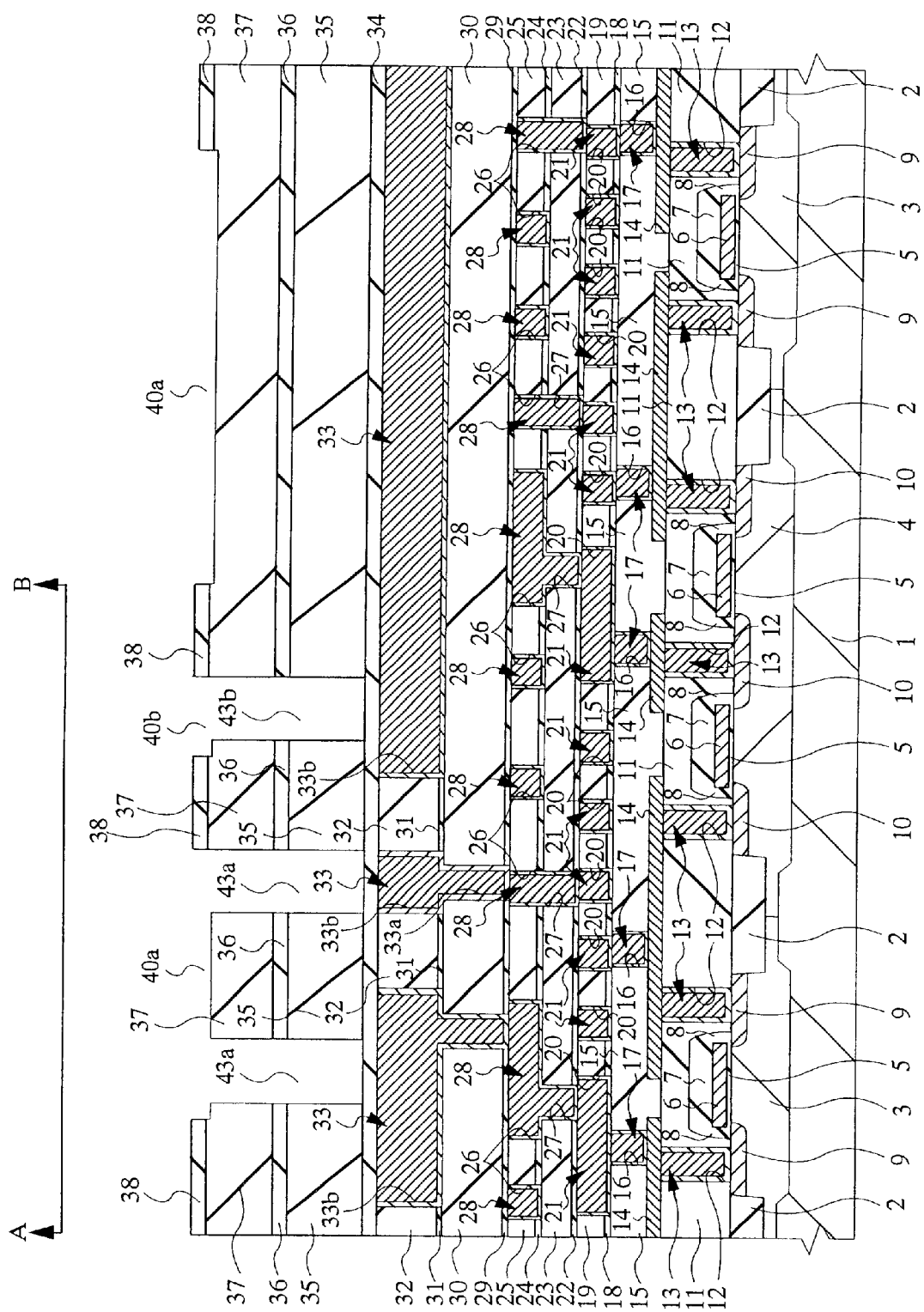
FIG. 26 is a schematic cross sectional view of still another semiconductor device showing a step of Embodiment 1 of manufacturing method.

While the process of forming contact holes by using the hole pattern 43 of this embodiment is terminated halfway before getting to the bottom of the insulating film 35 as shown in FIG. 14, it may alternatively be made to proceed until the contact holes get to the surface of the insulating film 34. In such a case, as shown in FIG. 25, the insulating film 34 (silicon nitride film) can be used as mask when removing the resist film 42 and the anti-reflection film 41 as in the case of FIG. 15 (FIG. 26). If the operation of transferring the groove patterns 40a, 40b as shown in FIG. 16 is conducted under the condition of FIG. 26 in order to transfer them into the insulating film 37, the insulating film 34 will operate as etching stopper.

Figure 27:
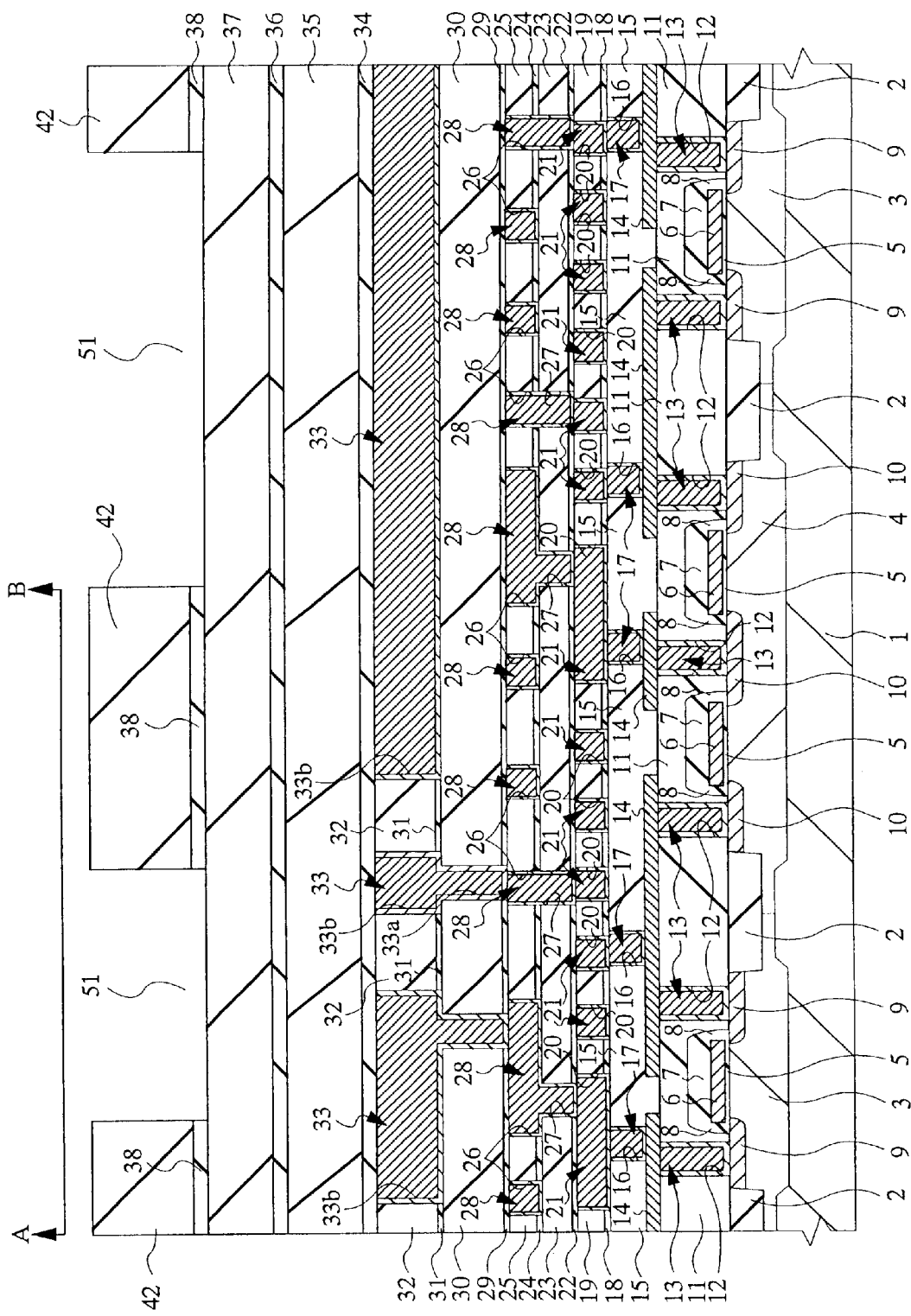
FIG. 27 a schematic cross sectional view of still another semiconductor device showing a step of Embodiment 1 of manufacturing method.
Figure 28:
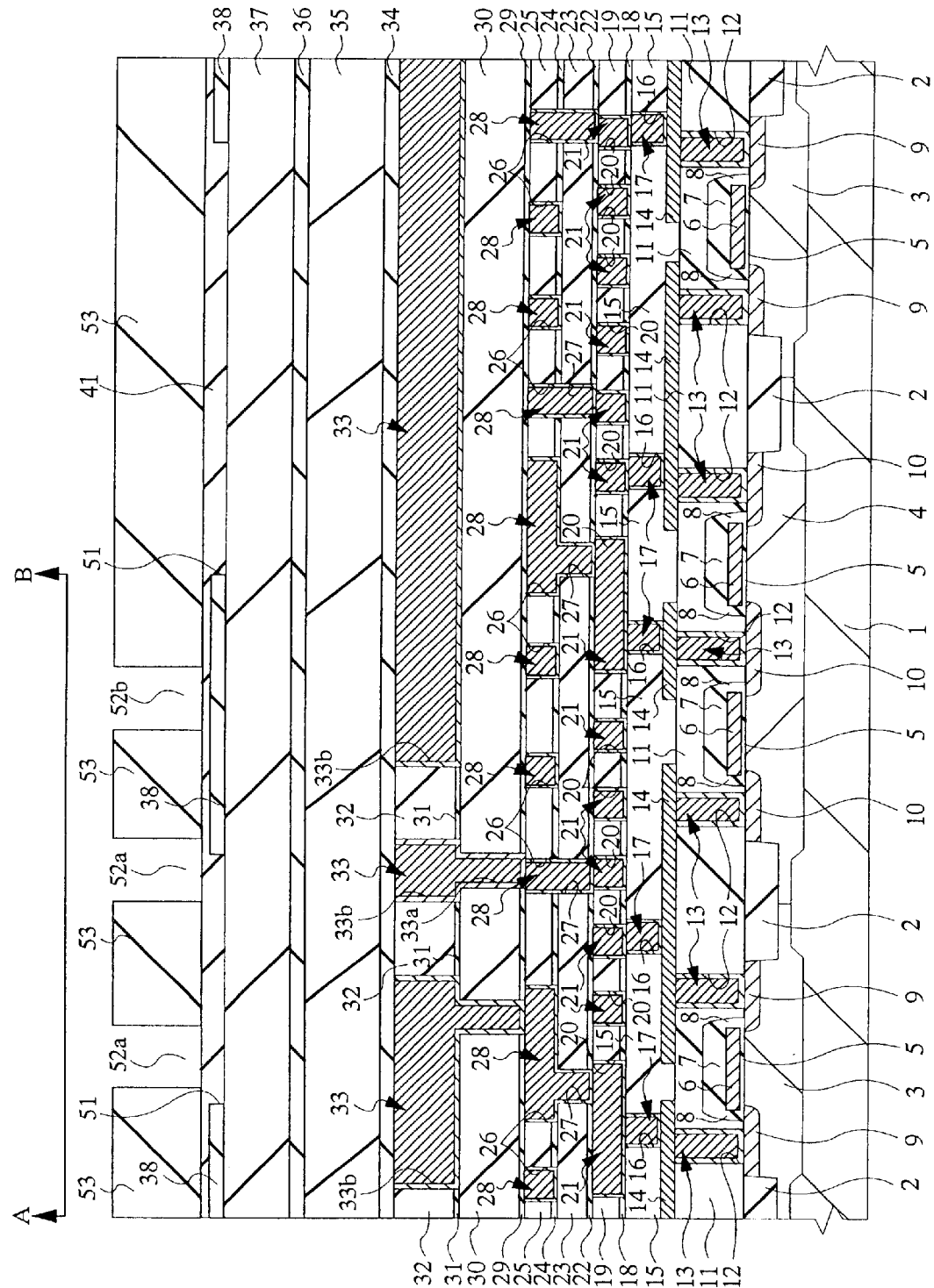
FIG. 28 is a schematic cross sectional view of still another semiconductor device showing a step of Embodiment 1 of manufacturing method.
Figure 29:
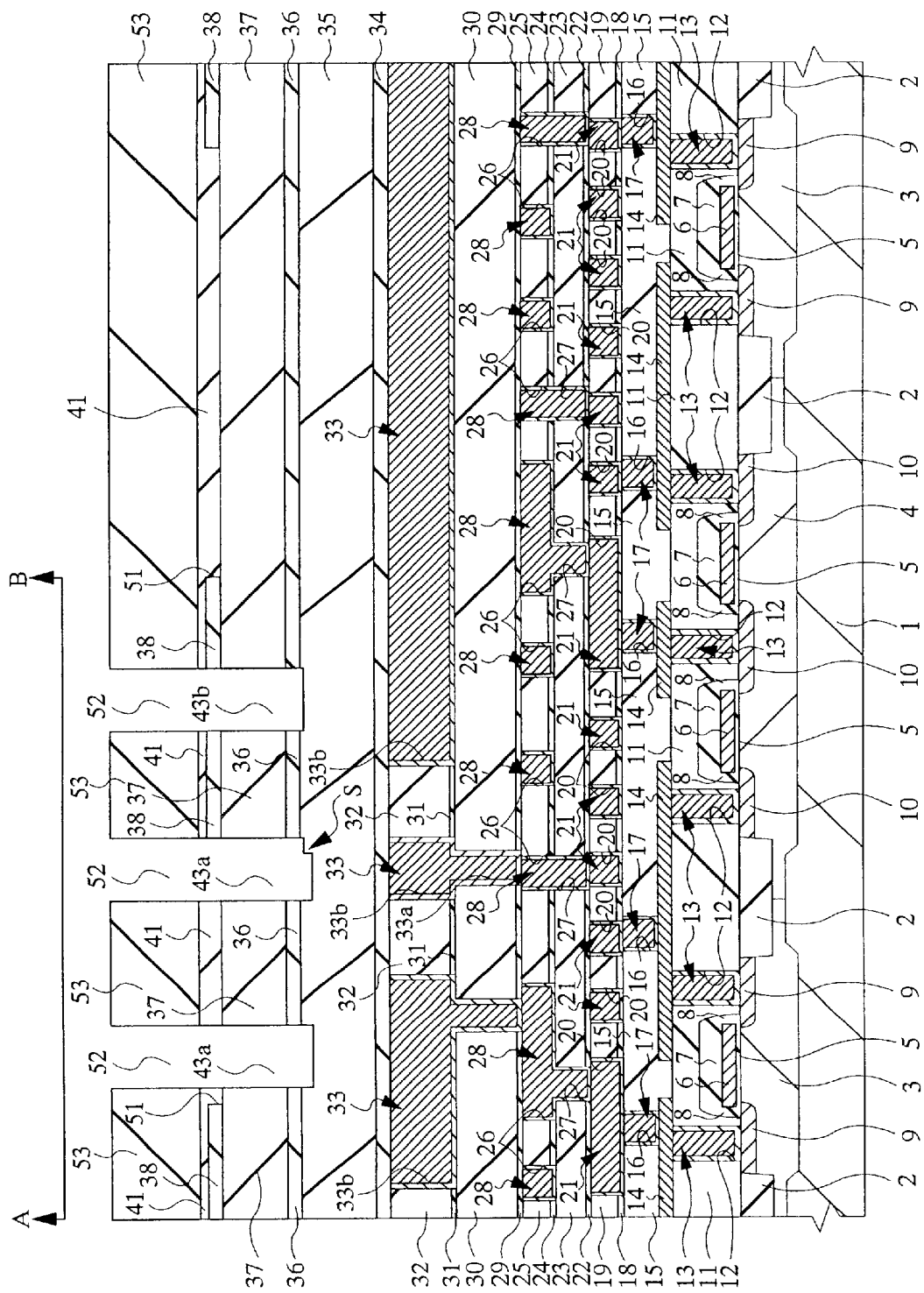
FIG. 29 is a schematic cross sectional view of still another semiconductor device showing a step of Embodiment 1 of manufacturing method.

Of the wires, the stacked vias 49b connecting the upper and lower wires may be formed without using a groove pattern for forming wiring grooves. More specifically, as shown in FIG. 27, the wires for connecting the upper and lower wires are formed without a patterning operation and only the wiring pattern 51 of the wiring layer is formed. Then, as shown in FIG. 28, a resist film 53 provided with openings 52a, 52b are formed. Thereafter, the etching operation of FIG. 14 is conducted in the presence of the resist film 53. Since the insulating film 38 is etched under conditions where silicon nitride film is etched in this etching operation, the insulating film 38 may be formed under the openings 52b as shown in FIG. 29 without any problem. In such a case, any possible misalignment of the wiring groove pattern 40b to be used for connecting the upper and lower wires and the contact hole pattern 43 does not require particular consideration so that the process can be simplified and the resistance of the vias 49b can be held low.

Figure 23A:
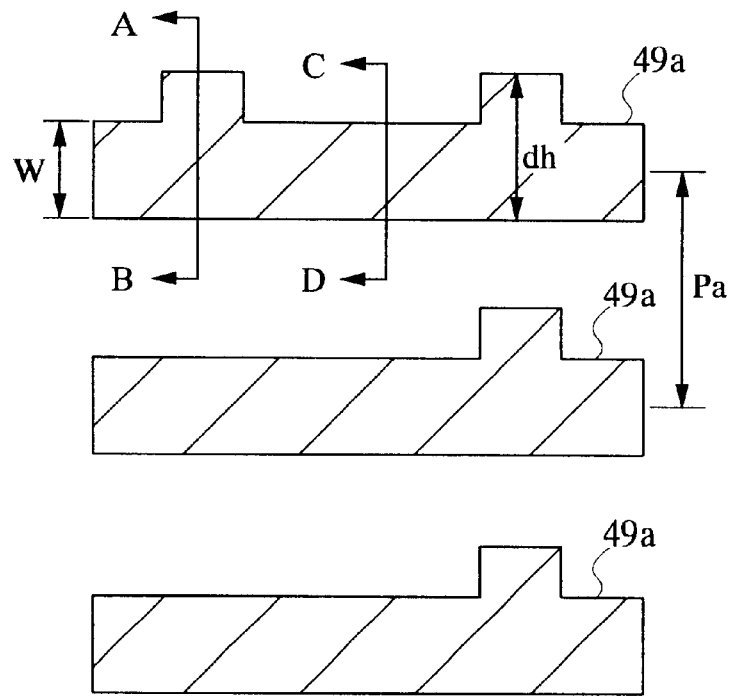
FIG. 23(a) is a schematic plan view of part of the wire pattern of the semiconductor device of FIG. 1.
Figure 23B:
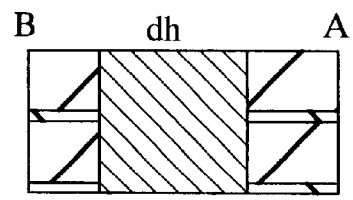
FIG. 23(b) is a schematic cross sectional view of the wire pattern of FIG. 23(a) and FIG. 23(c) is a schematic cross sectional view of the wire pattern of FIG. 23(a).
Figure 23C:
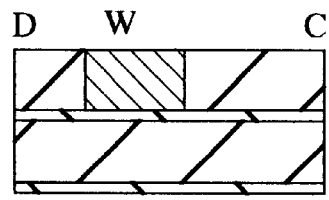

FIG. 23(a) shows a schematic plan view of part of the wire pattern of the wires 49a of this embodiment. FIG. 23(b) and FIG. 23(c) are schematic cross sectional views of the wire pattern of FIG. 23(a) taken along line A–B and line C–D of FIG. 23(a) respectively. As shown, as the pitch Pa of arranging the wires is reduced, the diameter dh of the contact holes 50a is made smaller than the diameter W to reduce the resistance of the contact holes. Thus, the degree of integration of the device can be raised while the resistance of the contact holes is reduced.

Figure 24A:
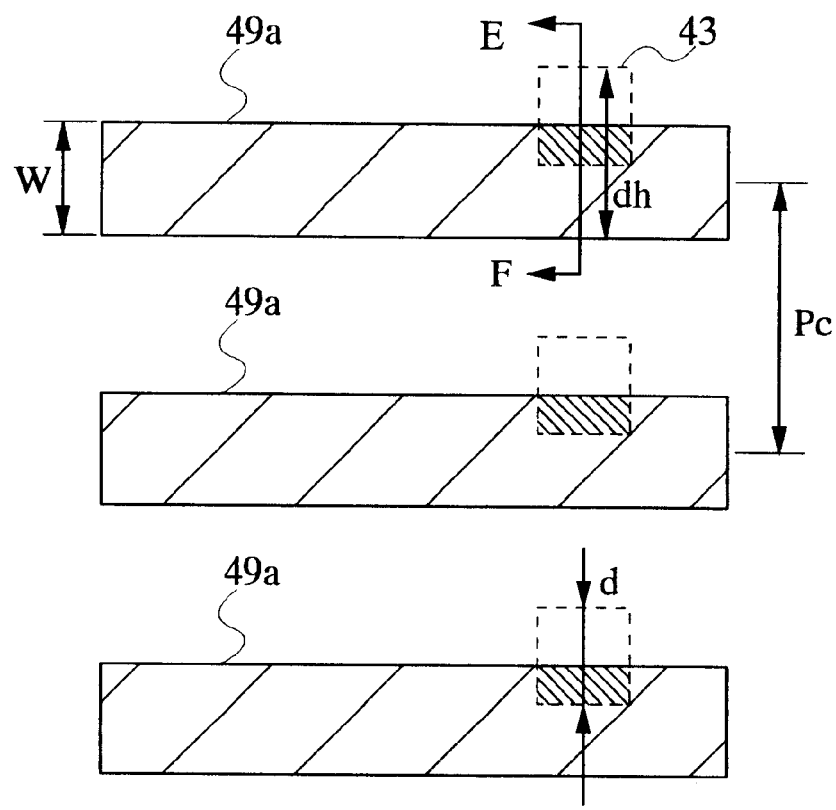
FIG. 24(a) is a schematic plan view of part of a wire pattern of a semiconductor device illustrated for the purpose of comparison, and FIG. 24(b) a schematic cross sectional view of the wire pattern of FIG. 24(a).
Figure 24B:
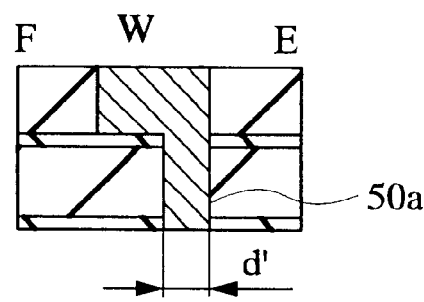

FIG. 24(a) is a schematic plan view of part of a wire pattern of a similar semiconductor device for forming wires 49a as illustrated for the purpose of comparison. Of this semiconductor device, the contact holes are formed by a self-aligning method (and hence the silicon nitride film 38 is not etched in the step of FIG. 14). FIG. 24(b) is a schematic cross sectional view of the wire pattern of FIG. 24(a). If the hole pattern 43 is not accurately aligned with the wires 49a, the contact holes are formed in areas where the hole pattern 43 and the wires 49a are laid one on the other. As a result, the diameter d' of the contact holes is made smaller than the diameter d of the openings of the hole pattern 43 (d'<d) to raise the resistance of the contact holes. If the diameter of the openings of the hole pattern 43 is reduced to avoid this problem, the pitch Pc of arranging the wires 49a should be increased to become greater than the pitch Pa of this embodiment (P-channel>Pa) in order to accommodate the misalignment of the patterns. Note, however, the use of a self-alignment method provides an advantage that the corresponding etching operation can be simplified and carried out in a single etching step.

(Embodiment 2)

Figure 30A:
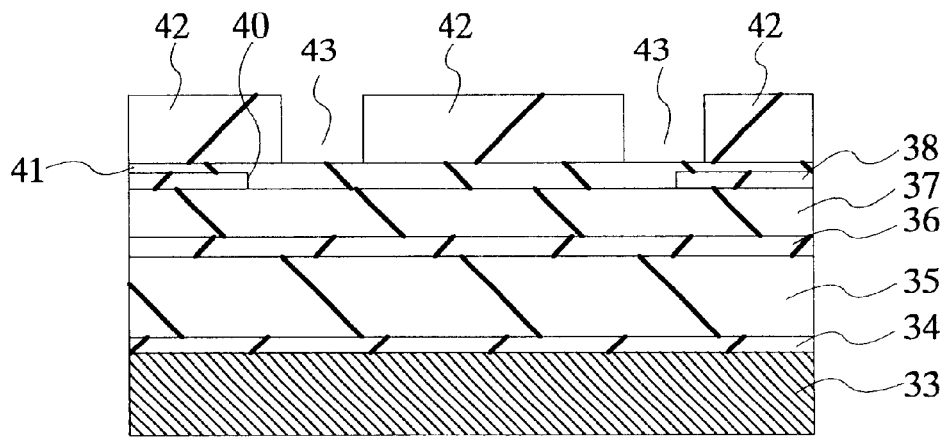
FIG. 30(a) is a schematic cross sectional views of a semiconductor device showing steps of another embodiment (Embodiment 2) of manufacturing method according to the invention.
Figure 30B:
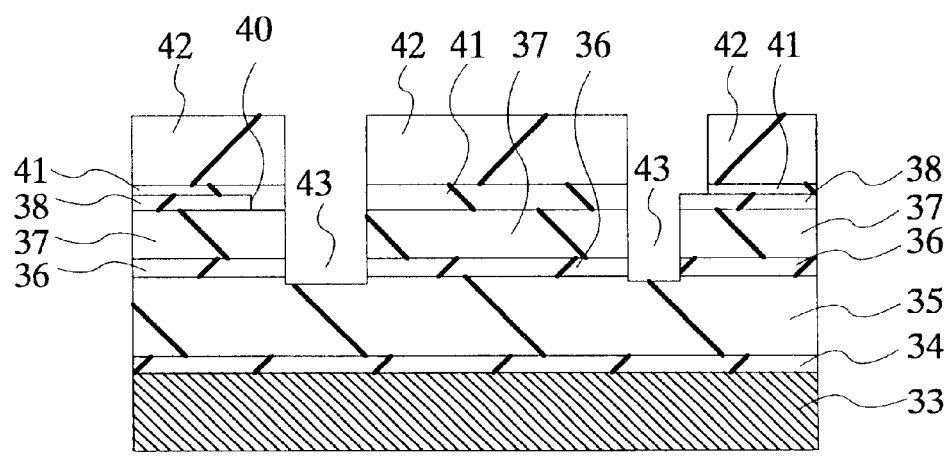
FIG. 30(b) is a schematic cross sectional views of a semiconductor device showing steps of another subsequent step of Embodiment 2 of manufacturing method according to the invention.
Figure 30C:
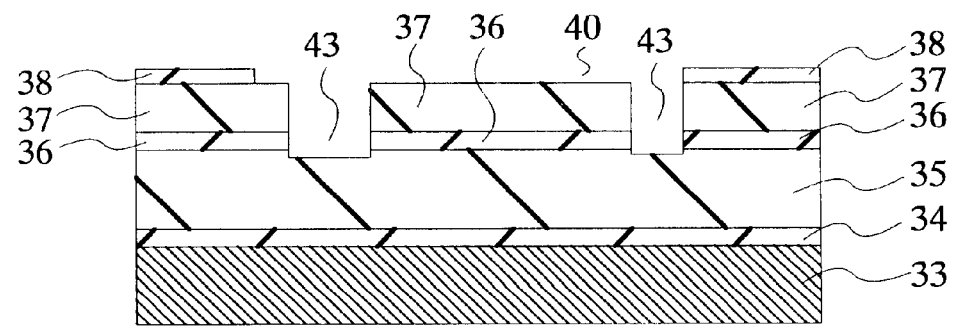
FIG. 30(c) is a schematic cross sectional views of a semiconductor device showing steps of another subsequent step of Embodiment 2 of manufacturing method according to the invention.
Figure 31D:
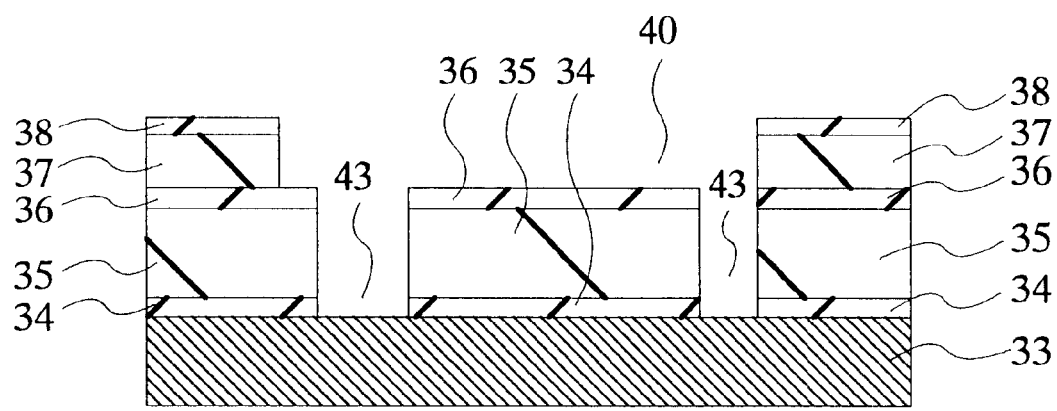
FIG. 31(d) is a schematic cross sectional views of the semiconductor device of FIGS. 30(a) through 30(c) showing subsequent steps of Embodiment 2 of manufacturing method.
Figure 31E:
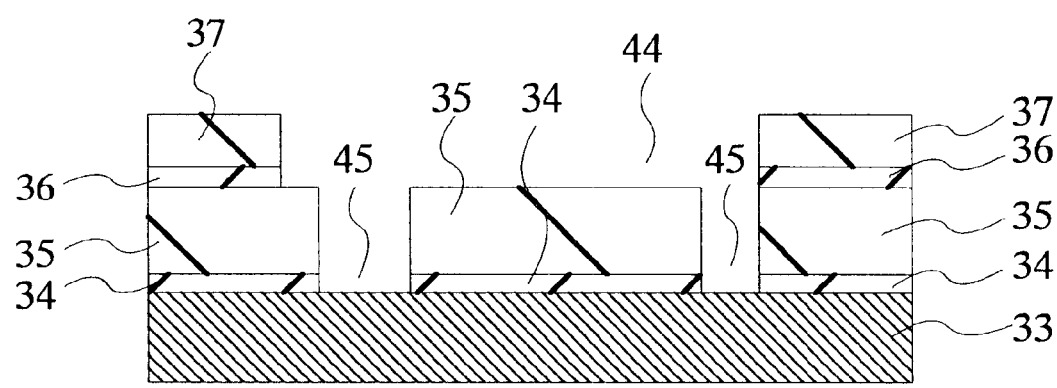
FIG. 31(e) is a schematic cross sectional views of the semiconductor device of FIGS. 30(a) through 30(c) showing subsequent steps of Embodiment 2 of manufacturing method.

FIGS. 30(a) through 30(c) are schematic cross sectional views of a semiconductor device showing steps of another embodiment (Embodiment 2) of manufacturing method according to the invention. FIGS. 31(d) and 31(e) are schematic cross sectional views of the semiconductor device of FIGS. 30(a) through 30(c) showing subsequent steps of Embodiment 2 of manufacturing method. Note that only a left half of the semiconductor device corresponding to the fifth wiring layer of Embodiment 1 is shown in FIGS. 30(a) through 31(e) in a simplified fashion.

This embodiment of manufacturing method according to the invention is identical with Embodiment 1 in terms of the steps illustrated in FIG. 1 through FIG. 12. Thereafter, as shown in FIG. 30(a), insulating films 34 through 38 are sequentially formed on the fourth wiring layer and after etching the insulating film 38, using the groove pattern 40, an anti-reflection film 41 and a resist film 42 are formed. Then, a hole pattern 43 is formed in the resist film 42. Note that, in this embodiment again, the hole pattern 43 is misaligned with the groove pattern 40 as shown in FIG. 13(a).

Then, as shown in FIG. 30(b), an etching operation is conducted in the presence of the resist film 42 carrying the hole pattern 43. The anti-reflection film 41 is etched under conditions same as those described above in terms of Embodiment 1. However, the insulating film 36 is etched under conditions different from those described above in terms of Embodiment 1. More specifically, it is etched under conditions where silicon nitride film is hardly etched. For example, a mixture gas of $CHF_3$ and $O_2$ may be used as etching gas with respective flow rates of 20 and 20 sccm under the pressure of 50 mTorr and RF (radio frequency) power may be applied at a rate of 1,200 W while keeping the substrate at temperature of 0° C. Since silicon nitride film is etched while silicon nitride film is hardly etched under these conditions, the insulating film 38 will not be etched and operate as etching mask with the resist film 42 for etching the insulating film 37. Therefore, the insulating film 37 is not etched in areas where it is covered by the insulating film 38 (silicon nitride film) and hence the holes 43 are formed in a self-aligning manner relative to the insulating film 38 in areas where the hole pattern 43 and the groove pattern 40 are displaced from each other. Thus, the contact holes are not found outside the wiring grooves. In other words, the mask for the wiring groove and the mask for the contact holes are not displaced from each other if the wires are densely arranged and separated with small intervals.

In this embodiment again, the hole pattern 43 has to be transferred into the insulating film 36 and therefore the insulating film 36 has to be etched under conditions where silicon nitride film is easily etched. Thus, with this embodiment, the hole pattern 43 is transferred into the insulating films 37, 37 in two steps including the first step conducted under conditions where silicon nitride film is hardly etched and the second step conducted under conditions where silicon nitride film is easily etched.

Then, the resist film 42 and the anti-reflection film 41 are removed as in the step of FIG. 15 of Embodiment 1 (FIG. 30(c)) and thereafter the groove pattern 40 is transferred into the insulating film 37 for the wiring grooves while the hole pattern 43 is transferred into the insulating film 35 as in the step of FIG. 16 of Embodiment 1 (FIG. 31(d)). Thereafter, as shown in FIG. 31(e), the insulating film 38 that is a silicon nitride film, the insulating film 36 found on the bottoms of the wiring grooves 44 and the insulating film 34 found on the bottoms of the contact holes 45 are removed to produce the wiring grooves 44 and the contact holes 45. The subsequent steps are same as those of Embodiment 1.

Thus, with this embodiment of manufacturing method, the contact holes 45 are formed in a self-aligning manner relative to the wiring grooves 44 to improve the density of arranging wires.

(Embodiment 3)

Figure 32A:
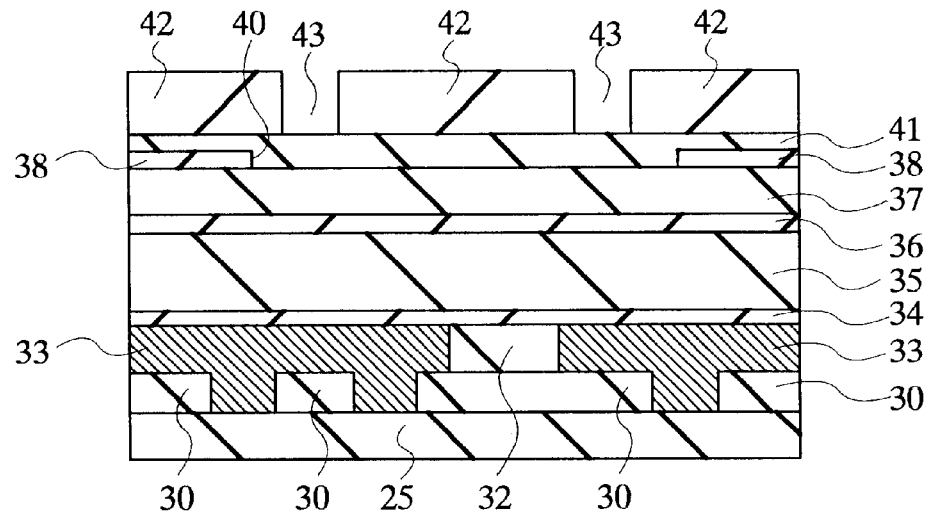
FIG. 32(a) is a schematic cross sectional views of a semiconductor device showing steps of still another embodiment (Embodiment 3) of manufacturing method according to the invention.
Figure 32B:
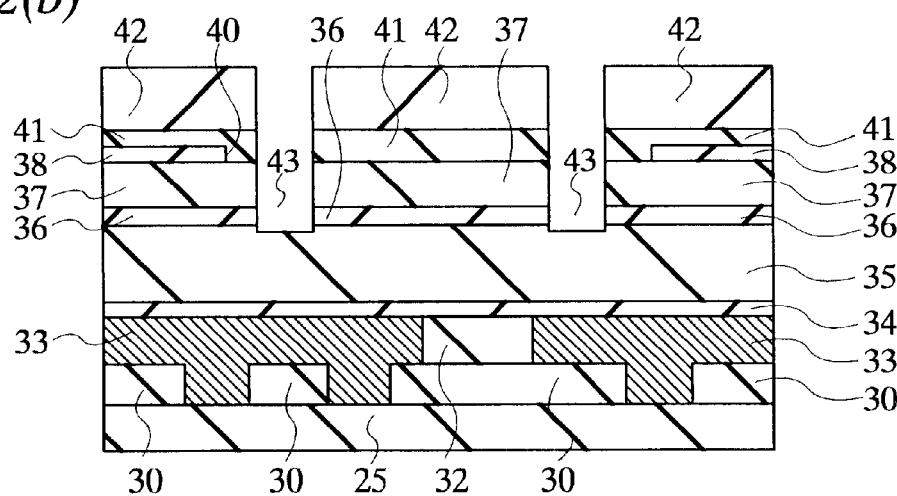
FIG. 32(b) is a schematic cross sectional views of a semiconductor device showing steps of still another subsequent step of Embodiment 3 of manufacturing method according to the invention.
Figure 32C:
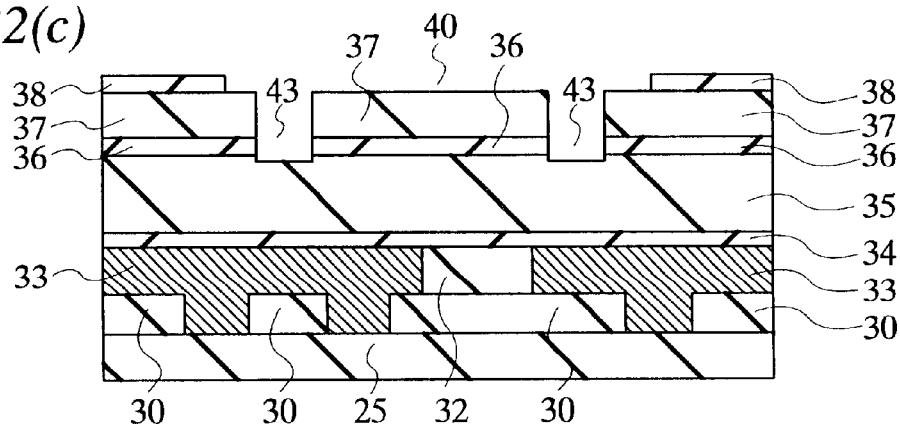
FIG. 32(c) is a schematic cross sectional views of a semiconductor device showing steps of still another subsequent step of Embodiment 3 of manufacturing method according to the invention.
Figure 33D:
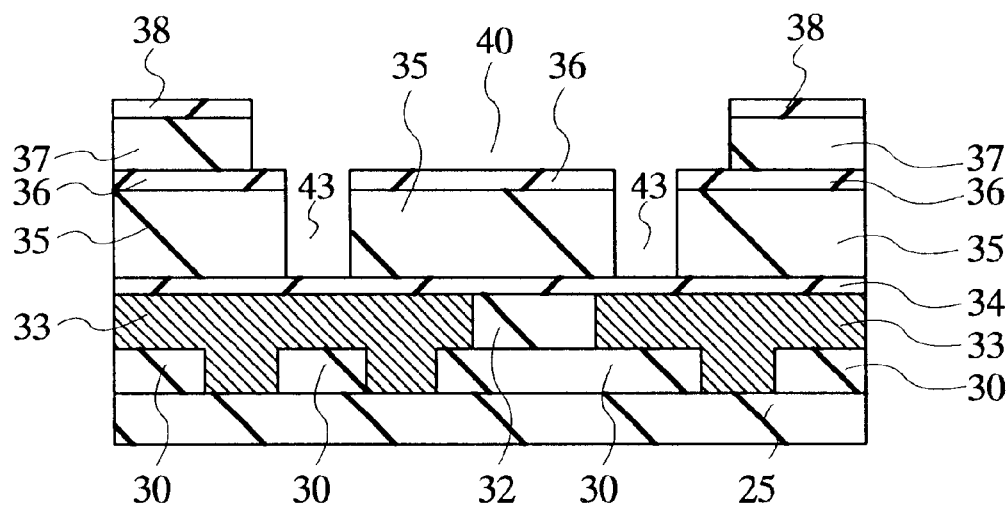
FIG. 33(d) is a schematic cross sectional views of the semiconductor device of FIGS. 32(a) through 32(c) showing subsequent steps of Embodiment 3 of manufacturing method.
Figure 33E:
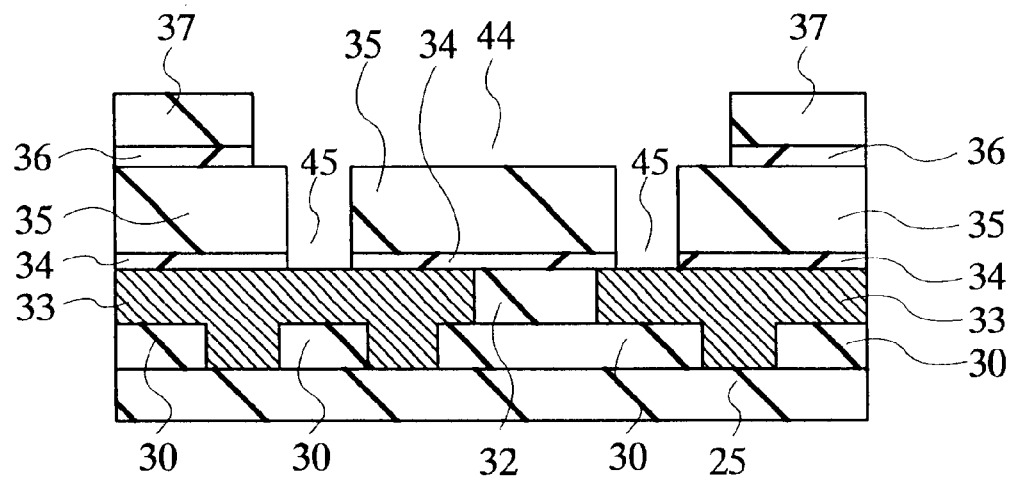
FIG. 33(e) is a schematic cross sectional views of the semiconductor device of FIGS. 32(a) through 32(c) showing subsequent steps of Embodiment 3 of manufacturing method.

FIGS. 32(a) through 32(c) are schematic cross sectional views of a semiconductor device showing steps of still another embodiment (Embodiment 3) of manufacturing method according to the invention. FIGS. 33(d) and 33(e) are schematic cross sectional views of the semiconductor device of FIGS. 32(a) through 32(c) showing subsequent steps of Embodiment 3 of manufacturing method. Note that only a left half of the semiconductor device corresponding to the fifth wiring layer of Embodiment 1 is shown in FIGS. 32(a) through 33(e) in a simplified fashion to show the left half of the device as show in FIGS. 1 trough 29.

This embodiment of manufacturing method according to the invention is identical with Embodiment 1 in terms of the steps illustrated in FIG. 1 through FIG. 12. Thereafter, as shown in FIG. 32(a), insulating films 34 through 38 are sequentially formed on the fourth wiring layer and after etching the insulating film 38, using the groove pattern 40, an anti-reflection film 41 and a resist film 42 having a hole pattern 43 are formed. Note that, in this embodiment, the hole pattern 43 is not misaligned with the groove pattern 40 (FIG. 32(a)).

Then, as shown in FIG. 32(b), an etching operation is conducted in the presence of the resist film 42 carrying the hole pattern 43, by using the resist film as mask. The anti-reflection film 41 is etched under conditions same as those described above in terms of Embodiment 1. As a result of the etching operation, the hole pattern 43 is transferred into the insulating films 37, 36. The etching operation may be conducted either in one step where the insulating films 37, 36 are etched consecutively under conditions good for etching silicon nitride film or in two steps including the first step conducted under conditions where silicon oxide film is easily etched but silicon nitride film is hardly etched and the second step conducted under conditions where silicon nitride film is etched. The conditions good for etching silicon nitride film, those where silicon oxide film is easily etched but silicon nitride film is hardly etched may be same as those described earlier.

In this embodiment again, the hole pattern 43 has to be transferred into the insulating film 36.

Then, the resist film 42 and the anti-reflection film 41 are removed as in the step of FIG. 15 of Embodiment 1 (FIG. 32(c)) and thereafter the groove pattern 40 is transferred into the insulating film 37 for the wiring grooves while the hole pattern 43 is transferred into the insulating film 35 as in the step of FIG. 16 of Embodiment 1 (FIG. 33(d)). Thereafter, as shown in FIG. 33(e), the insulating film 38 that is a silicon nitride film, the insulating film 36 found on the bottoms of the wiring grooves 44 and the insulating film 34 found on the bottoms of the contact holes 45 are removed to produce the wiring grooves 44 and the contact holes 45. The subsequent steps are same as those of Embodiment 1.

(Embodiment 4)

FIGS. 34(a) through 34(d) and 35(e) through 35(g) are schematic cross sectional views of a semiconductor device showing steps of still another embodiment (Embodiment 4) of manufacturing method according to the invention. Note that only a left half of the semiconductor device corresponding to the fifth wiring layer of Embodiment 1 is shown in FIGS. 34(a) through 34(d) in a simplified fashion to show the left half of the device as shown in FIGS. 1 through 29 as in Embodiment 2.

This embodiment of manufacturing method according to the invention is identical with Embodiment 1 in terms of the steps illustrated in FIG. 1 through FIG. 15. Thereafter, insulating films 34 through 38 are sequentially formed on the wires 33 of the fourth wiring layer and the insulating film 32 and then a groove pattern 40 is formed on the insulating film 38. Subsequently, the hole pattern 43 is transferred into the insulating films 37, 36, by using a resist film carrying a hole pattern 43, which resist film is then removed (along with the anti-reflection film) (FIG. 34(a)).

Note, however, that the insulating film 38 has a film thickness of 70 nm, which smaller than the film thickness (100 nm) of its counterpart of Embodiment 1.

Figure 34A:
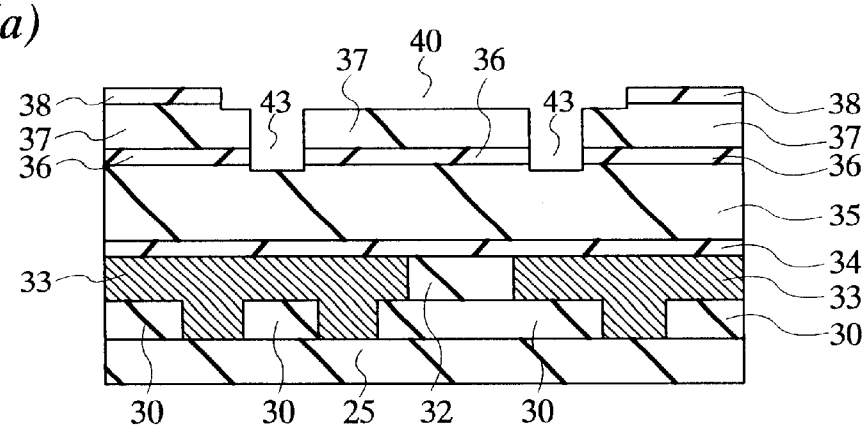
FIG. 34(a) is a schematic cross sectional views of a semiconductor device showing steps of still another embodiment (Embodiment 4) of manufacturing method according to the invention.
Figure 34B:
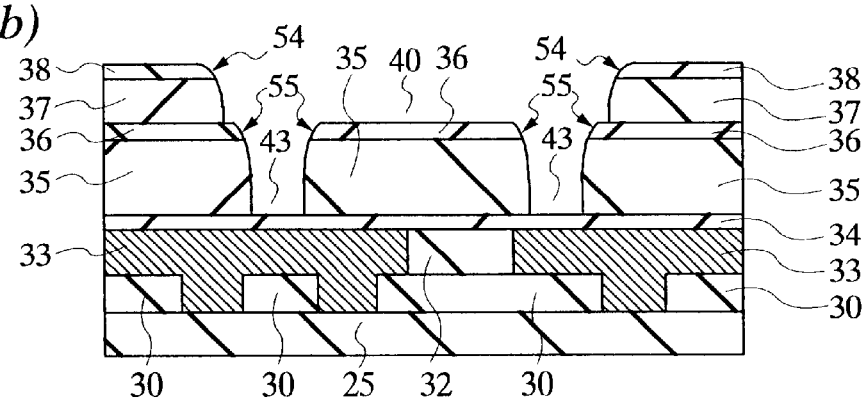
FIG. 34(b) is a schematic cross sectional views of a semiconductor device showing steps of still another subsequent step of Embodiment 4 of manufacturing method according to the invention.

Then, as shown in FIG. 34(b), the groove pattern 40 of the wiring grooves and the hole pattern 43 are transferred respectively into the insulating film 37 and the insulating film 35. The etching conditions used for the transfer operation are identical with those described above for Embodiment 1. Since the insulating film 38 has a relatively small film thickness of 70 nm, it is etched at end portions thereof to become recessed by the etching operation of the transfer step. As a result, the grooves 40 of the insulating film 38 are made to have sloping shoulders 54 as shown in FIG. 34(b). After the transfer of the groove pattern 40 into the insulating film 37, when the bottoms of the grooves 40 of the insulating film 36 come to be exposed, the insulating film 36 is also exposed to the etching atmosphere. If the etching operation is continued under this condition, the insulating film 36 is also etched at end portions thereof to become recessed and the holes 43 of the insulating film 36 are made to have sloping shoulders 55.

As the shoulders 54, 55 are formed, the openings of the wiring grooves and those of the contact holes are enlarged so that they can easily be filled with metal film. Note that the shoulders 54, 55 show a cross section whose width is increasing toward the surface so as to increase the angle of inclination as a result of the recessed end portions of the masks due to the etching operations.

Figure 34C:
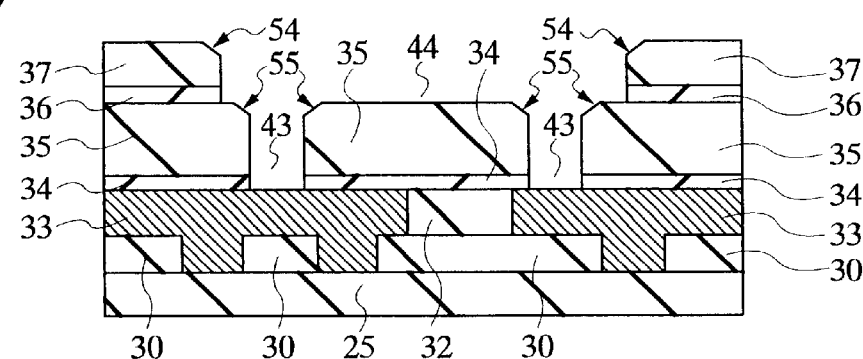
FIG. 34(c) is a schematic cross sectional views of a semiconductor device showing steps of still another subsequent step of Embodiment 4 of manufacturing method according to the invention.

Then, as shown in FIG. 34(c), the insulating film 38, the insulating film 36 on the bottoms of the grooves 40, and the insulating film on the bottoms of the holes 43 are removed by etching to complete the operation of forming the wiring grooves 44 and the contact holes 45. The etching conditions used for the above etching operation are identical with those described above for Embodiment 1.

Figure 34D:
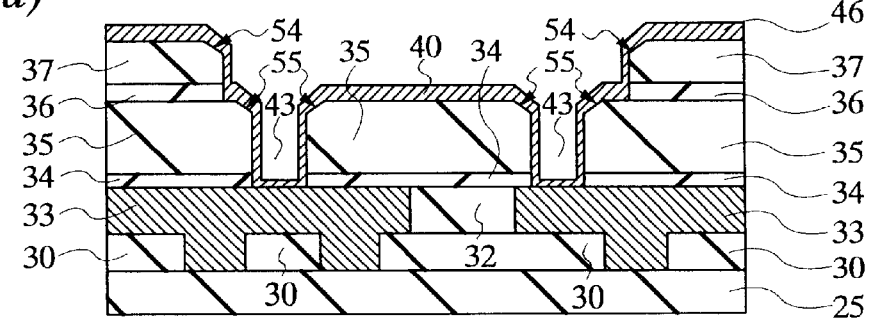
FIG. 34(d) is a schematic cross sectional views of a semiconductor device showing steps of still another subsequent step of Embodiment 4 of manufacturing method according to the invention.

Thereafter, a barrier metal layer 46 is formed as in the step of FIG. 18 of Embodiment 1 (FIG. 34(d)) and then a seed layer 47 and a copper plating layer 48 are formed as in the steps of FIGS. 19 and 20 of Embodiment 1 (FIG. 36(e)). Since the shoulders 54, 55 of the openings of the contact holes 45 and the wiring grooves 44 of this embodiment are rounded, the barrier metal layer 46 and the seed layer 47 can be sputtered with ease. Additionally, the copper plating layer 48 can easily be made to fill the grooves and the holes because of the shoulders.

Figure 35E:
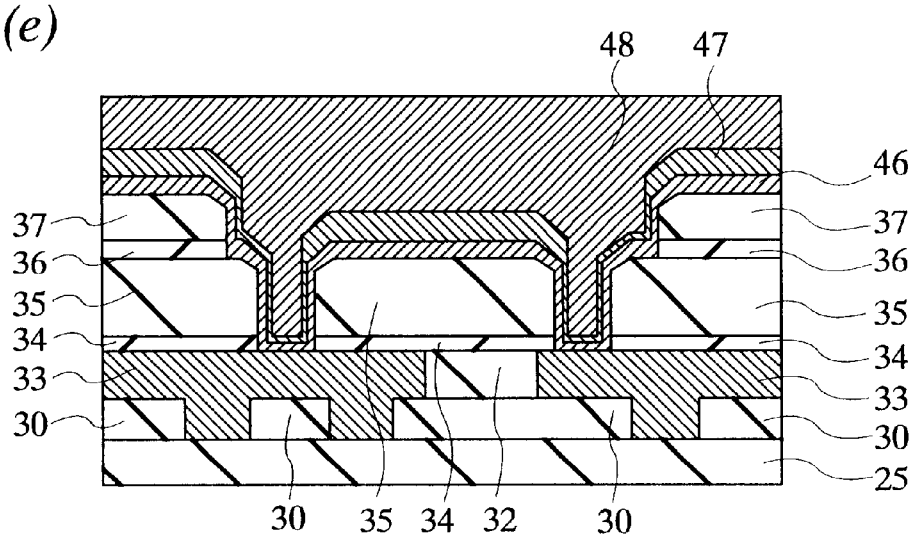
FIG. 35(e) a schematic cross sectional views of the semiconductor device of FIGS. 34(a) through 34(d) showing subsequent steps of Embodiment 4 of manufacturing method.
Figure 35F:
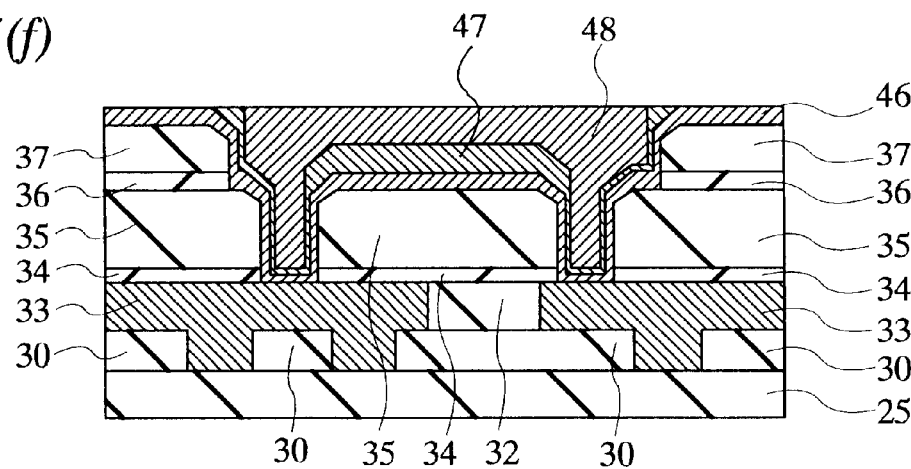
FIG. 35(f) is a schematic cross sectional views of the semiconductor device of FIGS. 34(a) through 34(d) showing subsequent steps of Embodiment 4 of manufacturing method.
Figure 35G:
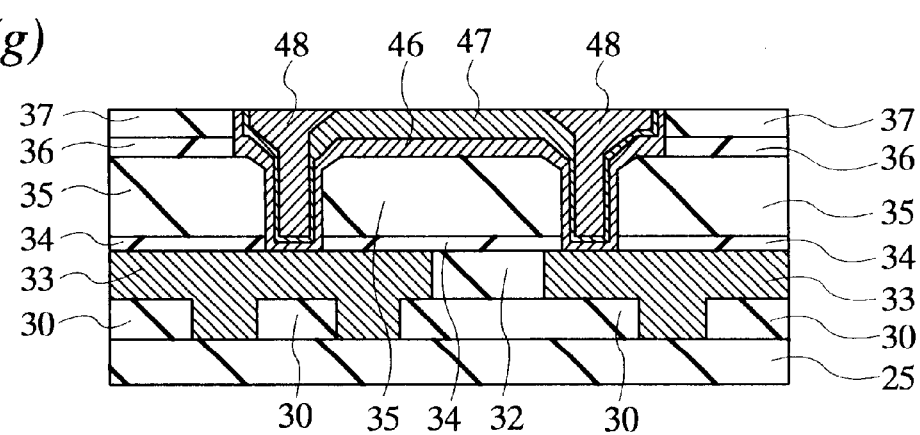
FIG. 35(g) is a schematic cross sectional views of the semiconductor device of FIGS. 34(a) through 34(d) showing subsequent steps of Embodiment 4 of manufacturing method.

Then, as shown in FIG. 35(f), the copper plating layer 48 and the seed layer 47 are scraped by CMP as shown in FIG. 35(f) and then the barrier metal layer 46 is also removed by CMP as shown in FIG. 35(g).

Note, however, the CMP process of this embodiment is not terminated when the barrier metal layer 46 on the insulating film 37 is removed (just scraped off) but conducted excessively until an upper portion of the insulating film 37 is also removed. More specifically, the excessive polishing operation is conducted until the width of the shoulders 54 of the wiring grooves 44 becomes smaller than a predetermined value. As a result of the excessive polishing operation, the rounded areas of the shoulders 54 are removed to reduce the width of the wires in order to eliminate the risk of short-circuiting of the wires and that of reducing the withstand voltage of the wires. In other words, if the rounded areas of the shoulders 54 are left unremoved when the polishing operation is terminated, the intervals separating the wires are reduced by the rounded areas of the shoulders 54 to raise the risk of short-circuiting of the wires and that of reducing the withstand voltage of the wires. Thus, the operation of excessively polishing the surface of the insulating film 37 of this etching mask that continues until the shoulders 54 are removed to a large extent, the width of the wires is reduced to eliminate that above identified risks.

All the subsequent steps of this embodiment are identical with those of Embodiment 1.

Thus, this embodiment provides the advantage of broadening the openings of the wiring grooves 44 and those of the contact holes 45 so that the barrier metal layer 46, the seed layer 47 and the plating layer 48 can be formed to fill the wiring grooves and the contact holes with ease.

Another advantage of this embodiment is that wires are formed by excessively using the CMP process to remove the broadened portions of the wiring grooves 44 and widen the intervals separating the wires in order to reduce the interwire leak current and improve the withstand voltage.

While the metal wiring layers are formed by means of a plating technique in this embodiment, they may alternatively be formed by means of a reflow technique of combining sputtering and heat treatment. The use of a reflow technique is advantageous for forming shoulders 54, 55 (rounded areas) because they improve the mobility of metal and make the wiring grooves and the contact holes to be effectively filled with metal.

(Embodiment 5)

This embodiment differs from Embodiment 4 in terms of the technique used for forming the shoulders 54, 55. In other words, the shoulders 54, 55 of Embodiment 4 can be formed by a technique as illustrated in FIG. 36. FIGS. 36(a) through 36(d) are schematic cross sectional views of a semiconductor device showing steps of still another embodiment (Embodiment 5) of manufacturing method according to the invention.

Figure 36A:
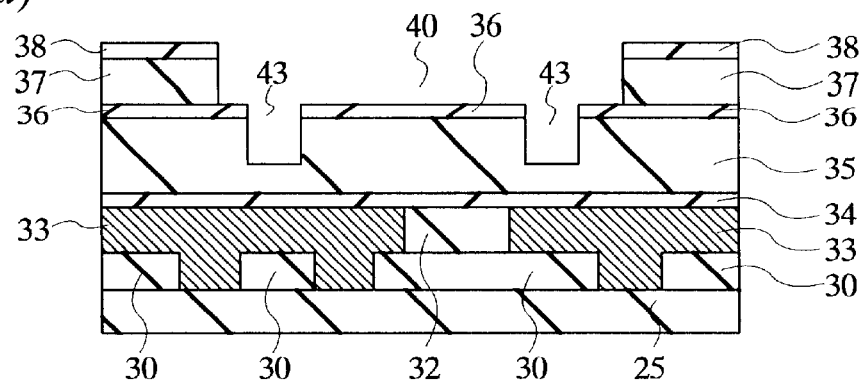
FIG. 36(a) is a schematic cross sectional views of a semiconductor device showing steps of still another embodiment (Embodiment 5) of manufacturing method according to the invention.

More specifically, the groove pattern 40 is transferred into the insulating film 37 as described above for Embodiment 1 by referring to FIG. 16 (FIG. 36(a)). The etching operation of forming holes 43 is terminated before they get to the insulating film 34. Additionally, the insulating film 38 is made to have a sufficiently large film thickness (e. g., 100 nm) so that the insulating film 37 may not be removed along the edges of the wiring grooves 40.

Figure 36B:
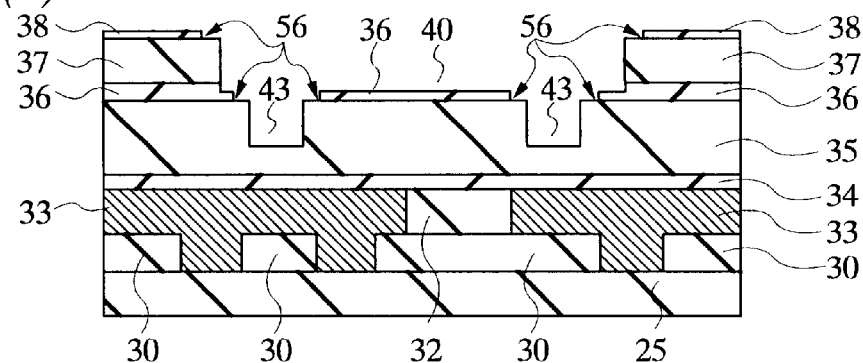
FIG. 36(b) is a schematic cross sectional views of a semiconductor device showing steps of still another subsequent step of Embodiment 5 of manufacturing method according to the invention.

Then, as shown in FIG. 36(b), the insulating film 38 and the insulating film 36 are partly etched under conditions good for etching silicon nitride film. As a result of this etching operation, the insulating film 38 and the insulating film 36 are etched along the edges 56 of the wiring grooves and the contact holes.

Figure 36C:
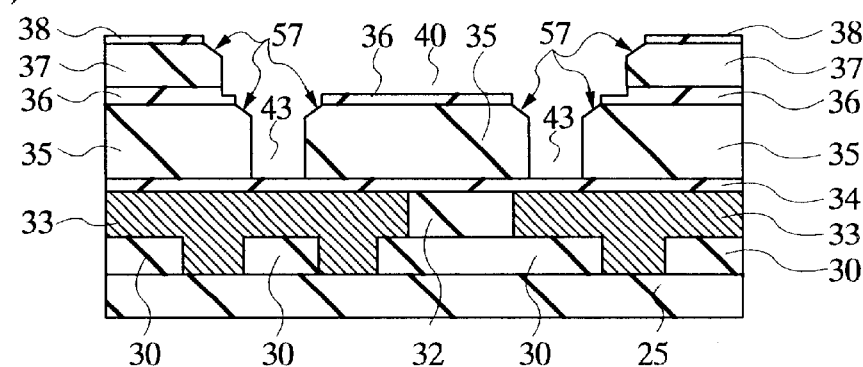
FIG. 36(c) is a schematic cross sectional views of a semiconductor device showing steps of still another subsequent step of Embodiment 5 of manufacturing method according to the invention.

As shown in FIG. 36(c), the etching conditions are modified to allow silicon oxide film to be easily etched but make silicon nitride to be hardly etched and the etching operation is continued. Since no silicon nitride film is found along the edges 56 of the grooves and the openings cut into the insulating film 38 and the insulating film 36, the edges 56 do not operate as etching mask. Additionally, the silicon nitride film located adjacent to the edges is very thin, shoulders 57 are formed along the edges.

Figure 36D:
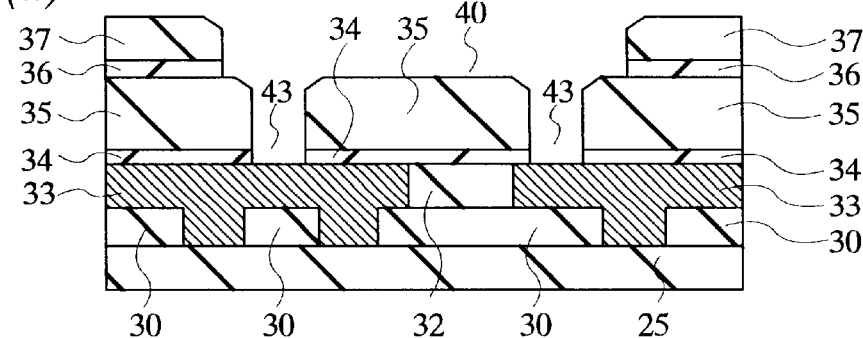
FIG. 36(d) is a schematic cross sectional views of a semiconductor device showing steps of still another subsequent step of Embodiment 5 of manufacturing method according to the invention.

Thereafter, as shown in FIG. 36(d), the insulating film 38, the insulating film 36 left on the bottoms of the wiring grooves 40 and the insulating film 34 left on the bottoms of the contact holes 43 are removed by etching to complete the operation of producing the wiring grooves 44 and the contact holes 45. All the subsequent steps of this embodiment are identical with those of Embodiment 4.

Since the shoulders 57 are rounded with this embodiment, this embodiment provide advantages same as those of Embodiment 4.

(Embodiment 6)

FIGS. 37(a) through 37(f) are schematic cross sectional views of a semiconductor device showing steps of still another embodiment (Embodiment 6) of manufacturing method according to the invention. Note that only part of the semiconductor device corresponding to the fifth wiring layer of Embodiment 1 is shown in FIGS. 37(a) through 37(e). More specifically, only some of the wires and the underlying interlayer connecting wires of the semiconductor device are shown in a simplified fashion.

This embodiment differs from Embodiment 1 in that the insulating film 36 operating as an intermediary stopper layer of Embodiment 1 is not used with this embodiment.

Figure 37A:
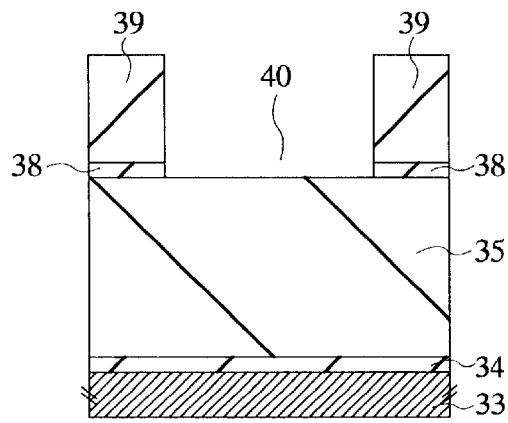
FIG. 37(a) is a schematic cross sectional views of a semiconductor device showing steps of still another embodiment (Embodiment 6) of manufacturing method according to the invention.

Referring firstly to FIG. 37(a), insulating films 34, 35 and 38 are formed sequentially on the lower wiring layer 33. Typically, the insulating films 34, 38 may be made of silicon nitride whereas the insulating film 35 may be made of silicon oxide as in Embodiment 1. However, since the insulating film 35 operates also as the insulating film 37 of Embodiment 1, it is made as thick as 850 to 900 nm. Then, as in Embodiment 1, the groove pattern 40 is transferred into the insulating film 38 by using resist film 39.

Figure 37D:
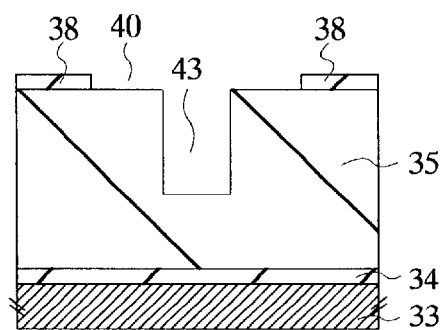
FIG. 37(d) is a schematic cross sectional views of a semiconductor device showing steps of still another subsequent step of Embodiment 6 of manufacturing method according to the invention.
Figure 37B:
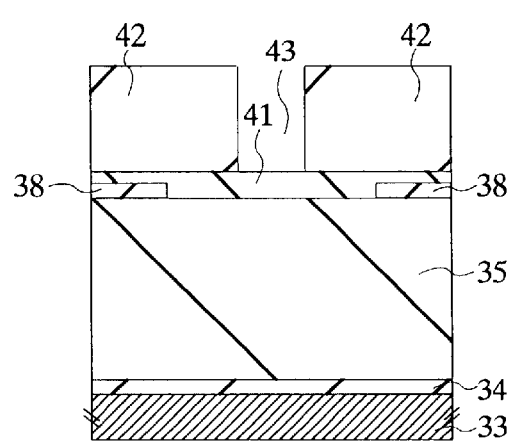
FIG. 37(b) is a schematic cross sectional views of a semiconductor device showing steps of still another subsequent step of Embodiment 6 of manufacturing method according to the invention.

Then, as shown in FIG. 37(b), an anti-reflection film 41 is formed to fill the grooves 40 of the insulating film 38 as in Embodiment 1 and a resist film 42 having openings 43 for forming contact holes is formed as hole pattern also as in the case of Embodiment 1.

Figure 37E:
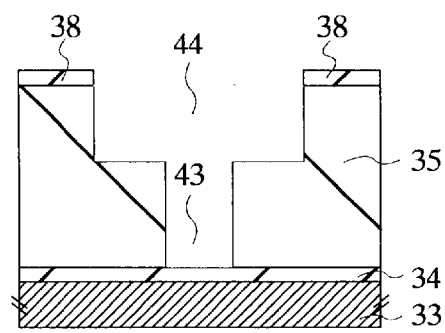
FIG. 37(e) is a schematic cross sectional views of a semiconductor device showing steps of still another subsequent step of Embodiment 6 of manufacturing method according to the invention.
Figure 37C:
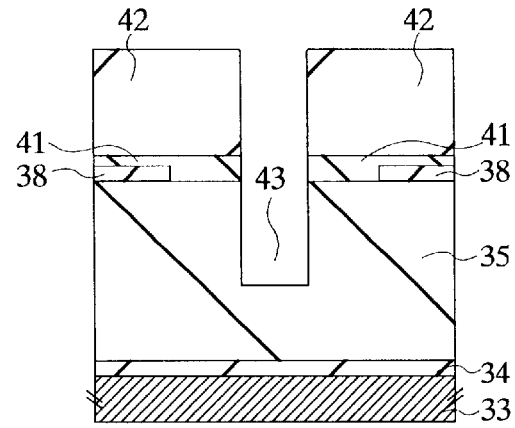
FIG. 37(c) is a schematic cross sectional views of a semiconductor device showing steps of still another subsequent step of Embodiment 6 of manufacturing method according to the invention.

Thereafter, as shown in FIG. 37(c), the hole pattern 43 is transferred into the insulating film 35 by using the resist film 42 as mask. As in Embodiment 1, the transfer operation is conducted under conditions good for etching silicon oxide film to form contact holes 43 in the insulating film 35 as deep as 500 nm. The depth of the contact holes 43 can be controlled by controlling the duration of the etching operation.

Then, as shown in FIG. 37(d), the resist film 42 and the anti-reflection film 41 are removed by using a technique similar to the one used in Embodiment 1.

Thereafter, as shown in FIG. 37(e), the groove pattern 40 carried by the insulating film 38 is transferred into the insulating film 35 by using the insulating film 38 as mask under conditions good for etching silicon oxide film as described above in terms of Embodiment 1. The grooves 40 are made as deep as 400 nm. The depth of the grooves 40 can be controlled by controlling the duration of the etching operation.

Since the contact holes 43 are already formed in the insulating film 35, the bottoms of the contact holes are also etched by this etching operation so that the bottoms of the contact holes 43 get to the lower surface of the insulating film 34 when the grooves 40 are formed as deep as 400 nm by the etching operation.

Figure 37F:
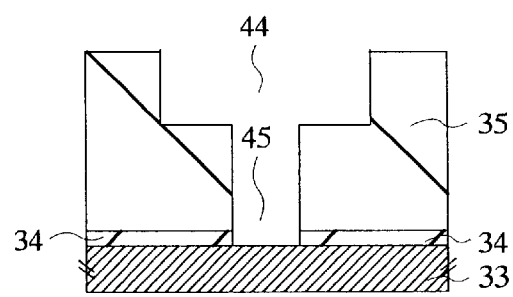
FIG. 37(f) is a schematic cross sectional views of a semiconductor device showing steps of still another subsequent step of Embodiment 6 of manufacturing method according to the invention.

Then, as shown in FIG. 37(f), the insulating film 38 and the insulating film 34 left on the bottoms of the contact holes 43 are removed to complete the operation of forming the wiring grooves 44 and the contact holes 45. This removing operation is an etching operation conducted under conditions good for etching silicon nitride film. All the subsequent steps of this embodiment are same as those of Embodiment 1.

This embodiment provides an advantage that no silicon nitride film showing a high dielectric constant is formed on the bottoms of the wiring grooves because, unlike Embodiment 1, the insulating film 36 that is a silicon nitride film operating as intermediary stopper is not used in this embodiment. As a result, the inter-wire capacitance is reduced to improve the performance of the semiconductor device.
(Embodiment 7)

FIGS. 38(*a*) through 38(*f*) are schematic cross sectional views of a semiconductor device showing steps of still another embodiment (Embodiment 7) of manufacturing method according to the invention. Note that only part of the semiconductor device corresponding to the fifth wiring layer of Embodiment 1 is shown in FIGS. 38(*a*) through 38(*f*). More specifically, only some of the wires and the underlying interlayer connecting wires of the semiconductor device are shown in a simplified fashion.

This embodiment differs from Embodiment 1 in that the insulating film 36 operating as an intermediary stopper layer of Embodiment 1 is not used with this embodiment and a marker layer 58 is additionally provided in order to form the wiring grooves and the contact holes.

Referring firstly to FIG. 38(*a*), insulating films 34, 35, a marker layer 58 and insulating films 37, 38 are formed sequentially on the lower wiring layer 33. The insulating films 34, 35, 37 and 38 are same as those of Embodiment 1. The marker layer 58 may be made of silicon nitride, PSG (phosphor-silicate-glass) or BPSG (boron-phosphor-silicate-glass) and have a film thickness between 10 and 50 nm. As described hereinafter, such a marker layer 58 may be used as marker for etching operations. The insulating films 35, 37 are made to show a total film thickness of about 850 nm and the marker layer 58 is formed to define the bottom of the contact holes in the next step. For example, it may be located 500 nm below the upper surface of the insulating film 37. In other words, the insulating films 35 and 37 may be made to show respective heights of 350 nm and 500 nm (if the film thickness of the marker layer is negligible).

Then, the groove pattern 40 is transferred into the insulating film 38 by using a resist film 39 as in Embodiment 1.

Thereafter, as shown in FIG. 38(*b*), an anti-reflection film 41 is formed to fill the grooves 40 of the insulating film 38 as in Embodiment 1 and a resist film 42 having openings 43 for forming contact holes is formed as hole pattern also as in the case of Embodiment 1.

Then, as shown in FIG. 38(*c*), the hole pattern 43 is transferred into the insulating film 35 by using the resist film 42 as mask. As in Embodiment 1, the transfer operation is conducted under conditions good for etching silicon oxide film to form contact holes 43 in the insulating film 35. The depth of the contact holes 43 can be controlled by detecting the marker layer 58. More specifically, since the marker layer 58 contains nitrogen (N), boron (B) and phosphor (P) along with other elements, the depth of the contact holes 43 can be controlled by means of plasma spectroscopy of detecting the emission of light of the plasma of nitrogen, boron and phosphor produced by the etching operation. The etching operation is terminated when the emission of light is detected so that the contact holes 43 may show the intended height. With this technique, the depth of the contact holes can be controlled with ease.

Then, as shown in FIG. 38(*d*), the resist film 42 and the anti-reflection film 41 are removed by using a technique similar to the one used in Embodiment 1.

Thereafter, as shown in FIG. 38(*e*), the groove pattern 40 carried by the insulating film 38 is transferred into the insulating film 35 by using the insulating film 38 as mask under conditions good for etching silicon oxide film as described above in terms of Embodiment 1. The grooves 40 are made as deep as 400 nm. The depth of the grooves 40 can be controlled by controlling the duration of the etching operation. Since the contact holes are already formed in the insulating film 35, the bottoms of the contact holes are also etched by this etching operation so that the bottoms of the contact holes 43 get to the lower surface of the insulating film 34 when the grooves 40 are formed as deep as 400 nm by the etching operation as in the case of Embodiment 6.

Then, as shown in FIG. 38(*f*), the insulating film 38 and the insulating film 34 left on the bottoms of the contact holes 43 are removed to complete the operation of forming the wiring grooves 44 and the contact holes 45. This removing operation is an etching operation conducted under conditions good for etching silicon nitride film. All the subsequent steps of this embodiment are same as those of Embodiment 1.

This embodiment provides an advantage that no silicon nitride film showing a high dielectric constant is formed on the bottoms of the wiring grooves because, unlike Embodiment 1, the insulating film 36 that is a silicon nitride film operating as intermediary stopper is not used in this embodiment. As a result, the inter-wire capacitance is reduced to improve the performance of the semiconductor device. This embodiment provides an additional advantage that the depth of the contact holes 43 can be controlled with ease.

Note that a semiconductor device formed by this embodiment of manufacturing method comprises a marker layer below the bottom of the wiring layers.
(Embodiment 8)

FIGS. 39(*a*) through 39(*f*) are schematic cross sectional views of a semiconductor device showing steps of still another embodiment (Embodiment 8) of manufacturing method according to the invention. Note that only part of the semiconductor device corresponding to the fifth wiring layer of Embodiment 1 is shown in FIGS. 39(*a*) through 39(*f*). More specifically, only some of the wires and the underlying interlayer connecting wires of the semiconductor device are shown in a simplified fashion.

Referring firstly to FIG. 39(*a*), insulating films 34 through 37, a marker layer 58 and insulating films 37', 38 are formed sequentially on the lower wiring layer 33. The insulating films 34, 36, and 38 are typically made of silicon nitride, whereas the insulating films 35, 37 and 37' are typically made of silicon oxide just like the corresponding insulating films of Embodiment 1. The marker layer 58 is same as that of Embodiment 7.

The insulating films 37, 37' are made to show a total film thickness of about 450 nm and the marker layer 58 is formed 400 nm above the upper surface of the insulating film 37'. In other words, the insulating film 37' may be made to show a film thickness of 50 nm (if the film thickness of the marker layer is negligible).

Then, the groove pattern 40 is transferred into the insulating film 38 by using a resist film 39 as in Embodiment 1.

Thereafter, as shown in FIG. 39(*b*), an anti-reflection film 41 is formed to fill the grooves 40 of the insulating film 38 as in Embodiment 1 and a resist film 42 having openings 43 for forming contact holes is formed as hole pattern also as in the case of Embodiment 1.

Figure 39A:
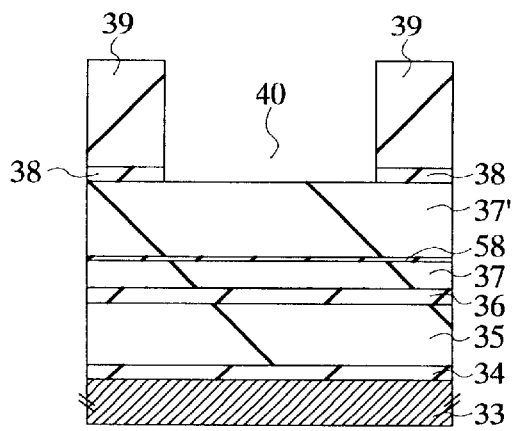
FIG. 39(a) is a schematic cross sectional views of a semiconductor device showing steps of still another embodiment (Embodiment 8) of manufacturing method according to the invention.
Figure 39D:
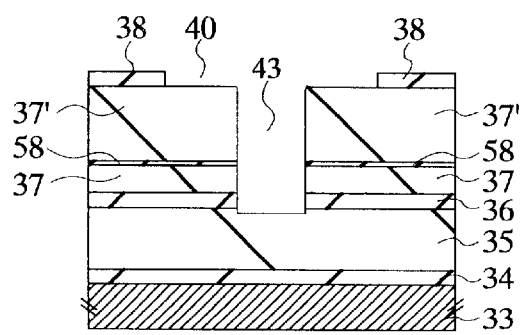
FIG. 39(d) is a schematic cross sectional views of a semiconductor device showing steps of still another subsequent step of Embodiment 8 of manufacturing method according to the invention.
Figure 39B:
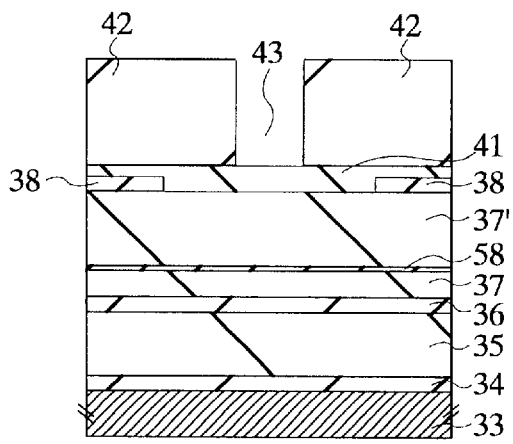
FIG. 39(b) is a schematic cross sectional views of a semiconductor device showing steps of still another subsequent step of Embodiment 8 of manufacturing method according to the invention.
Figure 39E:
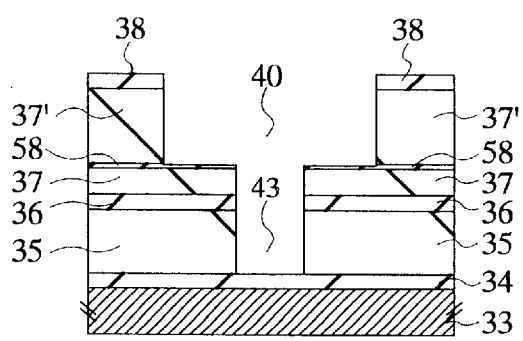
FIG. 39(e) is a schematic cross sectional views of a semiconductor device showing steps of still another subsequent step of Embodiment 8 of manufacturing method according to the invention.
Figure 39C:
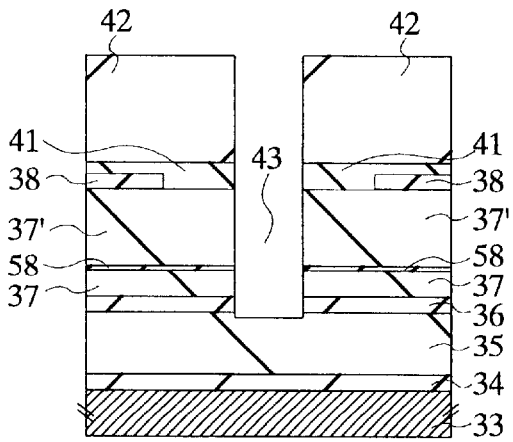
FIG. 39(c) is a schematic cross sectional views of a semiconductor device showing steps of still another subsequent step of Embodiment 8 of manufacturing method according to the invention.
Figure 39F:
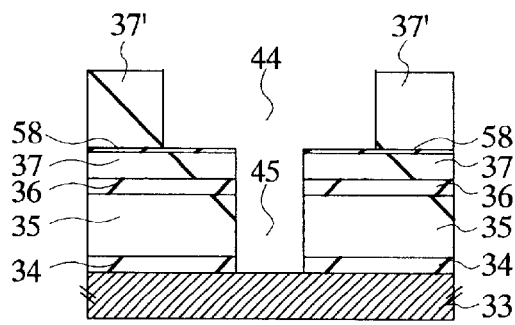
FIG. 39(f) is a schematic cross sectional views of a semiconductor device showing steps of still another subsequent step of Embodiment 8 of manufacturing method according to the invention.

Then, as shown in FIG. 39(c), the hole pattern 43 is transferred into the insulating film 35 by using the resist film 42 as mask. As in Embodiment 1, the transfer operation is conducted under conditions where silicon oxide film is etched with each but silicon nitride film is hardly etched. In other words, the insulating film 36 that is a silicon nitride film is used as etching stopper. With this technique, the depth of the contact holes can be controlled with ease. Then, the insulating film 36 left on the bottoms of the contact holes 43 is removed by etching.

Then, as shown in FIG. 39(d), the resist film 42 and the anti-reflection film 41 are removed by using a technique similar to the one used in Embodiment 1.

Thereafter, as shown in FIG. 39(e), the groove pattern 40 carried by the insulating film 38 is transferred into the insulating film 37' by using the insulating film 38 as mask under conditions good for etching silicon oxide film as described above in terms of Embodiment 1. The depth of the wiring grooves 40 can be controlled by detecting the marker layer 58. More specifically, since the marker layer 58 contains nitrogen (N), boron (B) and phosphor (P) along with other elements, the depth of the contact holes 43 can be controlled by means of plasma spectroscopy of detecting the emission of light of the plasma of nitrogen, boron and phosphor produced by the etching operation. The etching operation is terminated when the emission of light is detected so that the wiring grooves 40 may show the intended height. With this technique, the depth of the wiring grooves 40 can be controlled with ease. The grooves 40 are made as deep as 400 nm in a well-controlled manner because the depth is defined by the marker layer 58. Since the contact holes are already formed in the insulating film 35 at the time of this etching operation, the bottoms of the contact holes are also etched by this etching operation so that the bottoms of the contact holes 43 get to the lower surface of the insulating film 34 as in the case of Embodiment 6. It will be appreciated that no problem arises if the bottoms of the contact holes 43 are excessively etched because the insulating film 34 that is a silicon nitride film is formed thereunder.

Figure 38A:
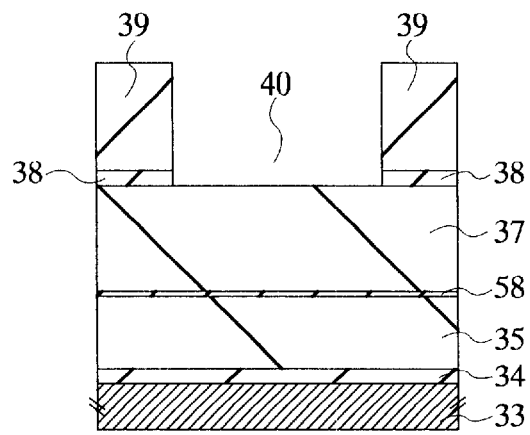
FIG. 38(a) is a schematic cross sectional views of a semiconductor device showing steps of still another embodiment (Embodiment 7) of manufacturing method according to the invention.
Figure 38D:
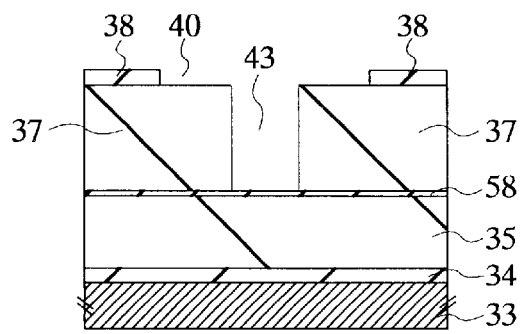
FIG. 38(d) is a schematic cross sectional views of a semiconductor device showing steps of still another subsequent step of Embodiment 7 of manufacturing method according to the invention.
Figure 38B:
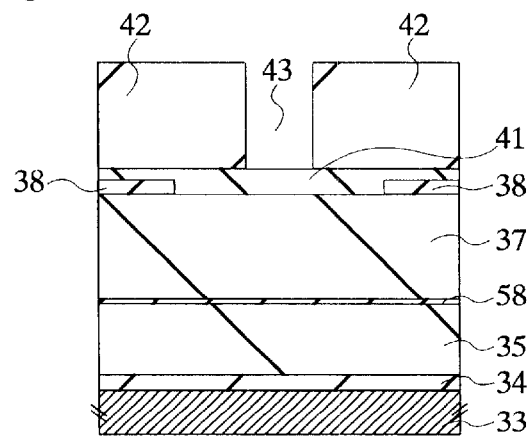
FIG. 38(b) is a schematic cross sectional views of a semiconductor device showing steps of still another subsequent step of Embodiment 7 of manufacturing method according to the invention.
Figure 38E:
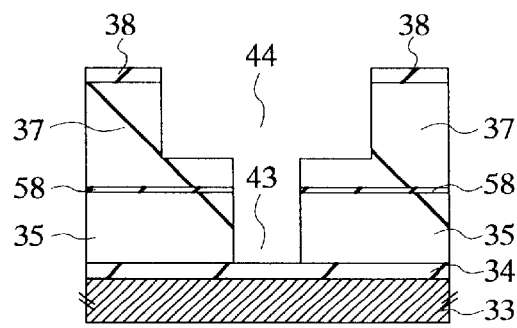
FIG. 38(e) is a schematic cross sectional views of a semiconductor device showing steps of still another subsequent step of Embodiment 7 of manufacturing method according to the invention.
Figure 38C:
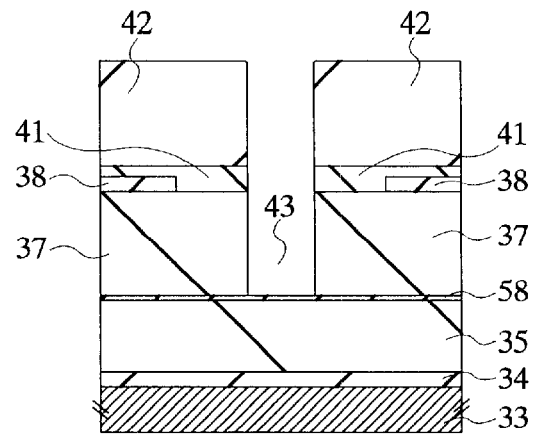
FIG. 38(c) is a schematic cross sectional views of a semiconductor device showing steps of still another subsequent step of Embodiment 7 of manufacturing method according to the invention.
Figure 38F:
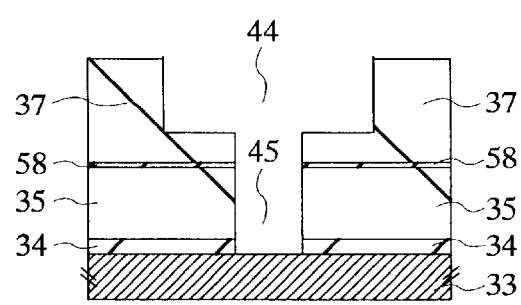
FIG. 38(f) is a schematic cross sectional views of a semiconductor device showing steps of still another subsequent step of Embodiment 7 of manufacturing method according to the invention.

Then, as shown in FIG. 38(f), the insulating film 38 and the insulating film 34 left on the bottoms of the contact holes 43 are removed to complete the operation of forming the wiring grooves 44 and the contact holes 45. This removing operation is an etching operation conducted under conditions good for etching silicon nitride film. All the subsequent steps of this embodiment are same as those of Embodiment 1.

This embodiment provides an advantage that, although an intermediary layer of silicon nitride showing a high dielectric constant is used, it does not significantly increase the inter-wire capacitance because the silicon nitride film is formed below the bottoms of the wiring grooves. In other words, the silicon nitride film (insulating film 36) is held in contact with the interlayer connecting wires for connecting the upper wire and the lower wires, which are not found everywhere in the wire forming regions. More specifically, since the interlayer connecting wires are formed only in part of the wire forming regions, the overall capacitance produced by the interlayer connecting wires and the insulating film 36 is not large. On the other hand, the depth of the contact holes and that of the wiring grooves can be controlled with ease in this embodiment. In other words, both the wiring grooves and the contact holes can be formed in a highly accurate manner. The high accuracy of forming the depth of the wiring grooves and that of the contact holes allows the use of thin insulating films (insulating films 34, 36) operating as stoppers to consequently reduce the inter-wire capacitance and hence improve the performance of the semiconductor device.

(Embodiment 9)

FIGS. 40(a) through 40(f) are schematic cross sectional views of a semiconductor device showing steps of still another embodiment (Embodiment 9) of manufacturing method according to the invention. Note that only part of the semiconductor device corresponding to the fifth wiring layer of Embodiment 1 is shown in FIGS. 40(a) through 40(f). More specifically, only some of the wires and the underlying interlayer connecting wires of the semiconductor device are shown in a simplified fashion.

This embodiment differs from Embodiment 8 in that the insulating film 36 is not used in this embodiment.

Figure 40A:
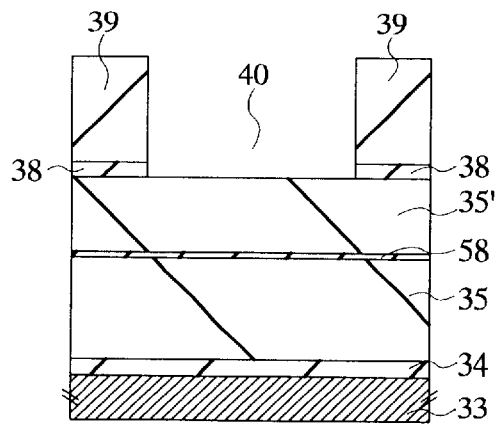
FIG. 40(a) is a schematic cross sectional views of a semiconductor device showing steps of still another embodiment (Embodiment 9) of manufacturing method according to the invention.

Referring firstly to FIG. 40(a), insulating films 34, 35, a marker layer 58 and insulating films 35', 38 are formed sequentially on the lower wiring layer 33. The insulating films 34 and 38 are typically made of silicon nitride, whereas the insulating films 35 and 35' are typically made of silicon oxide just like the corresponding insulating films of Embodiment 1. The marker layer 58 is same as that of Embodiment 7.

The insulating films 35, 35' are made to show a total film thickness of about 850 nm and the marker layer 58 is formed 400 nm above the upper surface of the insulating film 35'. In other words, the insulating film 35 may be made to show a film thickness of 450 nm if the film thickness of the marker layer is negligible.

Then, the groove pattern 40 is transferred into the insulating film 38 by using a resist film 39 as in Embodiment 1.

Figure 40B:
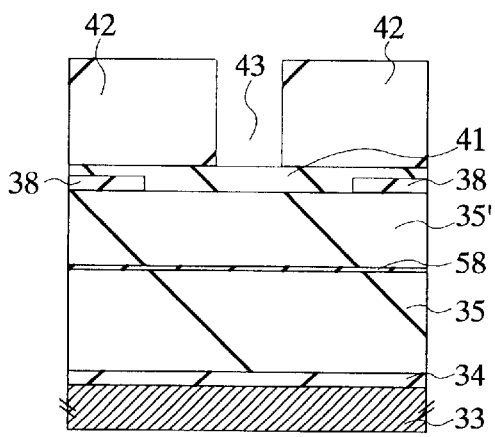
FIG. 40(b) is a schematic cross sectional views of a semiconductor device showing steps of still another subsequent step of Embodiment 9 of manufacturing method according to the invention.

Thereafter, as shown in FIG. 40(b), an anti-reflection film 41 is formed to fill the grooves 40 of the insulating film 38 as in Embodiment 1 and a resist film 42 having openings 43 for forming contact holes is formed as hole pattern also as in the case of Embodiment 1.

Figure 40C:
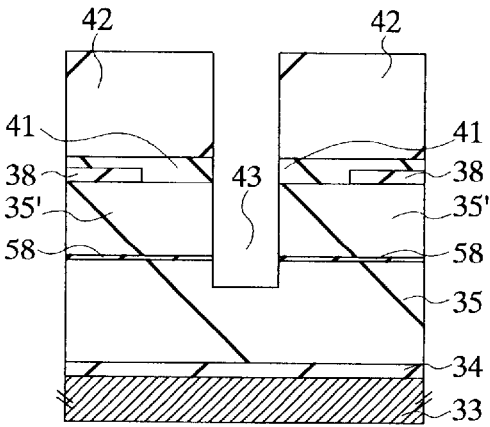
FIG. 40(c) is a schematic cross sectional views of a semiconductor device showing steps of still another subsequent step of Embodiment 9 manufacturing method according to the invention.

Then, as shown in FIG. 40(c), the hole pattern 43 is transferred into the insulating films 35, 35' by using the resist film 42 as mask. The transfer operation is conducted under conditions good for etching silicon oxide film. The depth of the contact holes 43 can be controlled by controlling the duration of the etching operation. the contact holes 43 are made as deep as 500 nm. While the contact holes 43 are cut through the marker layer 58 by the etching operation, the emission of light of the plasma produced by the marker layer will be neglected.

Figure 40D:
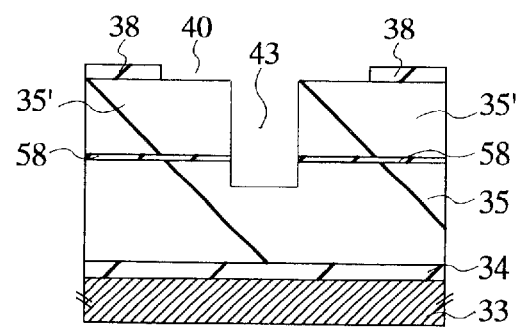
FIG. 40(d) is a schematic cross sectional views of a semiconductor device showing steps of still another subsequent step of Embodiment 9 of manufacturing method according to the invention.

Then, as shown in FIG. 40(d), the resist film 42 and the anti-reflection film 41 are removed by using a technique similar to the one used in Embodiment 1.

Figure 40E:
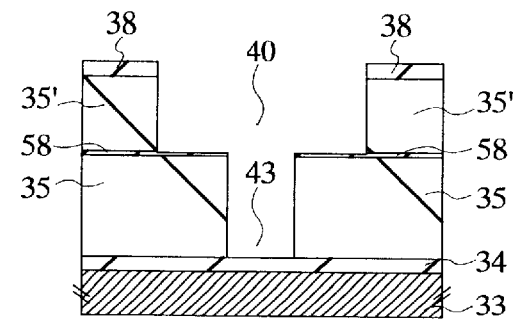
FIG. 40(e) is a schematic cross sectional views of a semiconductor device showing steps of still another subsequent step of Embodiment 9 of manufacturing method according to the invention.

Thereafter, as shown in FIG. 40(e), the groove pattern 40 carried by the insulating film 38 is transferred into the insulating film 35' by using the insulating film 38 as mask under conditions good for etching silicon oxide film as in the case of Embodiment 1. The depth of the wiring grooves 40 can be controlled by detecting the marker layer 58 as in the case of Embodiment 8. More specifically, since the marker layer 58 contains nitrogen (N), boron (B) and phosphor (P) along with other elements, the depth of the contact holes 43 can be controlled by means of plasma spectroscopy of detecting the emission of light of the plasma of nitrogen, boron and phosphor produced by the etching operation. The etching operation is terminated when the emission of light is detected so that the wiring grooves 40 may show the intended height. With this technique, the depth of the wiring grooves 40 can be controlled with ease. Since the contact holes are already formed in the insulating film 35 at the time of this etching operation, the bottoms of the contact holes are also etched by this etching operation so that the bottoms of the contact holes 43 get to the lower surface of the insulating film 34 as in the case of Embodiment 6. It will be appreciated that no problem arises if the bottoms of the contact holes 43 are excessively etched because the insulating film 34 that is a silicon nitride film is formed thereunder.

Figure 40F:
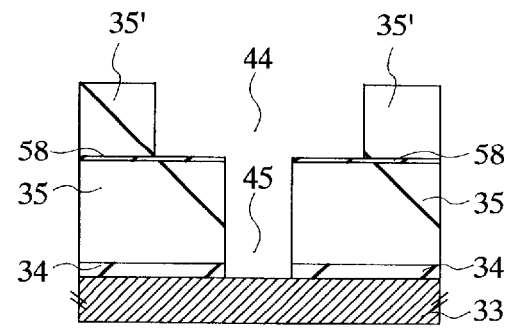
FIG. 40(f) is a schematic cross sectional views of a semiconductor device showing steps of still another subsequent step of Embodiment 9 of manufacturing method according to the invention.

Then, as shown in FIG. 40(f), the insulating film 38 and the insulating film 34 left on the bottoms of the contact holes 43 are removed to complete the operation of forming the wiring grooves 44 and the contact holes 45. This removing operation is an etching operation conducted under conditions good for etching silicon nitride film. All the subsequent steps of this embodiment are same as those of Embodiment 1.

This embodiment provides an advantage that no silicon nitride film showing a high dielectric constant is formed on the bottoms of the wiring grooves because the insulating film 36 that is a silicon nitride film operating as intermediary stopper is not used in this embodiment. As a result, the inter-wire capacitance is reduced to improve the performance of the semiconductor device. On the other hand, the wiring grooves 44 can be formed in a well-controlled fashion by using the marker layer 58.

(Embodiment 10)

FIGS. 41(a) through 41(f) are schematic cross sectional views of a semiconductor device showing steps of still another embodiment (Embodiment 10) of manufacturing method according to the invention. Note that only part of the semiconductor device corresponding to the fifth wiring layer of Embodiment 1 is shown in FIGS. 41(a) through 41(f). More specifically, only some of the wires and the underlying interlayer connecting wires of the semiconductor device are shown in a simplified fashion.

Figure 41A:
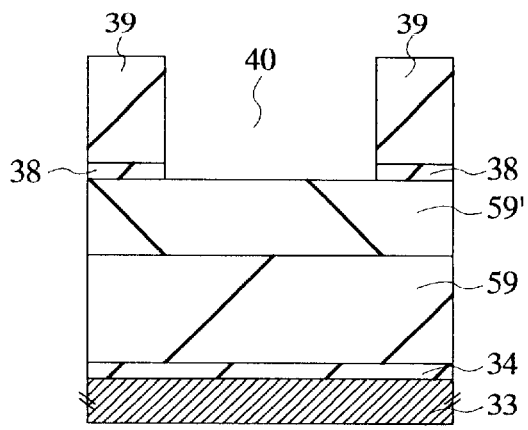
FIG. 41(a) is a schematic cross sectional views of a semiconductor device showing steps of still another embodiment (Embodiment 10) of manufacturing method according to the invention.

Referring firstly to FIG. 41(a), insulating films 34, 50 and 59' are formed sequentially on the lower wiring layer 33. The insulating films 34 and 38 are typically made of silicon nitride, whereas the insulating films 59 and 59' are typically made of silicon oxide. Then, contact holes are formed in the insulating film 59 and interlayer connecting wires are formed in the respective contact holes. In other words, the insulating film 59 operates as interlayer insulating film. wiring grooves are formed in the insulating film 59' and wires are formed in the respective wiring grooves. In other words, the insulating film 59 operates as inter-wire insulating film.

The insulating film 59 may be made of TEOS oxide and the insulating film 59' may be made of a material showing an etching selectivity relative to the TEOS oxide film. Materials that can be used for the insulating film 59' typically include SOG (spin on glass). As a result of using a material showing an etching selectivity relative to the insulating film 59 for the insulating film 59', the insulating film 59 can be used as etching stopper when transferring the groove pattern into the insulating film 59'. More specifically, materials that can be used for the insulating film 59' include organic SOG, fluorine-containing SOG and other materials showing a low dielectric constant. As a result of using a low dielectric constant material for the inter-wire insulating film (insulating film 59'), the interwire capacitance of the wires of the layer can be reduced. On the other hand, the inter-wire capacitance between the wiring layers can be reduced by increasing the film thickness of the insulating film 59. Typically, the insulating film 59 may have a film thickness of 450 nm, whereas the insulating film 59' may have a film thickness of 400 nm.

Then, the groove pattern 40 is transferred into the insulating film 38 by using a resist film 39 as in Embodiment 1.

Figure 41B:
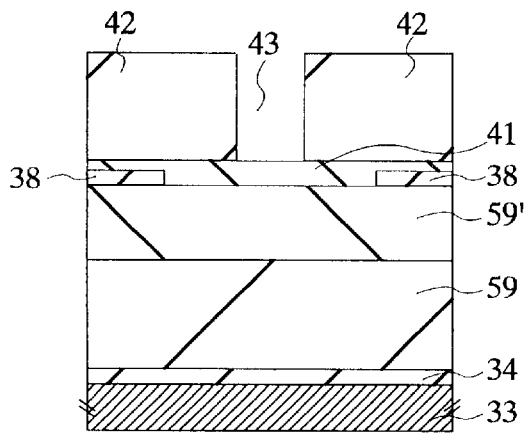
FIG. 41(b) is a schematic cross sectional views of a semiconductor device showing steps of still another subsequent step of Embodiment 10 of manufacturing method according to the invention.

Thereafter, as shown in FIG. 41(b), an anti-reflection film 41 is formed to fill the grooves 40 of the insulating film 38 as in Embodiment 1 and a resist film 42 having openings 43 for forming contact holes is formed as hole pattern also as in the case of Embodiment 1.

Figure 41C:
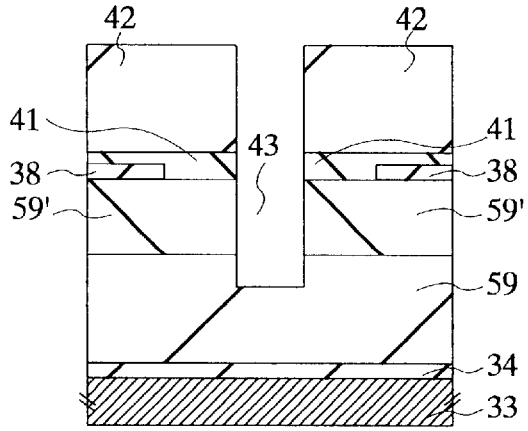
FIG. 41(c) is a schematic cross sectional views of a semiconductor device showing steps of still another subsequent step of Embodiment 10 of manufacturing method according to the invention.

Then, as shown in FIG. 41(c), the hole pattern 43 is transferred into the insulating films 59, 59' by using the resist film 42 as mask. The transfer operation includes the first etching step using a mixture gas of $CH_3$ and $C_4F_8$ and the second etching step using $C_4F_8$ gas. The first etching step is conducted under conditions where SOG is easily etched but TEOS oxide film is hardly etched so that the etching is stopped on the upper surface of the insulating film 59 (TEOS oxide film). In other words, the insulating film 59 is used as etching stopper in the first etching step. As a result, the etching depth can be uniformed to an enhanced degree. On the other hand, the second etching step is conducted under conditions good for etching TEOS oxide film so that the hole pattern 43 can be transferred also into the insulating film 59. The etching depth of the second etching step is about 50 nm.

Figure 41D:
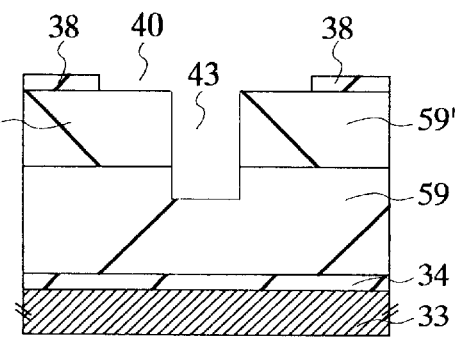
FIG. 41(d) is a schematic cross sectional views of a semiconductor device showing steps of still another subsequent step of Embodiment 10 of manufacturing method according to the invention.

Then, as shown in FIG. 41(d), the resist film 42 and the anti-reflection film 41 are removed by using a technique similar to the one used in Embodiment 1.

Figure 41E:
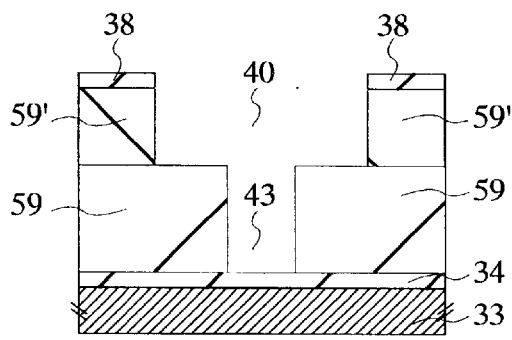
FIG. 41(e) is a schematic cross sectional views of a semiconductor device showing steps of still another subsequent step of Embodiment 10 of manufacturing method according to the invention.

Thereafter, as shown in FIG. 41(e), the groove pattern 40 carried by the insulating film 38 is transferred into the insulating film 59' by using the insulating film 38 carrying the groove pattern 40 as mask under conditions good for etching both SOG and TEOS oxide film (both the insulating films 59 and 59') (by using a mixture gas containing $C_4F_8$). As a result, the groove pattern 40 is transferred into the insulating film 59' and, at the same time, the hole pattern 40 is transferred further deep into the insulating film 59. The depth of the wiring grooves 40 can be controlled by controlling the duration of the etching operation. It will be appreciated that no problem arises if the bottoms of the contact holes 43 are excessively etched because the insulating film 34 that is a silicon nitride film is formed thereunder. On the other hand, it is necessary that the bottoms of the contact holes 43 get to the upper surface of the insulating film 34 by the time when the bottoms of the wiring grooves 40 get to the upper surface of the insulating film 59. Therefore, the difference between the rate of etching the insulating film 59' (SOG) and that of etching the insulating film 59 (TEOS oxide film) in the step of FIG. 41(e) is reflected to the depth of the contact holes 43 in the step of FIG. 41(c). Thus, the depth of the contact holes 43 can be regulated in the second etching step.

Figure 41F:
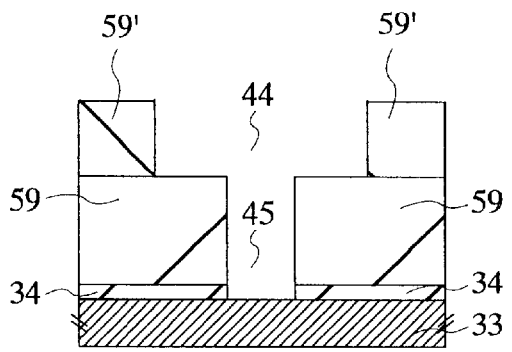
FIG. 41(f) is a schematic cross sectional views of a semiconductor device showing steps of still another subsequent step of Embodiment 10 of manufacturing method according to the invention.
Figure 42A:
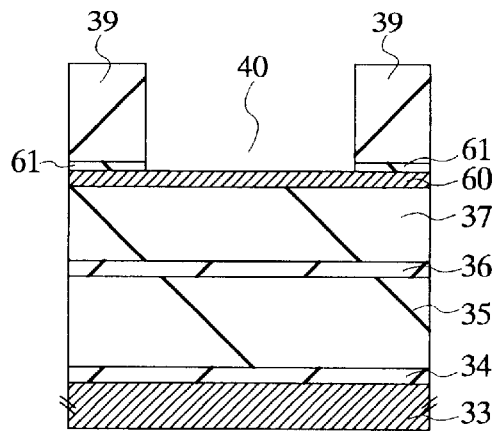
FIG. 42(a) is a schematic cross sectional views of a semiconductor device showing steps of still another embodiment (Embodiment 11) of manufacturing method according to the invention.
Figure 42B:
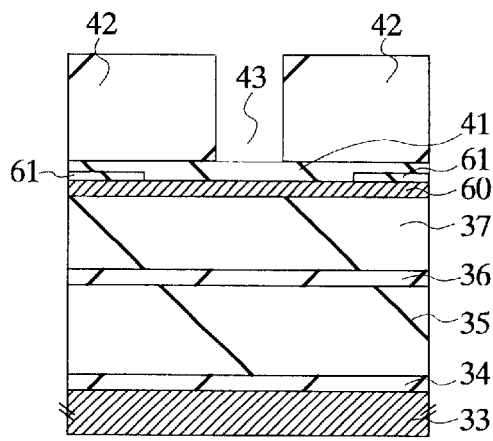
FIG. 42(b) is a schematic cross sectional views of a semiconductor device showing steps of still another subsequent step of Embodiment 11 of manufacturing method according to the invention.
Figure 42C:
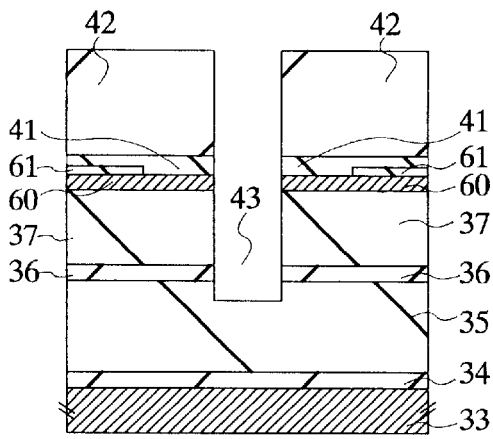
FIG. 42(c) is a schematic cross sectional views of a semiconductor device showing steps of still another subsequent step of Embodiment 11 of manufacturing method according to the invention.
Figure 42D:
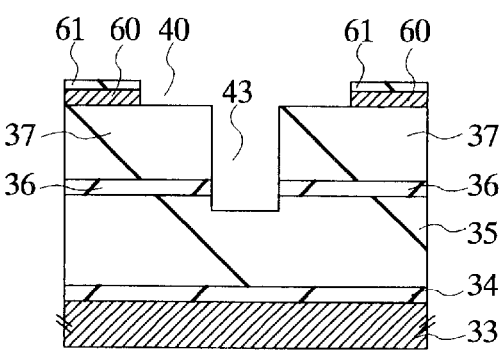
FIG. 42(d) is a schematic cross sectional views of a semiconductor device showing steps of still another subsequent step of Embodiment 11 of manufacturing method according to the invention.
Figure 42E:
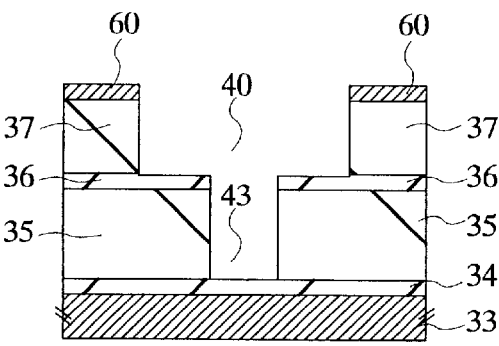
FIG. 42(e) is a schematic cross sectional views of a semiconductor device showing steps of still another subsequent step of Embodiment 11 of manufacturing method according to the invention.
Figure 42F:
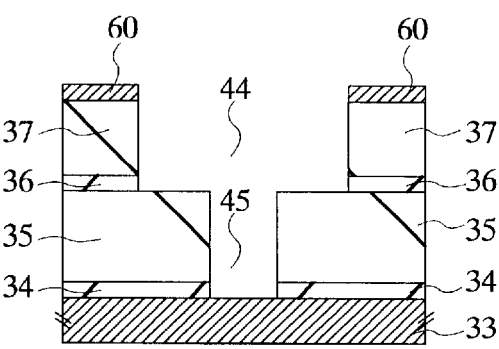
FIG. 42(f) is a schematic cross sectional views of a semiconductor device showing steps of still another subsequent step of Embodiment 11 of manufacturing method according to the invention.

Then, as shown in FIG. 41(f), the insulating film 38 and the insulating film 34 left on the bottoms of the contact holes 43 are removed to complete the operation of forming the wiring grooves 44 and the contact holes 45. This removing operation is an etching operation conducted under conditions good for etching silicon nitride film. All the subsequent steps of this embodiment are same as those of Embodiment 1.

This embodiment provides an advantage that no silicon nitride film showing a high dielectric constant is formed on the bottoms of the wiring grooves because the insulating film 36 that is a silicon nitride film operating as intermediary stopper is not used in this embodiment. As a result, the inter-wire capacitance is reduced to improve the performance of the semiconductor device. Additionally, the depth of the contact holes 43 and that of the wiring grooves 40 can be controlled in a well-controlled fashion by utilizing the difference in the rate of etching the insulating film 59 and that of etching the insulating film 59'. Still additionally, the inter-wire capacitance of the semiconductor device can be reduced to improve the performance of the device by using a low dielectric constant material (organic SOG, fluorine-containing SOG) for the inter-wire insulating film (insulating film 59').

It may be needless to say that the insulating film 59 may be made of a low dielectric constant material such as organic SOG or fluorine-containing SOG if the insulating film 59' is made of TEOS oxide film.

(Embodiment 11)

FIGS. 42(*a*) through 42(*f*) are schematic cross sectional views of a semiconductor device showing steps of still another embodiment (Embodiment 10) of manufacturing method according to the invention. Note that only part of the semiconductor device corresponding to the fifth wiring layer of Embodiment 1 is shown in FIGS. 42(*a*) through 42(*f*). More specifically, only some of the wires and the underlying interlayer connecting wires of the semiconductor device are shown in a simplified fashion.

Firstly, as shown in FIG. 42(*a*), insulating films 34 through 37, a hard mask layer 60 and a transfer mask layer 61 are sequentially formed on the lower wiring layer 33. The insulating films 34 through 37 are same as those of Embodiment 1. The hard mask layer 60 is a metal layer typically made of tungsten. The transfer mask layer 61 may be made of TEOS oxide film. The hard mask layer 60 and the transfer mask layer 61 may have respective film thickness of 200 nm and 100 nm. The hard mask layer 60 may be formed by sputtering or CVD.

The transfer mask layer 61 and the hard mask layer 60 operate as transfer mask when transferring the groove pattern 40 just like the insulating film 38 of Embodiment 1. From the viewpoint of preventing the drooping of the pattern along the edges thereof, the transfer mask preferably has a large film thickness. However, if the transfer mask is too thick, the wiring grooves may not be satisfactorily filled with the anti-reflection film to consequently produce steps when forming a resist film carrying openings for the contact holes. Such steps obviously reduce the accuracy of forming contact holes. However, the combined use of a transfer mask layer 61 and a hard mask layer 60 of this embodiment can effectively prevent the possible dropping of the pattern along the edges thereof and, at the same time, reduce the steps of the transfer mask.

Then, as in Embodiment 1, a resist film 39 carrying a groove pattern 40 is formed and the groove pattern 40 of the resist film 39 is transferred into the transfer mask layer 61.

Then, as shown in FIG. 42(*b*), an anti-reflection film 41 is formed to fill the grooves 40 of the transfer mask layer 61 as in Embodiment 1 and subsequently a resist film 42 having a hole pattern 43 is formed also as in Embodiment 1. In this stage of operation, the steps of the transfer mask layer 61 is 100 nm high at most so that they can be filled satisfactorily by the anti-reflection film 41.

Thereafter, as shown in FIG. 42(*c*), the hole pattern 43 is transferred into the hard mask layer 60, the insulating films 37, 37 and part of the insulating film 35 by using the resist film 42 as mask. The depth of the contact holes 43 is controlled by controlling the duration of the etching operation.

Then, as shown in FIG. 42(*d*), the resist film 42 and the anti-reflection film 41 are removed as in Embodiment 1. Then, the groove pattern 40 is transferred into the hard mask layer 60 by using the transfer mask layer 61 is mask under conditions good for selectively etching tungsten.

Subsequently, as shown in FIG. 42(*e*), the groove pattern 40 is transferred into the insulating film 37 by using the transfer mask layer 61 carrying the groove pattern 40 and the hard mask layer 60 as mask. This transfer operation is an etching operation conducted under conditions good for etching silicon oxide film. Although the transfer mask layer 61 is removed by the etching operation, the groove pattern 40 is accurately transferred because of the presence of the hard mask layer 60. The etching conditions of this operation are same as those of Embodiment 1. The depth of the wiring grooves 40 can be controlled by using the insulating film 36 as etching stopper. Since the contact holes 43 are made to run through the insulating 36 and formed partly in the insulating film prior to the etching operation, the bottoms of the contact holes 43 get to the insulating film 34 as described above by referring to Embodiment 1.

Then, as shown in FIG. 42(*f*), the insulating film 38 left on the bottoms of the wiring grooves 40 and the insulating film 34 left on the bottoms of the contact holes 43 are removed to complete the operation of forming the wiring grooves 44 and the contact holes 45. This removing operation is an etching operation conducted under conditions good for etching silicon nitride film. All the subsequent steps of this embodiment are same as those of Embodiment 1.

Note that, in this embodiment, the hard mask layer 60 is not removed in this stage of operation and left on the insulating film 37. Since the hard mask layer 60 is made of metal film, it can reduce the resistance of the surface of the substrate in the step of forming the plating layer for wires so as to facilitate the operation of forming the plating layer. It may be needless to say that the hard mask layer 60 is removed during the CMP process for forming the wires.

This embodiment provides an advantage of improving the accuracy of forming wiring grooves because they are formed by using a hard mask layer 60. On the other hand, the resist film 42 carrying the hole pattern 43 can be formed highly accurately because the transfer of the groove pattern 40 into the hard mask layer 60 is realized by using a transfer mask layer 61.

It will be appreciated that the hard mask layer 60 may be formed after forming the transfer mask layer 61. In other words, it is important to combine the hard mask layer 60 and the transfer mask layer 61 in order to make them operate as mask when transferring the groove pattern 40 into the insulating film 37 and the sequent of forming them is not important.

(Embodiment 12)

FIGS. 43(*a*) through 43(*f*) are schematic cross sectional views of a semiconductor device showing steps of still another embodiment (Embodiment 10) of manufacturing method according to the invention. Note that only part of the semiconductor device corresponding to the fifth wiring layer of Embodiment 1 is shown in FIGS. 43(*a*) through 43(*f*). More specifically, only some of the wires and the underlying interlayer connecting wires of the semiconductor device are shown in a simplified fashion.

Firstly, as shown in FIG. 43(*a*), insulating films 34 and 35 are sequentially formed on the lower wiring layer 33. The insulating films 34 and 35 are same as those of Embodiment 6. Then, a resist film 62 is formed on the insulating film 35 and a groove pattern 40 is formed in the resist pattern 62. Thus, no film corresponding to the insulating film 38 of the preceding embodiments is formed in this embodiment and the resist film is directly utilized for the groove pattern. The resist film 62 may typically be made of photosensitive polyimide. As a result of using photosensitive polyamide for the resist film 62, it can be made to show an etching selectivity relative to the resist film formed for the hole pattern, which will be described below in terms of the next manufacturing step.

Then, as shown in FIG. 43(*b*), a resist film 63 carrying a hole pattern 43 is formed on the resist film 62. The resist film 63 is an ordinary resist film (e.g., Novolac type photoresist film).

Figure 43A:
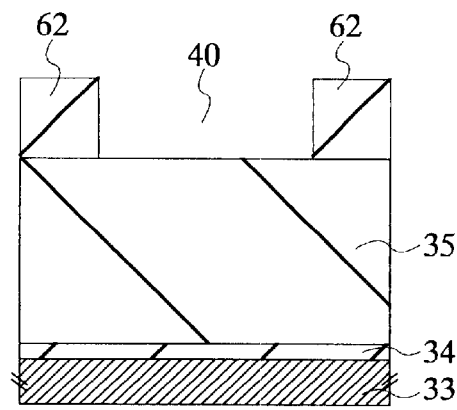
FIG. 43(a) is a schematic cross sectional views of a semiconductor device showing steps of still another embodiment (Embodiment 12) of manufacturing method according to the invention.
Figure 43D:
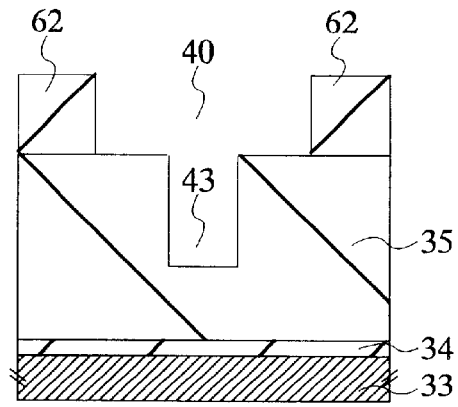
FIG. 43(d) is a schematic cross sectional views of a semiconductor device showing steps of still another subsequent step of Embodiment 12 of manufacturing method according to the invention.
Figure 43B:
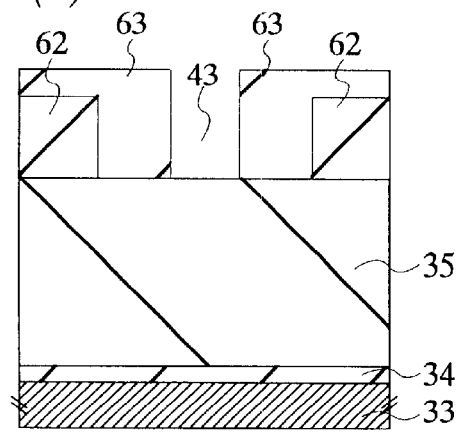
FIG. 43(b) is a schematic cross sectional views of a semiconductor device showing steps of still another subsequent step of Embodiment 12 of manufacturing method according to the invention.
Figure 43E:
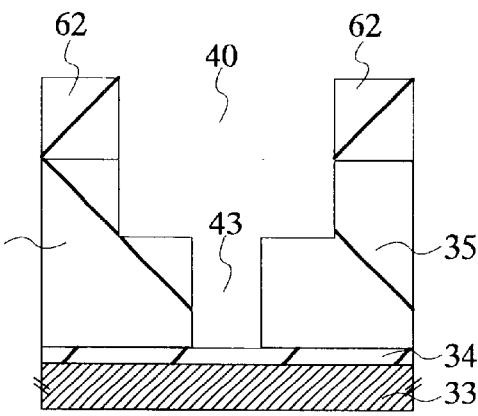
FIG. 43(e) is a schematic cross sectional views of a semiconductor device showing steps of still another subsequent step of Embodiment 12 of manufacturing method according to the invention.
Figure 43C:
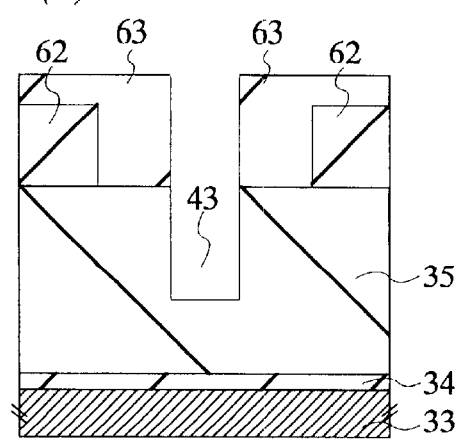
FIG. 43(c) is a schematic cross sectional views of a semiconductor device showing steps of still another subsequent step of Embodiment 12 of manufacturing method according to the invention.

Then, as shown in FIG. 43(c), the hole pattern 43 is transferred into the insulating film 35 by using the resist film 63 as mask. The holes formed in the insulating film 35 are made to show a depth of 500 nm. The depth of the holes 43 can be controlled by controlling the duration of the etching operation.

Thereafter, as shown in FIG. 43(d), the resist film 63 is removed typically by means of an oxygen plasma ashing technique. Since polyimide type resist film has an anti-ashing effect, the resist film 62 is left unremoved so that it is possible to remove only the resist film 63.

Then, as shown in FIG. 43(e), the groove pattern 40 is transferred into the insulating film 35 by using the resist film 62 carrying the groove pattern 40 as mask under conditions good for etching silicon oxide film. The etching conditions are same as those of Embodiment 1. The grooves formed in the insulating film 35 are made to show a depth of 400 nm. The depth of the grooves 40 can be controlled by controlling the duration of the etching operation.

Since the hole pattern 43 has already been transferred into the insulating film 35 at the time of forming the grooves by etching, the holes 43 in the insulating film 35 are also etched at the bottoms thereof so that, when the grooves 40 are formed as deep as 400 nm, the bottoms of the holes 43 get to the insulating film 34 as described above by referring to Embodiment 6.

Figure 43F:
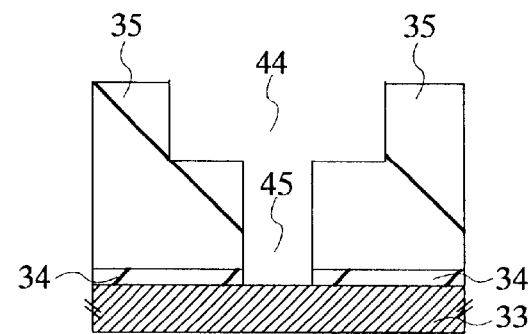
FIG. 43(f) is a schematic cross sectional views of a semiconductor device showing steps of still another subsequent step of Embodiment 12 of manufacturing method according to the invention.

Subsequently, as shown in FIG. 43(f), the resist film 62 is removed typically by means of a wet etching technique using butyl acetate as solvent. Then, the insulating film 34 is removed from the bottoms of the holes 43. The operation of forming the wiring grooves 44 and the contact holes 45 is completed at this stage. The insulating films 34 is removed from the bottoms of the holes 43 under conditions good for etching silicon nitride film. All the subsequent steps of this embodiment are same as those of Embodiment 1.

(Embodiment 13)

Figure 44A:
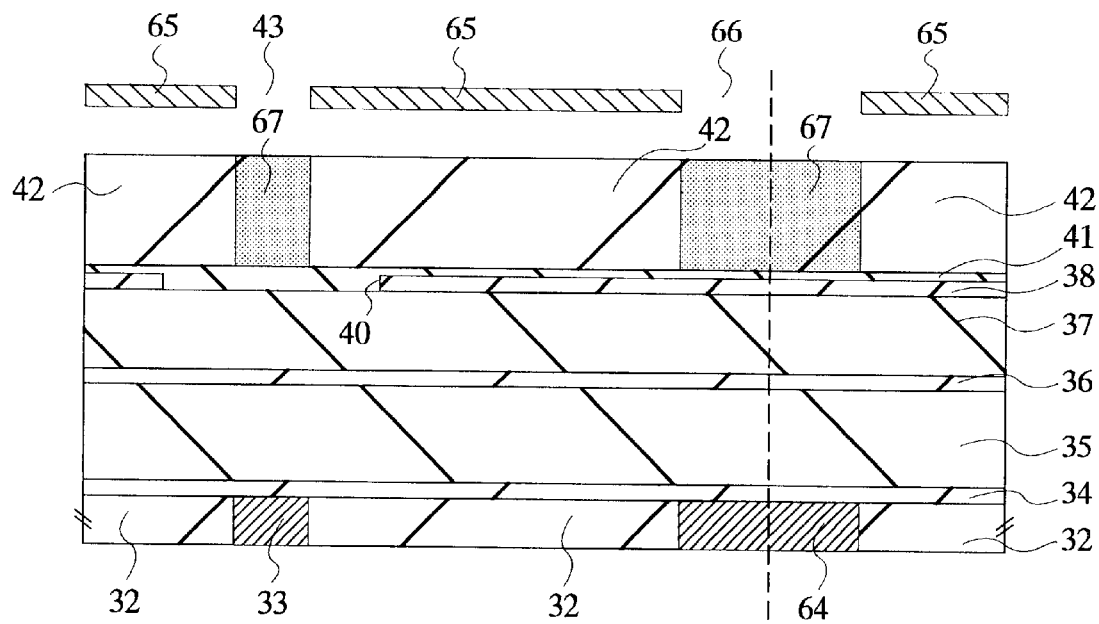
FIG. 44(a) is a schematic cross sectional views of a semiconductor device showing steps of still another embodiment (Embodiment 13) of manufacturing method according to the invention.

FIG. 44(a) is are schematic cross sectional views of a semiconductor device showing steps of exposing the resist film 42 for forming a hole pattern 43 to light in Embodiment 1 in the process of manufacturing the semiconductor device.

After forming the resist film 42 by applying resist as shown in FIG. 11 illustrating Embodiment 1, the hole pattern 43 is formed there by means of photolithography as shown in FIG. 12. FIG. 44(a) illustrates this step in greater detail.

Referring now to FIG. 44(a), markers 62 are formed in the fourth wiring layer along with the wires 33. A mask 65 carrying the hole pattern is formed on the resist film 42. Note that the mask 65 also carries markers 66 along with the hole pattern 43.

Then, the resist film 42 is exposed to light, by using the mask. The mask 65 is aligned by referring to the markers 64 of the fourth wiring layer (of the lower wires). More specifically, the markers 64 of the fourth wiring layer and the corresponding markers 66 of the mask 65 are aligned and light is irradiated from above the mask 65 to expose the resist film 42 to light. The areas 67 exposed to light are removed in a subsequent chemical processing step to produce holes 43 as shown in FIG. 12.

With this technique, the hole pattern 43 can be aligned in simple and accurate manner. More specifically, as described above by referring to Embodiment 1, the groove pattern 40 is formed in the insulating film 38. However, it is difficult to align the mask if the hole pattern 43 is formed by referring to the groove pattern 40. In other words, since the insulating film 38 has a thickness as small as 100 nm and hence is very thin and generally transparent to visible light, any markers formed in the insulating film 38 can hardly be detected. If detected, it is highly difficult to read the markers of the insulating film 38 so that the mask 65 and the markers can hardly be aligned. On the other hand, the markers 64 of the wires are made of metal and can be read with ease by means of a mask aligner so that the mask and the markers can be aligned accurately. Additionally, the mutual displacement of the lower wires and the contact holes 45 can be minimized to realize a reliable contact between the upper and lower wires when the hole pattern 43 is formed by referring to the markers 64 of the lower wires. Meanwhile, although the groove pattern 40 is formed by referring to the markers 64 of the lower wires, no specific problems arise if the mask is displaced relative to the hole pattern 43 as discussed earlier. Thus, in the embodiment, the hole pattern 43 can be aligned easily and accurately in a manner as described above.

Figure 44B:
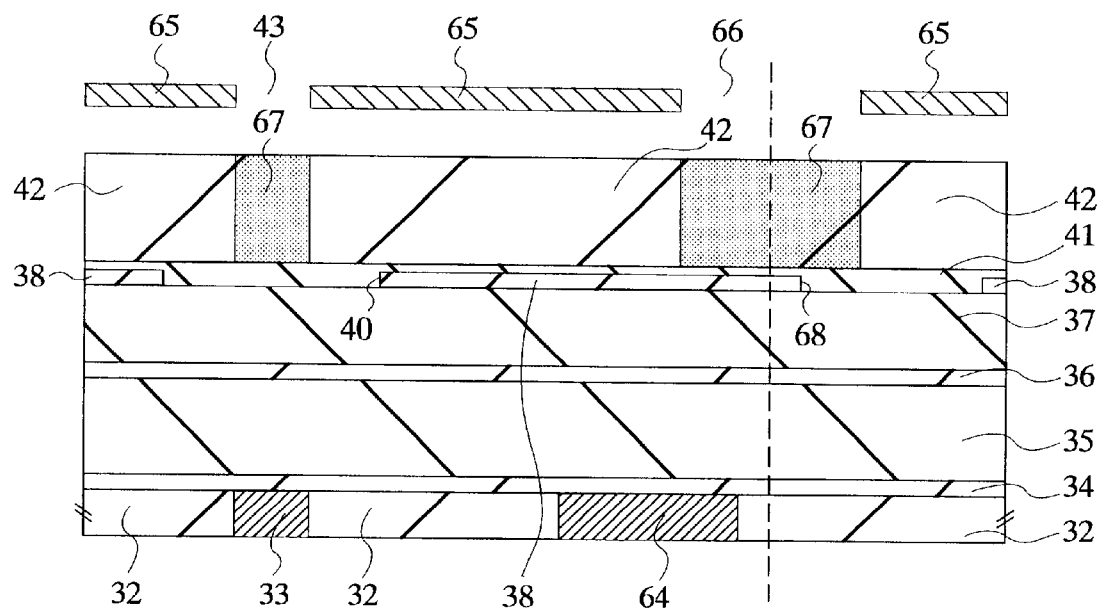
FIG. 44(b) is a schematic cross sectional views of a semiconductor device showing steps of still another embodiment of Embodiment 13 of manufacturing method according to the invention.

Alternatively, as shown in FIG. 44(b), markers 68 may also be formed in the insulating film 38 so that each of the markers 68 and the corresponding one of the markers 64 may be aligned with the corresponding one of the markers 66 of the mask 65 arranged at the middle thereof as viewed from above. This alignment operation is also easy and can minimize the error in reading the markers 68 of the insulating film 38.

(Embodiment 14)

Figure 45A:
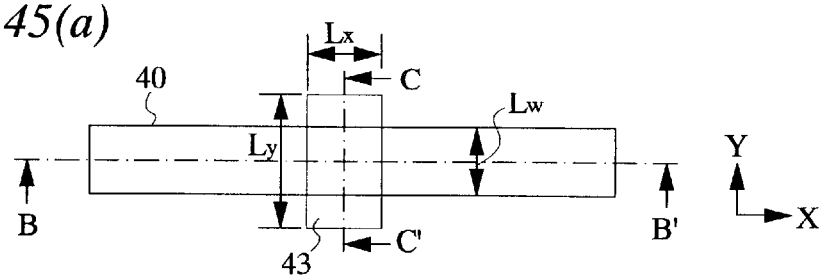
FIG. 45(a) is a schematic plane view of a semiconductor device showing a step of still another embodiment (Embodiment 14) of manufacturing method according to the invention, FIG. 45(b1) is a schematic cross sectional views of the semiconductor device of FIG. 45(a) showing subsequent steps of Embodiment 14 of manufacturing method, FIG. 45(b2) is a schematic cross sectional views of the semiconductor device of FIG. 45(a) showing subsequent steps of Embodiment 14 of manufacturing method, FIG. 45(b3) is a schematic cross sectional views of the semiconductor device of FIG. 45(a) showing subsequent steps of Embodiment 14 of manufacturing method, FIG. 45(c1) is a schematic cross sectional views of the semiconductor device of FIG. 45(a) showing subsequent steps of Embodiment 14 of manufacturing method, FIG. 45(c2) is a schematic cross sectional views of the semiconductor device of FIG. 45(a) owing subsequent steps of Embodiment 14 of manufacturing method, and FIG. 45(c3) is a schematic cross sectional views of the semiconductor device of FIG. 45(a) showing subsequent steps of Embodiment 14 of manufacturing method.
Figure 45:
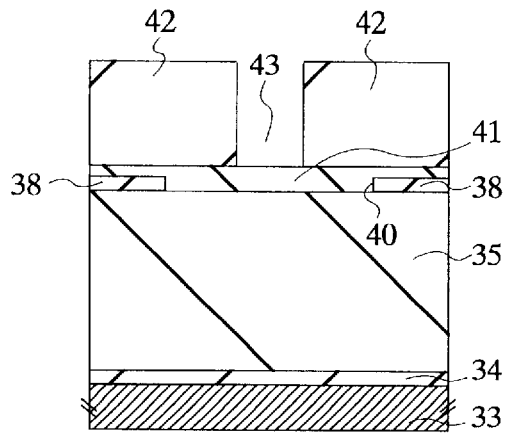
Figure 45:
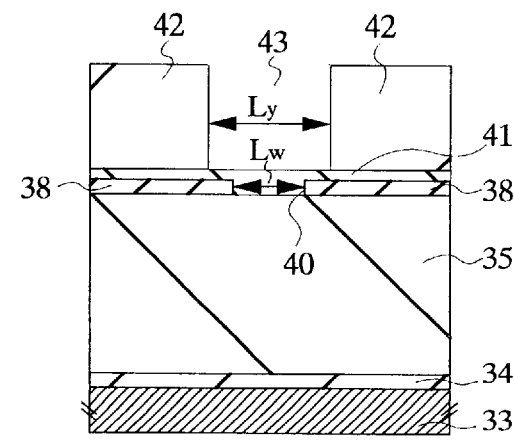
Figure 45:
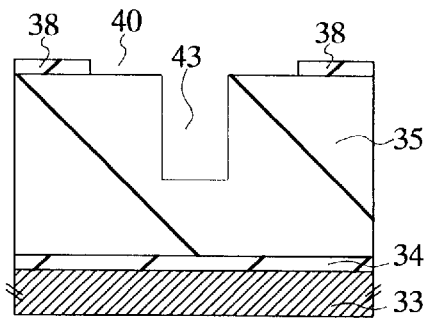
Figure 45:
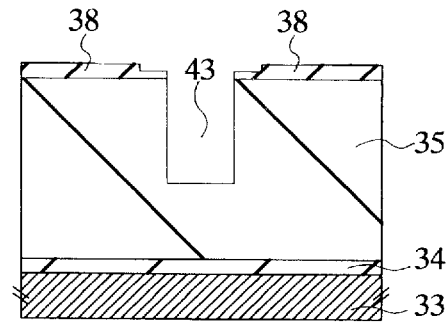
Figure 45:
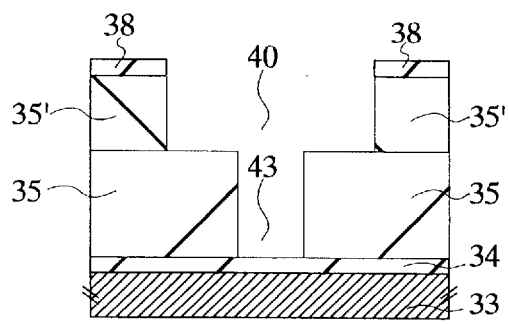
Figure 45:
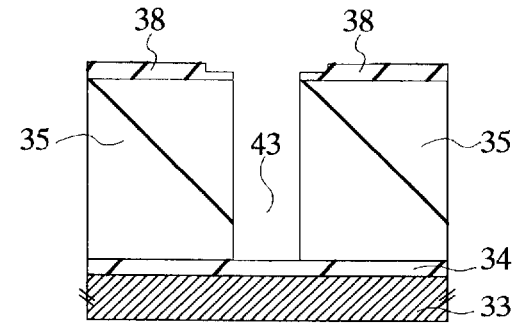

FIG. 45(a) is a schematic plan view of a semiconductor device formed by Embodiment 14 of the invention and FIGS. 45(b1), 45(c1) through 45(b3), 45(c3) are schematic cross sectional views of the semiconductor device of FIG. 45(a). This embodiment will be described in terms of the hole pattern 43 that is similar to that of Embodiment 2 but the diameter of the holes of the hole pattern 43 is made greater than the width of the grooves of the groove pattern 40 as observed in a direction (y-direction) perpendicular to the direction of the wiring grooves (x-direction). As seen from the plan view of FIG. 45(a), the illustrated hole of the hole pattern 43 has a diameter Ly in the y-direction greater than the width Lw of the wiring grooves (formed by the groove pattern 40). The diameter Ly of the hole in the y-direction may be made equal to the width of the grooves plus alignment tolerance. Then, with the manufacturing method of Embodiment 2, the edges of the holes of the hole pattern 43 formed in the y-direction by etching are defined by the groove p-type 40. In other words, they are formed in a self-aligning manner relative to the groove pattern 40 so that the diameter of the holes of hole pattern 43 in the y-direction would never become smaller that the width Lw of the openings of the groove pattern 40. On the other hand, the diameter of the holes of the hole pattern 43 in the x-direction is defined by the groove pattern 40 so that it would never become greater than the width Lateral wall of the openings of the groove pattern 40. As a result, the area of the cross section (Lw×Lx) of the interlayer connecting wires 50 can be secured, while their resistance can be reduced and the intervals of the wires can be minimized to improve the performance, the degree of integration and the reliability of the semiconductor device.

Now, this embodiment will be described by referring to the cross sectional views of FIGS. 45(b1), 45(c1) through 45(b3), 45(c3). Note that FIGS. 45(b1) through 45(b3) are cross sectional views taken along line B–B' in FIG. 45(a), whereas FIGS. 45(c1) through 45(c3) are cross sectional views taken along line C–C' in FIG. 45(a).

Firstly, as shown in FIGS. 45(b1), 45(c1), insulating films 34, 35 and 38 are sequentially formed on the lower wires 33 as in Embodiment 6 and the groove pattern 40 is transferred into the insulating film 38 as in Embodiment 1. Thereafter, an anti-reflection film 41 is formed to fill the grooves formed in the insulating film 38 by using the groove pattern 40 as in Embodiment 1 and then a resist film 42 carrying the hole pattern 43 is formed also as in Embodiment 1. Note that, the holes 43 have a diameter greater than the width of the grooves formed by the groove pattern 0 in the direction along line C–C' (y-direction) as seen from FIG. 45(c1).

Then, as shown in FIGS. 45(b2), 45(c2), the hole pattern 43 is transferred into the insulating film 35 by using the resist film 42 as mask. The transfer is realized by means of an etching operation conducted under conditions where silicon oxide film is etched but silicon nitride film is hardly etched as described above by referring to Embodiment 2. Thus, as shown in FIG. 45(c2), the holes are formed in a self-aligning fashion relative to the grooves in the y-direction and the insulating film 38 is only partly etched below the holes of the resist film 42 and the insulating film 35 located under the insulating film 38 is left unetched.

The holes 43 are formed as deep as 500 nm in the insulating film 35. The depth of the holes can be controlled by controlling the duration of the etching operation.

Then, the resist film 42 and the anti-reflection film 41 are removed by means of a method same as the one described above by referring to Embodiment 1.

Then, as shown in FIGS. 45(b3), 45(c3), the insulating film 35 is etched by using the insulating film 38 (the groove pattern 40) as mask. As a result, the groove pattern 40 is transferred into the insulating film 35. The transfer is realized under conditions good for etching silicon oxide film as in Embodiment 1. Thus, the diameter Lw of the contact holes 45 can be made substantially equal to the width Lw of the wires 44. The grooves 40 are made as deep as 400 nm. The dept of the grooves can be controlled by controlling the duration of the etching operation. Since the hole pattern 43 has already been transferred into the insulating film 35 at the time of forming the grooves by etching, the holes 43 in the insulating film 35 are also etched at the bottoms thereof so that, when the grooves 40 are formed as deep as 400 nm, the bottoms of the holes 43 get to the insulating film 34 as described above by referring to Embodiment 1. All the subsequent steps of this embodiment are same as those of Embodiment 1. As a result, the wires 44 and the contact holes 45 are formed and then the wires 49 (the interlayer connecting wires 50) are formed as in Embodiment.

With this embodiment of manufacturing method according to the invention, the holes are formed in a self-aligning manner relative to the insulating film 38 (the groove pattern 40) so that any relative misalignment of the mask of the hole pattern 43 and that of the groove pattern 40 can be harmless in the y-direction. Additionally, the displacement, if any, in the y-direction does not make the contact holes defective and they are made to show the designed diameter Lw (cross sectional area). In other words, the diameter of the contact holes 45 is made substantially equal to the width Lw of the wires 44. As a result, the resistance of the wires 49 can be reduced to improve the reliability of the interlayer connecting wires and hence the performance and the reliability of the semiconductor device. Additionally, if the diameter Ly of the contact holes 43 formed in the insulating film 35 in the y-direction is made greater than the width Lw of the wiring grooves, it does not exceed the value defined by the width Lw. Therefore, the intervals separating the wires can be minimized to raise the wire density and improve the degree of integration of the semiconductor device.

Figure 46A:
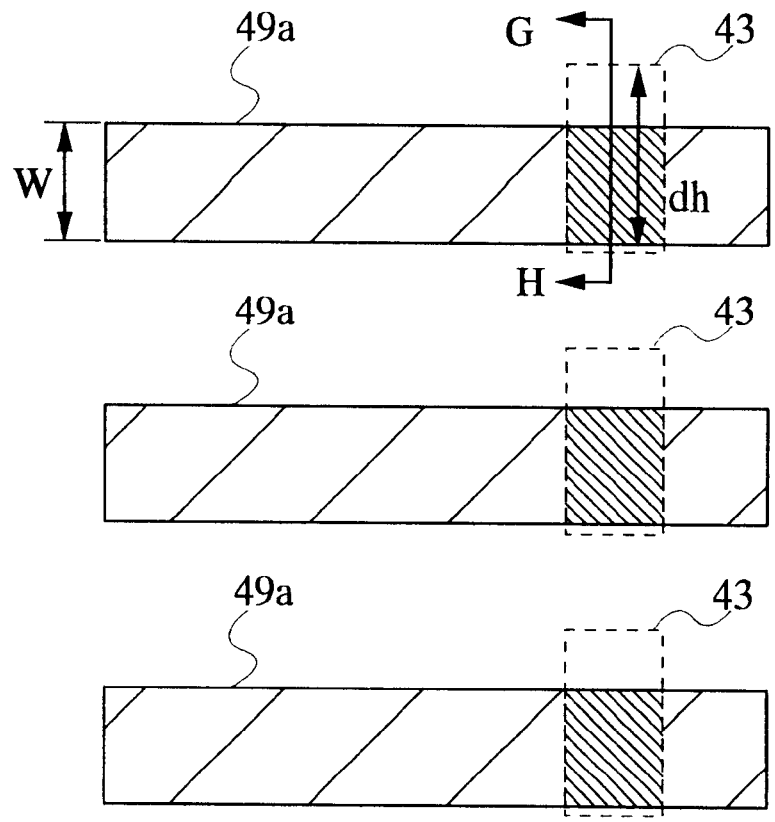
FIG. 46(a) is a schematic plan view of the wire pattern of the semiconductor device of FIG. 45(a)
Figure 46B:
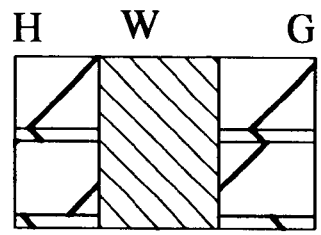
FIG. 46(b) is a schematic cross sectional view of the wire pattern of the semiconductor device of FIG. 45(a).

FIG. 46(a) is a schematic plan view of wires 49a formed by this embodiment. FIG. 46(b) is a cross sectional view of a wire 49 taken along line G–H in FIG. 46(a). As shown, contact holes are formed in areas where the openings of the pattern of the wires and those of the hole pattern 43 overlap each other (hatched area). The produced contact holes shows a diameter same as the width W of the wires 49a so that the resistance of the contact holes can be minimized.

While the invention of the inventors is described above in terms of specific embodiments, the present invention is by no means limited thereto and the embodiments may be modified in various different ways without departing from the scope of the invention.

For instance, any of the above described embodiments may be combined without departing from the scope of the invention. More specifically, the process of rounding the shoulders as described above by referring to Embodiments 4 and 5 may also be applied to the remaining embodiments except Embodiment 11.

While the insulating film 38 is made of silicon nitride film in all the applicable embodiments, it may be made of some other material provided that it shows an etching selectivity relative to the underlying silicon oxide film. Materials that can be used for the insulating film 38 include tungsten, titanium nitride (TiN), aluminum (Al), tantalum (Ta) and molybdenum (Mo) as well as nitrides thereof.

Some of the advantages of the present invention will be listed below.

Firstly, fine dual damascene grooves can be formed without leaving any foreign object in the contact holes to consequently improve the reliability of the connection of wires and hence the performance of the semiconductor device.

Secondly, Sufficient space can be provided when forming contact holes so that the resistance of connecting the wiring layers can be significantly reduced to consequently improve the performance of the semiconductor device.

Thirdly, the inter-wire capacitance can be reduced to improve the performance of the semiconductor device.

What is claimed is:

1. A method of manufacturing a semiconductor device comprising steps of:

(a) forming a first insulating layer on a substrate;

(b) forming a wiring groove pattern layer on said first insulating layer;

(c) forming a hole pattern layer on said wiring groove pattern layer and said first insulating layer;

(d) etching said wiring groove pattern layer and said first insulating layer using said hole pattern layer as a mask to form a hole pattern having a depth into the first insulating layer;

(e) after step (d), removing said hole pattern layer; and (f) after step (e), etching said first insulating layer using said wiring groove pattern layer as a mask to form a wiring groove pattern into said first insulating layer.

2. A method of manufacturing a semiconductor device comprising steps of:

(a) forming a first insulating layer on a substrate;

(b) forming a wiring groove pattern layer on said first insulating layer;

(c) after step (b), forming a hole pattern layer on said first insulating layer;

(d) etching said first insulating layer using said hole pattern layer as a mask to form a hole pattern having a depth into said first insulating layer;

(e) after step (d), removing said hole pattern layer; and (f) after step (e), etching said first insulating layer using said wiring groove pattern layer as a mask to form a wiring groove pattern into said first insulating layer, wherein the etching step (d) is performed such that said wiring groove pattern layer exposed through said hole pattern layer is etched to transfer said hole pattern layer into said wiring groove pattern layer.

3. A method of manufacturing a semiconductor device comprising steps of:

(a) forming a first insulating layer on a substrate;

(b) forming a wiring groove pattern layer on said first insulating layer;

(c) forming a hole pattern layer on said wiring groove pattern layer;

(d) removing said first insulating layer using said hole pattern layer as a mask such that said wiring groove pattern layer exposed through said hole pattern layer is removed to transfer said hole pattern layer into said wiring groove pattern layer and to form a hole pattern having a depth into said first insulating layer;

(e) after step (d), removing said hole pattern layer; and (f) after step (e), etching said first insulating layer using said wiring groove pattern layer as a mask to form in said first insulating layer a wiring groove pattern having a groove width substantially the same as a hole diameter of said hole pattern.

4. A method of manufacturing a semiconductor device according to claim 2, wherein, in said step (d), said wiring groove pattern layer is partly etched to transfer said hole pattern layer into said first insulating layer.

5. A method of manufacturing a semiconductor device according to claim 2, wherein, in said step (d), said hole pattern is formed to go through said first insulating layer, and wherein a wiring groove is formed in step (f).

6. A method of manufacturing a semiconductor device according to claim 2, wherein, in step (d), said hole pattern is formed halfway through said first insulating layer, and wherein a wiring groove and contact holes are formed in step (f).

7. A method of manufacturing a semiconductor device according to claim 2, further comprising steps of:

before step (a), forming a second insulating layer; and wherein said step (f) includes a first sub-step of etching said first insulating layer at a rate lower than a rate of etching the second insulating layer and a second sub-step of etching said second insulating layer.

8. A method of manufacturing a semiconductor device comprising steps of:

(a) forming a first insulating layer;

(b) forming a wiring groove pattern layer on said first insulating layer;

(c) after step (b), forming a hole pattern layer on said first insulating layer such that a hole diameter of said hole pattern layer is greater than a groove width of said wiring groove pattern layer;

(d) etching said first insulating layer, wherein a rate of etching said wiring groove pattern layer is lower than a rate of etching said first insulating layer, using said hole pattern layer as a mask to form a hole pattern having a depth into said first insulating layer;

(e) after step (d), removing said hole pattern layer; and (f) after step (e), etching said first insulating layer using said wiring groove pattern layer as a mask to form a wiring groove pattern into said first insulating layer.

9. A method of manufacturing a semiconductor device according to claim 8, wherein said hole diameter of said hole pattern layer is layer is equal to or less than a width of a groove of the wiring groove pattern layer plus alignment tolerance.

10. A method of manufacturing a semiconductor device according to claim 2, further comprising steps of:

(g) after step (f), forming a barrier metal layer and a copper layer on an entire surface of said substrate; and (h) polishing said barrier metal layer and said copper layer to bury said barrier metal layer and said copper layer in a hole pattern and a wiring groove.

11. A method of manufacturing a semiconductor device according to claim 2, wherein said wiring groove pattern layer is comprised of a conductive material.

12. A method of manufacturing a semiconductor device according to claim 1, wherein said wiring groove pattern has a groove width substantially the same as a hole diameter of said hole pattern.

13. A method of manufacturing a semiconductor device according to claim 1, wherein, in said step (d), said wiring groove pattern layer is partly etched to transfer said hole pattern layer into said first insulating layer.

14. A method of manufacturing a semiconductor device according to claim 1, wherein, in said step (d), said hole pattern is formed to go through said first insulating layer, and wherein a wiring groove is formed in step (f).

15. A method of manufacturing a semiconductor device according to claim 1, wherein, in step (d), said hole pattern is formed halfway through said first insulating layer, and wherein a wiring groove and contact holes are formed in step (f).

16. A method of manufacturing a semiconductor device according to claim 1, further comprising steps of:

(g) after step (f), forming a barrier metal layer and a copper layer on an entire surface of said substrate; and (h) polishing said barrier metal layer and said copper layer to bury said barrier metal layer and said copper layer in a hole pattern and a wiring groove.

17. A method of manufacturing a semiconductor device according to claim 3, wherein, in said step (d), said wiring groove pattern layer is partly etched to transfer said hole pattern layer into said first insulating layer.

18. A method of manufacturing a semiconductor device according to claim 3, wherein, in said step (d), said hole pattern is formed to go through said first insulating layer, and wherein a wiring groove is formed in step (f).

19. A method of manufacturing a semiconductor device according to claim 3, wherein, in step (d), said hole pattern is formed halfway through said first insulating layer, and wherein a wiring groove and contact holes are formed in step (f).

20. A method of manufacturing a semiconductor device according to claim 3, further comprising steps of:

(g) after step (f), forming a barrier metal layer and a copper layer on an entire surface of said substrate; and (h) polishing said barrier metal layer and said copper layer to bury said barrier metal layer and said copper layer in a hole pattern and a wiring groove.

21. A method of manufacturing a semiconductor device according to claim 8, wherein, in said step (d), said wiring groove pattern layer is partly etched to transfer said hole pattern layer into said first insulating layer.

22. A method of manufacturing a semiconductor device according to claim 8, wherein, in said step (d), said hole pattern is formed to go through said first insulating layer, and wherein a wiring groove is formed in step (f).

23. A method of manufacturing a semiconductor device according to claim 8, wherein, in step (d), said hole pattern is formed halfway through said first insulating layer, and wherein a wiring groove and contact holes are formed in step (f).

24. A method of manufacturing a semiconductor device according to claim 8, further comprising steps of:

(g) after step (f), forming a barrier metal layer and a copper layer on an entire surface of said substrate; and (h) polishing said barrier metal layer and said copper layer to bury said barrier metal layer and said copper layer in a hole pattern and a wiring groove.

25. A method of manufacturing a semiconductor device comprising steps of:

(a) forming a first insulating layer, and forming a second insulating layer over said first insulating layer;

(b) forming a wiring groove pattern layer on said second insulating layer;

(c) after said step (b), forming a hole pattern layer on said second insulating layer;

(d) etching said second insulating layer, in a rate of etching said wiring groove pattern layer lower than a rate of etching said first insulating layer, by using said hole pattern layer as a mask, so as to form a hole pattern in said second insulating layer;

(e) after step (d), removing said hole pattern layer; and (f) after step (e), etching said second insulating layer by using said wiring groove pattern layer as a mask to form a wiring groove pattern in said second insulating layer, and etching said first insulating layer to form a hole pattern in said first insulating layer, wherein in step (d), said first insulating layer serves as a etching stopper layer in etching said second insulating layer.

26. A method of manufacturing a semiconductor device according to claim 25, wherein said first insulating layer is comprised of a low dielectric constant material having a dielectric constant lower than that of a silicon nitride film.

27. A method of manufacturing a semiconductor device according to claim 25, wherein said second insulating layer is comprised of a low dielectric constant material having a dielectric constant lower than that of a silicon nitride film.

28. A method of manufacturing a semiconductor device comprising steps of:

(a) forming a first insulating layer, and forming a second insulating layer over said first insulating layer, wherein said first insulating layer is comprised of a low dielectric constant material having a dielectric constant lower than that of a silicon nitride film; and (b) etching said second insulating layer, using a mask, in a rate of etching said mask lower than a rate of etching said first insulating layer, to form a groove pattern in said second insulating layer, wherein in step (b), said first insulating layer serves as an etching stopper layer in etching said second insulating layer.

29. A method of manufacturing a semiconductor device according to claim 28, wherein said low dielectric constant material is an organic film.

30. A method of manufacturing a semiconductor device according to claim 28, wherein said low dielectric constant material is a fluorine-containing film.

31. A method of manufacturing a semiconductor device comprising steps of:

(a) forming a first insulating layer, and forming a second insulating layer over said first insulating layer, wherein said second insulating layer is comprised of a low dielectric constant material having a dielectric constant lower than that of a silicon nitride film, and wherein said first insulating layer has a dielectric constant lower than that of a silicon nitride film; and (b) etching said second insulating layer, using a mask, in a rate of etching said mask lower than a rate of etching said first insulating layer, to form a groove pattern in said second insulating layer, wherein in step (b), said first insulating layer serves as an etching stopper layer in etching said second insulating layer.

32. A method of manufacturing a semiconductor device according to claim 31, wherein said low dielectric constant material is an organic film.

33. A method of manufacturing a semiconductor device according to claim 31, wherein said low dielectric constant material is a fluorine-containing film.

34. A method of manufacturing a semiconductor device according to claim 1, wherein in said step (e) said hole pattern layer is removed by using an ashing technique.

35. A method of manufacturing a semiconductor device according to claim 2, wherein in said step (e) said hole pattern layer is removed by using an ashing technique.

36. A method of manufacturing a semiconductor device according to claim 3, wherein in said step (e) said hole pattern layer is removed by using an ashing technique.

37. A method of manufacturing a semiconductor device according to claim 8, wherein in said step (e) said hole pattern layer is removed by using an ashing technique.

* * * * *